(12) United States Patent
Kawasaki et al.

(10) Patent No.: US 11,344,976 B2
(45) Date of Patent: May 31, 2022

(54) SOLDER MATERIAL, SOLDER PASTE, AND SOLDER JOINT

(71) Applicant: SENJU METAL INDUSTRY CO., LTD., Tokyo (JP)

(72) Inventors: Hiroyoshi Kawasaki, Tokyo (JP); Hiroki Sudo, Tokyo (JP); Takahiro Roppongi, Tokyo (JP); Hiroshi Okada, Tokyo (JP); Daisuke Soma, Tokyo (JP); Takashi Akagawa, Tokyo (JP); Hiroshi Takahashi, Tokyo (JP); Hiroshi Kawanago, Tokyo (JP); Satoshi Yokota, Tokyo (JP); Osamu Munekata, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 39 days.

(21) Appl. No.: 16/766,259

(22) PCT Filed: Nov. 21, 2018

(86) PCT No.: PCT/JP2018/042943
§ 371 (c)(1),
(2) Date: May 21, 2020

(87) PCT Pub. No.: WO2019/103025
PCT Pub. Date: May 31, 2019

(65) Prior Publication Data
US 2020/0376607 A1 Dec. 3, 2020

(30) Foreign Application Priority Data

Nov. 24, 2017 (JP) .............................. JP2017-225677
Jul. 20, 2018 (JP) .............................. JP2018-136676

(Continued)

(51) Int. Cl.
B23K 35/26 (2006.01)
B23K 35/02 (2006.01)
(Continued)

(52) U.S. Cl.
CPC .......... *B23K 35/262* (2013.01); *B23K 35/025* (2013.01); *C22C 13/00* (2013.01);
(Continued)

(58) Field of Classification Search
None
See application file for complete search history.

(56) References Cited

U.S. PATENT DOCUMENTS 4,954,184 A 9/1990 Conn
5,215,602 A 6/1993 Ali et al.
(Continued)

FOREIGN PATENT DOCUMENTS

CN 1603056 A 4/2005
CN 1712175 A 12/2005
(Continued)

OTHER PUBLICATIONS

English machine translation of CN 1712175, EPO, accessed Aug. 25, 2021.*
(Continued)

*Primary Examiner* — Xiaobei Wang
(74) *Attorney, Agent, or Firm* — Wolf, Greenfield & Sacks, P.C.

(57) ABSTRACT

The present invention provides a solder material containing Sn or a Sn-containing alloy and 40 to 320 ppm by mass of A, the solder material including an As-enriched layer.

19 Claims, 2 Drawing Sheets

(30) Foreign Application Priority Data

| Jul. 20, 2018 | (JP) | JP2018-136678 |
| Jul. 20, 2018 | (JP) | JP2018-136761 |
| Jul. 20, 2018 | (JP) | JP2018-136766 |

(51) Int. Cl.
  *C22C 13/00* (2006.01)
  *C22C 13/02* (2006.01)
  *B22F 1/00* (2022.01)
  *H05K 3/34* (2006.01)

(52) U.S. Cl.
  CPC ............ *C22C 13/02* (2013.01); *H05K 3/3457* (2013.01); *Y10T 428/12708* (2015.01)

(56) References Cited

U.S. PATENT DOCUMENTS

| 10,556,299 B2 | 2/2020 | Yamasaki et al. |
| 2004/0126270 A1 | 7/2004 | Izumida et al. |
| 2015/0224604 A1 | 8/2015 | Choudhury et al. |
| 2016/0158896 A1 | 6/2016 | Koroki et al. |
| 2016/0158897 A1 | 6/2016 | Koroki et al. |
| 2016/0271737 A1 | 9/2016 | Ikeda et al. |
| 2016/0271738 A1 | 9/2016 | Murphy et al. |
| 2016/0288271 A1 | 10/2016 | Ikeda et al. |
| 2017/0252871 A1 | 9/2017 | Kawasaki et al. |
| 2020/0376607 A1 | 12/2020 | Kawasaki et al. |
| 2021/0245305 A1 | 8/2021 | Kawasaki et al. |
| 2021/0308808 A1 | 10/2021 | Kawasaki et al. |

FOREIGN PATENT DOCUMENTS

| CN | 103267834 A | 8/2013 |
| CN | 105431253 A | 3/2016 |
| CN | 105829016 A | 8/2016 |
| EP | 3 062 956 B1 | 9/2019 |
| JP | 2002-224881 A | 8/2002 |
| JP | 2006-181636 A | 7/2006 |
| JP | 2006-181637 A | 7/2006 |
| JP | 2006-212660 A | 8/2006 |
| JP | 2008-030105 A | 2/2008 |
| JP | 2013-049088 A | 3/2013 |
| JP | 2013-126671 A | 6/2013 |
| JP | 2013-237088 A | 11/2013 |
| JP | 2013-237089 A | 11/2013 |
| JP | 2013-237091 A | 11/2013 |
| JP | 2014-069227 A | 4/2014 |
| JP | 2014-087814 A | 5/2014 |
| JP | 2015-020181 A | 2/2015 |
| JP | 2015-020182 A | 2/2015 |
| JP | 2015-098052 A | 5/2015 |
| JP | 5807733 B1 | 11/2015 |
| JP | 2016-500578 A | 1/2016 |
| JP | 2016-026882 A | 2/2016 |
| JP | 2016-068105 A | 5/2016 |
| JP | 2016-179496 A | 10/2016 |
| JP | 2016-537206 A | 12/2016 |
| JP | 6322881 B1 | 5/2018 |
| JP | 2018-136678 A | 8/2018 |
| JP | 2018-167310 A | 11/2018 |
| JP | 2020-011286 A | 1/2020 |
| KR | 10-2016-0078379 A | 7/2016 |
| WO | WO 03/020468 A1 | 3/2003 |
| WO | WO 2007/029589 A1 | 3/2007 |
| WO | WO 2010/113833 A1 | 10/2010 |
| WO | WO 2014/168027 A1 | 10/2014 |
| WO | WO 2015/66155 A1 | 5/2015 |

OTHER PUBLICATIONS

International Search Report for International Application No. PCT/JP2019/046947 dated Mar. 3, 2020.

International Preliminary Report on Patentability (Chapter II) for International Application No. PCT/JP2019/046947 dated Jul. 13, 2020.

International Search Report and Written Opinion for International Application No. PCT/JP2019/020855 dated Aug. 27, 2019.

International Search Report and Written Opinion for International Application No. PCT/JP2019/020798 dated Aug. 27, 2019.

International Search Report and Written Opinion for International Application No. PCT/JP2019/041397 dated Jan. 21, 2020.

International Preliminary Report on Patentability for International Application No. PCT/JP2019/041397 dated Apr. 27, 2021.

Office Action for U.S. Appl. No. 17/261,558 dated Jun. 9, 2021 and claims pending as of Jun. 9, 2021.

Hasnine et al., Effect of Ge addition on wettability, copper dissolution, microstructural and mechanical behavior of SnCu—Ge solder alloy. J Mater Sci: Mater Electron. Jul. 17, 2017;28:16106-19. doi: 10.1007/s10854-017-7511-4.

Yamasumi, Examination of sample pretreatment method for quantification of added impurity elements in lead-free solder by ICP-AES. The Japan Society for Analytical Chemistry. Proceedings of the 50th Annual Meeting. Nov. 9, 2011:6. 3 pages.

International Search Report and Written Opinion for International Application No. PCT/JP2018/042943, dated Feb. 19, 2019.

International Preliminary Report on Patentability for International Application No. PCT/JP2018/042943, dated Jun. 4, 2020.

[No Author Listed] JIS Z 3282:2017 (JWES/JSA) Soft solders—Chemical compositions and forms. Japanese Industrial Standard. 2017. 36 pages.

[No Author Listed] Tin metal JIS H 2108-1996. Japanese Industrial Standard. Nov. 20, 1996, revised Feb. 20, 2009. 7 pages.

Office Action for U.S. Appl. No. 17/261,557 dated Nov. 5, 2021 and claims pending as of Nov. 5, 2021.

Office Action for U.S. Appl. No. 17/261,558 dated Sep. 27, 2021 and claims pending as of Sep. 27, 2021.

[No Author Listed], RoHS-Richtlinien. Wikipedia. Oct. 6, 2021. https://de.wikipedia.org/w/index.php?tile=RoHS-Richtlinien&oldid=173687369 [last accessed Oct. 3, 2021]. 11 pages.

Office Action for U.S. Appl. No. 17/261,557 dated Aug. 9, 2021 and claims pending as of Aug. 9, 2021.

\* cited by examiner

SOLDER MATERIAL, SOLDER PASTE, AND SOLDER JOINT

CROSS-REFERENCE TO RELATED APPLICATIONS

This Application is a national stage filing under 35 U.S.C. 371 of International Application Serial No. PCT/JP2018/042943, filed Nov. 21, 2018, which claims priority to Japanese application number 2018-136676, filed Jul. 20, 2018, Japanese application number 2018-136678, filed Jul. 20, 2018, Japanese application number 2018-136761, filed Jul. 20, 2018, Japanese application number 2018-136766, filed Jul. 20, 2018, and Japanese application number 2017-225677, filed Nov. 24, 2017, each of which is herein incorporated by reference in their entirety.

TECHNICAL FIELD

The present invention relates to a solder material, a solder paste, and a solder joint.

BACKGROUND ART

Fixation and electrical connection of electronic components in an electronic device, such as packaging of electronic components on a printed circuit board, is generally performed by soldering, which is the most advantageous in terms of cost and reliability.

Solder materials generally contain Sn as a main component, and the Sn reacts with oxygen in the air during or after production to form a film of a Sn oxide on the surface thereof, which may cause yellowing color change in some cases.

As a solder whose color change is suppressed, the following solder material has been proposed: a solder material comprising a solder layer composed of either a metal material containing an alloy including Sn content of 40% or more, or a metal material including Sn content of 100%; and a covering layer covering a surface of the solder layer, the solder material being a sphere having a diameter of 1 to 1000 μm, wherein the covering layer includes a SnO film which is formed outside the solder layer and a $SnO_2$ film which is formed outside the SnO film, and a thickness of the covering layer is more than 0 nm and equal to or less than 4.5 nm (Patent Literature 1). In the solder of Patent Literature 1, since the $SnO_2$ film is formed, the yellowing color change of the surface of the solder is inhibited.

For the solder of Patent Literature 1, however, it is necessary to perform plasma exposure in a high energy state for forming the $SnO_2$ film, which makes production process complicated.

As another method for improving the color change of a solder material, adding an element such as P, Ge or Ga to a solder material is known. Such an element has lower standard free energy of formation of an oxide than Sn, and is very easily oxidized. Therefore, in forming a solder material such as a solder powder or a solder ball from a molten solder, not Sn but the element such as P, Ge or Ga is oxidized to be concentrated on the surface, and thus, the yellowing color change of the surface of the solder can be inhibited. However, a solder material is generally required to have a property of spreading on a metal of an electronic component (wettability) when molten, and when the element such as P, Ge or Ga is added, the wettability of the solder material is degraded. Poor wettability of a solder material causes soldering failure.

Besides, in bonding/assembling electronic components onto a substrate of an electronic device, soldering using a solder paste is advantageous in terms of cost and reliability as compared with the other type of soldering, and is most commonly employed. A solder paste is a mixture in the form of a paste obtained by kneading a solder material (solder powder) together with a flux containing components other than the solder material, such as rosin, an activator, a thixotropic agent and a solvent.

A solder paste is applied onto a substrate by, for example, screen printing using a metal mask. Therefore, in order to ensure printability of a solder paste, the solder paste needs to have an appropriate viscosity. A solder paste is, however, poor in storage stability in general, and the viscosity of the solder paste may increase with time.

In addition, when a difference ($\Delta T = T_L - T_S$) between a liquidus temperature ($T_L$) and a solidus temperature ($T_S$) of a solder material contained in a solder paste is large, the structure of the solder material becomes easily uneven when the solder paste is solidified after application onto a substrate of an electronic device, which can be a cause of degradation of the reliability in the future.

As a solder material containing Bi, a solder alloy powder for forming a bump, having a composition containing 2.8 to 4.2% by weight of Ag, 0.4 to 0.6% by weight of Cu, 50 to 1000 ppm of Bi, and a balance of Sn and an incidental impurity has been proposed, for example (Patent Literature 2).

As a solder material containing Sb, a solder alloy powder for forming a bump, having a composition containing 2.8 to 4.2% by weight of Ag, 0.4 to 0.6% by weight of Cu, 50 to 3000 ppm of Sb, and a balance of Sn and an incidental impurity has been proposed, for example (Patent Literature 3).

As a solder material containing Pb, a solder alloy powder for forming a bump, having a composition containing 2.8 to 4.2% by weight of Ag, 0.4 to 0.6% by weight of Cu, 50 to 5000 ppm of pb, and a balance of Sn and an incidental impurity has been proposed, for example (Patent Literature 4).

However, all the solder materials described in Patent Literatures 2 to 4 aim to inhibit a projection caused in forming a bump, and do not solve the problems of the color change and the viscosity increase with time when in the form of a solder paste.

Thus, there is a demand for a solder material that is capable of inhibiting the color change and the viscosity increase with time when in the form of a solder paste, and that is excellent in wettability and reliability.

CITATION LIST

Patent Literature

Patent Literature 1: Japanese Patent No. 5807733
Patent Literature 2: Japanese Patent Laid-Open No. 2013-237089
Patent Literature 3: Japanese Patent Laid-Open No. 2013-237091
Patent Literature 4: Japanese Patent Laid-Open No. 2013-237088

SUMMARY OF INVENTION

Technical Problem

An object of the present invention is to provide a solder material that is minimally changed in color and increased in viscosity with time when in the form of a paste, and is excellent in wettability and reliability.

Solution to Problem

As a result of earnest studies for solving the above-described problems, the present inventors have found that a solder material having an As-enriched layer on a surface side is minimally changed in color and changed in viscosity with time when in the form of a paste, and that although a solder material containing As tends to have lower wettability in general, such lowering of the wettability is not caused when the As-enriched layer is formed on the surface. Thus, the present inventors have found that the above-described problems can be solved by using such a material, and thus, the present invention has been accomplished.

Specifically, specific aspects of the present invention are as follows.

It is noted that a numerical range expressed with "to" herein means that the range includes numerical values on both sides of "to". A content of each element can be measured, for example, by ICP-AES analysis performed in accordance with JIS Z 3910.

[1] A solder material, comprising Sn or a Sn-containing alloy and 40 to 320 ppm by mass of As, the solder material including an As-enriched layer.

[2] The solder material according to [1] described above, further comprising 20 ppm by mass to 3% by mass of Bi.

[3] The solder material according to [1] described above, further comprising 20 ppm by mass to 0.5% by mass of Sb.

[4] The solder material according to [1] described above, further comprising 20 ppm by mass to 0.7% by mass of Pb.

[5] The solder material according to [1] described above, further comprising 0 to 3000 ppm by mass of Sb, 0 to 10000 ppm by mass of Bi, and 0 to 5100 ppm by mass of Pb, wherein contents of Bi and Pb are not simultaneously 0 ppm by mass.

[6] The solder material according to [5] described above, wherein contents of As, Sb, Bi and Pb satisfy the following formulas (1) and (2):

$$275 \leq 2As+Sb+Bi+Pb \quad (1)$$

$$0.01 \leq (2As+Sb)/(Bi+Pb) \leq 10.00 \quad (2)$$

wherein As, Sb, Bi and Pb in the formulas (1) and (2) respectively represent contents (in ppm by mass) of As, Sb, Bi and Pb in the solder material.

[7] The solder material according to any one of [1] to [6] described above, wherein the Sn or Sn-containing alloy is a Sn-containing alloy containing 0.005 to 40% by mass of Ag and/or 0.001 to 10% by mass of Cu.

[8] The solder material according to any one of [1] to [7] described above, wherein the Sn or Sn-containing alloy contains 0 to 4% by mass of Ag, 0 to 1% by mass of Cu, 0 to 52% by mass of In, 0 to 0.15% by mass of Ni, 0 to 0.015% by mass of Co, and a balance of Sn.

[9] The solder material according to any one of [1] to [8] described above, wherein the solder material is in the form of a powder.

[10] A solder paste comprising the solder material according to [9] described above and a flux.

[11] The solder paste according to [10] described above, further comprising a zirconium oxide powder.

[12] The solder paste according to [11] described above, wherein a content of the zirconium oxide powder is 0.05 to 20.0% by mass with respect to a total mass of the solder paste.

[13] The solder material according to any one of [1] to [8] described above, serving as a solder joint.

Advantageous Effects of Invention

According to the present invention, a solder material that is minimally changed in color, is good in wettability, has high reliability in cycle characteristics and the like, and is minimally increased in viscosity with time when in a solder paste can be provided.

DESCRIPTION OF EMBODIMENT

Figure 1:
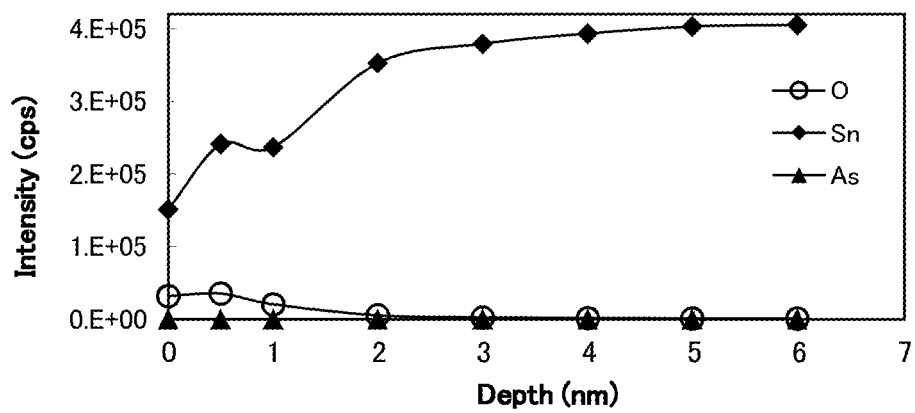
FIG. 1 is an example of an XPS analysis chart of a surface of a solder material.

Now, an embodiment for practicing the present invention (hereinafter referred to as the "present embodiment") will be described.

The present invention is not limited to the following embodiment but can be variously modified within the spirit and scope thereof.

In the present embodiment, a solder material contains at least Sn or a Sn-containing alloy and 40 to 320 ppm by mass of As.

Here, the purity of Sn is not especially limited, and for example, those having a purity of 3N (99.9% or more), 4N (99.99% or more) or 5N (99.999% or more) generally used in the art can be used.

Examples of the Sn-containing alloy include a Sn—Ag alloy, a Sn—Cu alloy, a Sn—Ag—Cu alloy, a Sn—Ag—Cu—Ni—Co alloy, a Sn—In alloy, and alloys obtained by further adding, to any of these alloys, Ag, Cu, In, Ni, Co, Ge, P, Fe, Zn, Al, Ga or the like. A content of Sn in the Sn-containing alloy is not especially limited, and can be, for example, over 40% by mass.

The Sn and the Sn-containing alloy may contain an incidental impurity.

In the present embodiment, in view of physical properties of the solder material, such as solder wettability and a melting point, the Sn-containing alloy preferably contains 0.005 to 40% by mass of Ag and/or 0.001 to 10% by mass of Cu, and the balance of Sn.

In this case, in view of $\Delta T$, a content of Ag with respect to the total mass of the solder material is preferably 4% by mass or less. When the content of Ag is over 3.8% by mass, $\Delta T$ tends to largely increase. The content of Ag with respect to the total mass of the solder material is more preferably 0.1 to 3.8% by mass, and most preferably 0.5 to 3.5% by mass.

Besides, in view of $\Delta T$, a content of Cu with respect to the total mass of the solder material is preferably 1.0% by mass or less. When the content of Cu is over 0.9% by mass, $\Delta T$ tends to largely increase. The content of Cu with respect to the total mass of the solder material is more preferably 0.05 to 0.9% by mass, and most preferably 0.1 to 0.7% by mass.

The preferable numerical ranges of the contents of Ag and Cu are independent of each other, and the contents of Ag and Cu can be each independently determined.

Alternatively, the Sn-containing alloy preferably contains 0 to 4% by mass of Ag, 0 to 1% by mass of Cu, 0 to 52% by mass of In, 0 to 0.15% by mass of Ni, 0 to 0.015% by mass of Co, and the balance of Sn. In this case, the content of Ag with respect to the total mass of the solder material is preferably 0 to 4% by mass, more preferably 1 to 4% by mass, and most preferably 1 to 3% by mass. The content of Cu with respect to the total mass of the solder material is preferably 0 to 1% by mass, more preferably 0.3 to 0.75% by mass, and most preferably 0.5 to 0.7% by mass.

The content of In with respect to the total mass of the solder material is preferably 0 to 52% by mass, and more preferably 0 to 10% by mass or 40 to 52% by mass.

The preferable numerical ranges of the contents of these elements are independent of one another, or the contents of these elements can be each independently determined.

In the present embodiment, the content of As with respect to the total mass of the solder material is 40 to 320 ppm by mass (0.0040 to 0.0320% by mass).

A preferable content of As is varied depending on the composition of the solder material, and when the solder material contains merely Sn or a Sn-containing alloy and As, the content of As is more preferably 70 to 320 ppm by mass, and further preferably 70 to 200 ppm by mass.

Alternatively, when the solder material contains one or more elements selected from Bi, Sb and Pb, the content of As is preferably 40 to 250 ppm by mass, more preferably 50 to 150 ppm by mass, and further preferably 50 to 100 ppm by mass.

In either case, however, when the content of As is less than 40 ppm by mass, it is extremely difficult to form an As-enriched layer.

As long as an As-enriched layer is present in the solder material with a content of As of 40 to 320 ppm by mass with respect to the total mass of the solder material, a part or the whole of As may constitute an alloy (such as an intermetallic compound or a solid solution) together with Sn or the Sn-containing alloy, or may be present, separately from the Sn-containing alloy, in the form of, for example, simple As or an oxide thereof.

In the present embodiment, the solder material may contain merely Sn or a Sn-containing alloy, and 40 to 320 ppm by mass of As, and preferably further contains one or more elements selected from Bi, Sb and Pb.

When Bi is contained, a content of Bi with respect to the total mass of the solder material is preferably 20 ppm by mass to 3% by mass (0.002 to 3% by mass). It has been found that adequate presence of Bi tends to inhibit viscosity increase. Although the reason is not clear, it is presumed that since Bi is noble to Sn, a Sn—Bi alloy is more difficult to be ionized than Sn, and hence is difficult to elute into a flux in an ionized state (as a salt). However, the mechanism is not limited to this. On the other hand, when the content of Bi is too high, a difference ($\Delta T=T_L-T_S$) between a liquidus temperature ($T_L$) and a solidus temperature ($T_S$) is large, and hence it is apprehended that reliability in cycle characteristics and the like may be degraded. In view of these, the content of Bi with respect to the total mass of the solder material is preferably 0.005 to 2.5% by mass, and further preferably 0.01 to 1% by mass.

As long as the content of Bi with respect to the total mass of the solder material is 20 ppm by mass to 3% by mass, the whole of Bi may constitute an alloy (such as an intermetallic compound or a solid solution) together with Sn or a Sn-containing alloy, or a part of Bi may be present separately from the Sn-containing alloy.

When Sb is contained, a content of Sb with respect to the total mass of the solder material is preferably 20 ppm by mass to 0.5% by mass (0.002 to 0.5% by mass). It has been found that adequate presence of Sb tends to inhibit the viscosity increase. Although the reason is not clear, it is presumed that since Sb is noble to Sn, a Sn—Sb alloy is more difficult to be ionized than Sn, and hence is difficult to elute into a flux in an ionized state (as a salt). However, the mechanism is not limited to this. On the other hand, when the content of Sb is too high, it is apprehended that the wettability may be degraded. In view of these, the content of Sb with respect to the total mass of the solder material is more preferably 0.005 to 0.3% by mass, and further preferably 0.01 to 0.1% by mass.

As long as the content of Sb with respect to the total mass of the solder material is 20 ppm by mass to 0.5% by mass, the whole of Sb may constitute an alloy (such as an intermetallic compound or a solid solution) together with Sn or a Sn-containing alloy, or a part of Sb may be present separately from the Sn-containing alloy.

When Pb is contained, a content of Pb with respect to the total mass of the solder material is preferably 20 ppm by mass to 0.7% by mass (0.002 to 0.7% by mass). It has been found that adequate presence of Pb tends to inhibit the viscosity increase. Although the reason is not clear, it is presumed that since Pb is noble to Sn, a Sn—Pb alloy is more difficult to be ionized than Sn, and hence is difficult to elute into a flux in an ionized state (as a salt). However, the mechanism is not limited to this. On the other hand, when the content of Pb is too high, the difference ($\Delta T=T_L-T_S$) between the liquidus temperature ($T_L$) and the solidus temperature ($T_S$) is large, and hence it is apprehended that reliability in cycle characteristics and the like may be degraded. In view of these, the content of Pb with respect to the total mass of the solder material is more preferably 0.005 to 0.7% by mass, and further preferably 0.01 to 0.5% by mass.

As long as the content of Pb with respect to the total mass of the solder material is 20 ppm by mass to 0.7% by mass, the whole of Pb may constitute an alloy (such as an intermetallic compound or a solid solution) together with Sn or a Sn-containing alloy, or a part of Pb may be present separately from the Sn-containing alloy.

When two or more elements out of Bi, Sb and Pb are contained, it is preferable that the contents of Sb be 0 to 3000 ppm by mass, of Bi be 0 to 10000 ppm by mass, and of Pb be 0 to 5100 ppm by mass, with respect to the total mass of the solder material.

It has been found that adequate presence of Sb, Bi or Pb tends to inhibit the viscosity increase. Although the reason is not clear, it is presumed that since these elements are noble to Sn, a Sn—Sb/Bi/Pb alloy is more difficult to be ionized than Sn, and hence is difficult to elute into a flux in an ionized state (as a salt). However, the mechanism is not limited to this. Particularly, Bi and Pb tend to inhibit wettability degradation otherwise caused when the solder material contains As.

On the other hand, when the contents of Sb, Bi and Pb are too high, the solidus temperature is lowered to increase the difference ($\Delta T=T_L-T_S$) between the liquidus temperature ($T_L$) and the solidus temperature ($T_S$). Therefore, in a solidification process of a molten solder, a high-melting point crystalline phase having low contents of Bi and Pb deposits priorly, and thereafter, a low-melting point crystalline phase having high concentrations of Bi and Pb segregates. As a result, mechanical strength and the like of the solder material are degraded, which may degrade the reliability in cycle characteristics and the like. Particularly, since a crystalline phase having a high concentration of Bi is hard and fragile, it is apprehended that the reliability may be greatly degraded when such a phase segregates in the solder material.

In view of these, when two or more elements out of Bi, Sb and Pb are contained, preferable ranges of the contents of Sb, Bi and Pb are as follows.

The lower limit of the Sb content is preferably 25 ppm by mass or more, more preferably 50 ppm by mass or more, further preferably 100 ppm by mass or more, and particularly preferably 300 ppm by mass or more. The upper limit of the Sb content is preferably 1150 ppm by mass or less, and more preferably 500 ppm by mass or less.

The lower limit of the Bi content is preferably 25 ppm by mass or more, more preferably 50 ppm by mass or more, further preferably 75 ppm by mass or more, particularly preferably 100 ppm by mass or more, and most preferably 250 ppm by mass or more. The upper limit of the Bi content is preferably 1000 ppm by mass or less, more preferably 600 ppm by mass or less, and further preferably 500 ppm by mass or less.

The lower limit of the Pb content is preferably 25 ppm by mass or more, more preferably 50 ppm by mass or more, further preferably 75 ppm by mass or more, particularly preferably 100 ppm by mass or more, and most preferably 250 ppm by mass or more. The upper limit of the Pb content is preferably 5000 ppm by mass or less, more preferably 1000 ppm by mass or less, further preferably 850 ppm by mass or less, and particularly preferably 500 ppm by mass or less.

As long as the contents of Sb, Bi and Pb with respect to the total mass of the solder material satisfy the aforementioned conditions, the whole of these may constitute an alloy (such as an intermetallic compound or a solid solution) together with Sn or a Sn-containing alloy, or a part of these may be present separately from the Sn-containing alloy.

When the solder material of the present embodiment contains two or more elements out of Bi, Sb and Pb, the contents of As, Sb, Bi and Pb preferably satisfy the following formula (1):

$$275 \le 2As+Sb+Bi+Pb \tag{1}$$

In the formula (1), As, Sb, Bi and Pb respectively represent contents (in ppm by mass) of As, Sb, Bi and Pb in the solder material.

As, Sb, Bi and Pb are all elements having the effect of inhibiting the viscosity increase when the solder material is in the form of a paste (viscosity increase inhibitory effect), and therefore, in view of inhibition of viscosity increase, a total contents of these is preferably 275 ppm or more. In the formula (1), the As content is doubled because As has a high viscosity increase inhibitory effect as compared with Sb, Bi and Pb.

2As+Sb+Bi+Pb is preferably 350 or more, and more preferably 1200 or more. On the other hand, there is no upper limit in 2As+Sb+Bi+Pb, but in view of setting ΔT in a suitable range, the upper limit is 18600 or less, preferably 10200 or less, further preferably 5300 or less, and particularly preferably 3800 or less.

The upper limits and the lower limits appropriately selected from the aforementioned preferable aspects are represented as the following formulas (1a) and (1b):

$$275 \le 2As+Sb+Bi+Pb \le 18600 \tag{1a}$$

$$275 \le 2As+Sb+Bi+Pb \le 5300 \tag{1b}$$

In the formulas (1a) and (1b), As, Sb, Bi and Pb respectively represent the contents (in ppm by mass) of As, Ab, Bi and Pb in the solder material.

In the present embodiment, the contents of As, Sb, Bi and Pb preferably satisfy the following formula (2):

$$0.01 \le (2As+Sb)/(Bi+Pb) \le 10.00 \tag{2}$$

In the formula (2), As, Sb, Bi and Pb respectively represent the contents (in ppm by mass) of As, Sb, Bi and Pb in the solder material.

In general, when the contents of As and Sb are high, the wettability of the solder material tends to be degraded. On the other hand, Bi and Pb tend to inhibit the degradation of the wettability otherwise caused when As is contained. Accordingly, either of Bi and Pb is preferably contained. When the contents of Bi and Pb are too high, however, ΔT is unavoidably increased, and hence, it is necessary to strictly control these contents. In particular, in an alloy composition simultaneously containing Bi and Pb, ΔT is easily increased, and when the wettability is to be excessively improved by increasing the contents of Bi and Pb, ΔT is unavoidably increased. On the other hand, when the viscosity increase inhibitory effect is to be improved by increasing the contents of As and Sb, the wettability is unavoidably degraded. However, these elements are divided into a group of As and Sb and a group of Bi and Pb, and when the total contents of the respective groups are set to satisfy the relationship of the formula (2), the contents of the group of As and Sb and the group of Bi and Pb are appropriately balanced, and as a result, the viscosity increase inhibitory effect, reduction of ΔT and satisfactory wettability can be all simultaneously attained.

When (2As+Sb)/(Bi+Pb) is less than 0.01, the total content of Bi and Pb is relatively high to the total content of As and Pb, and hence ΔT is unavoidably increased. (2As+Sb)/(Bi+Pb) is preferably 0.01 or more, more preferably 0.02 or more, further preferably 0.41 or more, still further preferably 0.90 or more, particularly preferably 1.00 or more, and most preferably 1.40 or more. On the other hand, when (2As+Sb)/(Bi+Pb) is over 10.00, the total content of As and Sb is relatively high to the total content of Bi and Pb, and hence the wettability is unavoidably degraded. (2As+Sb)/(Bi+Pb) is preferably 10.00 or less, more preferably 5.33 or less, further preferably 4.50 or less, still further preferably 4.18 or less, particularly preferably 2.67 or less, and most preferably 2.30 or less.

Since a denominator of the formula (2) is "Bi+Pb", at least one of Bi and Pb is always contained when the formula (2) is satisfied. As described above, Bi and Pb tend to inhibit the degradation of the wettability otherwise caused when As is contained, and therefore, at least one of these is preferably contained.

The upper limit and the lower limit appropriately selected from the aforementioned preferable aspects are represented by the following formula (2a):

$$0.31 \le (2As+Sb)/(Bi+Pb) \le 10.00 \tag{2a}$$

In the formula (2a), As, Sb, Bi and Pb respectively represent the contents (in ppm by mass) of As, Sb, Bi and Pb in the solder material.

When the solder material of the present embodiment contains two or more elements out of Bi, Sb and Pb, the contents of As, Sb, Bi and Pb satisfy preferably at least one of, and more preferably both of the formulas (1) and (2) described above.

In the present embodiment, the solder material includes an As-enriched layer in at least a part thereof. Here, an As-enriched layer refers to a region where an As concentration is higher than an average As concentration (a content of As with respect to the total mass of the solder material)

in the solder material, and specifically, the presence of such a region can be checked in accordance with the criterion described below.

The As-enriched layer is preferably present at least in a part on the surface side of the solder material, and preferably covers the whole surface.

(Criterion)

A sample with a size of 5.0 mm×5.0 mm is prepared (when the solder material is not in a plate shape, the solder material (a solder powder, a solder ball or the like) are put in an area of 5.0 mm×5.0 mm without any gap to prepare a sample), and an arbitrary area of 700 μm×300 μm is selected therein and subjected to XPS analysis involving ion sputtering. One area is selected in each sample, and the analysis is performed once in each of three samples, namely, three times in total. When magnitude relationship between S1 and S2 described later is the same in all the analysis performed three times (when S1>S2 in all the analysis performed three times in a case where an As-enriched layer is present on the surface side), it is determined that an As-enriched layer is formed.

Figure 3:
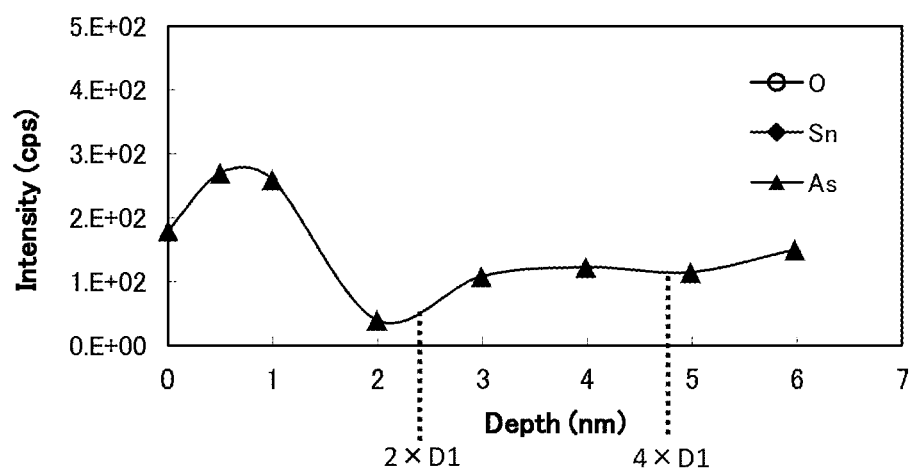
FIG. 3 is still another example of the XPS analysis chart of the surface of the solder material.

Here, S1, S2 and D1 are defined as follows:

S1: an integral value of the detected intensity of As in an area having a depth in terms of $SiO_2$ of 0 to 2×D1 (nm) in a chart obtained by the XPS analysis of the sample S2: an integral value of the detected intensity of As in an area having a depth in terms of $SiO_2$ of 2×D1 to 4×D1 (nm) in the chart obtained by the XPS analysis of the sample D1: a first depth (nm) in terms of $SiO_2$ at which the detected intensity of O atom is ½ of the maximum detected intensity (intensity at Do·max) in a portion deeper than a depth (Do·max (nm)) in terms of $SiO_2$ corresponding to the maximum detected intensity of O atom in the chart obtained by the XPS analysis of the sample (see FIG. 3)

Detailed conditions of the XPS analysis for this criterion follow those described in "(1) Evaluation of Presence of As-enriched Layer" described later.

In this criterion, it is assumed that D1 can be defined, namely, the detected intensity of O atom has a maximum value in the XPS analysis chart. When D1 cannot be defined (for example, when the detected intensity of O atom is always constant), it is determined that an As-enriched layer is not present.

The reason why the problems such as the color change, the wettability and the viscosity increase caused when in the form of a solder paste can be overcome by the presence of an As-enriched layer is not clear, but is presumed as follows. The viscosity increase is probably caused because a salt or an aggregate of the solder material is formed through a reaction between Sn or a Sn oxide and various additives such as an activator contained in the solder paste (flux). When an As-enriched layer is present on the surface of the solder material, the As-enriched layer is disposed between the solder alloy and the flux, and hence the aforementioned reaction is difficult to occur. However, the mechanism is not limited to this.

In the present embodiment, a thickness (in terms of $SiO_2$) of the As-enriched layer is not limited, and is preferably 0.5 to 8.0 nm, more preferably 0.5 to 4.0 nm, and most preferably 0.5 to 2.0 nm. Here, the thickness of the As-enriched layer corresponds to 2×D1.

When the thickness of the As-enriched layer falls in the aforementioned range, the color change and the viscosity increase caused with time when in the form of a solder paste can be sufficiently inhibited without harmfully affecting the wettability.

The solder material of the present embodiment has the As content with respect to the total mass of the solder material falling in the aforementioned range, and the solder material includes an As-enriched layer. Therefore, the color change and the viscosity increase caused with time when in the form of a solder paste can be inhibited, and in addition, the wettability and the reliability are excellent.

In the present embodiment, a yellowness index b* in the L*a*b* color space of the solder material is preferably 0 to 10.0, more preferably 3.0 to 5.7, and most preferably 3.0 to 5.0. When the yellowness index b* in the L*a*b* color space of the solder material falls in the aforementioned range, the yellowness index is low and the solder has a metallic luster. Therefore, the solder can be accurately detected in automatic process for image recognition of the solder.

The yellowness index b* can be obtained from color values (L*, and b*) obtained by measuring spectral transmittance, for example, using CM-3500d2600d spectrophotometer (manufactured by Konica Minolta, Inc.) with a D65 light source and 10-degree visual field in accordance with JIS Z 8722 "Methods of color measurement—Reflecting and transmitting objects".

A production method for the solder material of the present embodiment is not limited, and the solder material can be produced by melt mixing raw material metals.

A method for forming an As-enriched layer in the solder material is not also limited. In an example of the method for forming an As-enriched layer, the solder material is heated in an oxidation atmosphere (an atmosphere of air or oxygen). A heating temperature is not limited, and it can be, for example, 40 to 200° C., and may be 50 to 80° C. A heating time is also not limited, and it can be, for example, several minutes to several days, and preferably several minutes to several hours. In order to form an adequate amount of an As-enriched layer, the heating time is preferably 10 minutes or more, and further preferably 20 minutes or more.

In the present embodiment, the shape of the solder material is not especially limited, and may be a bar shape like a solder bar, a wire shape, a solder ball, or a particulate shape like a solder powder.

When the solder material is in a particulate shape, flowability of the solder material is improved.

A method for producing the solder material in a particulate shape is not limited, and any of known methods, such as a drop method in which a particle is obtained by dropping the solder material in a molten state, a spray method in which a particle is obtained by of performing centrifugal spray, and a method in which the solder material in a bulk state is crushed, can be employed. In the drop method or the spray method, dropping or spraying is performed preferably in an inert atmosphere or in a solvent for obtaining a particulate shape.

In a case where the solder material is in the form of a powder, it can be used in soldering onto a minute component when it has a size (particle size distribution) corresponding to Nos. 1 to 8 of particle size classification (Table 2) of JIS Z 3284-1: 2004. The size of the solder material in a particulate shape is preferably a size corresponding to Nos. 4 to 8, and more preferably a size corresponding to Nos. 5 to 8.

When the solder material is in the form of a ball, an average ball diameter is preferably 1 to 1000 μm, more preferably 1 to 300 μm, and most preferably 1 to 120 μm. When the ball diameter falls in this range, the solder material can be used in soldering onto a minute component.

When the solder material is in the form of a ball, its sphericity is preferably 0.90 or more, more preferably 0.95 or more, and most preferably 0.99 or more.

Here, the average ball diameter and the sphericity of a solder ball can be measured using a CNC image measurement system (such as Ultra Quick Vision ULTRA QV 350-PRO manufactured by Mitutoyo Corporation) employing a minimum zone circle method (MZC method). Specifically, the "particle size" refers to an average of a major axis and a minor axis of a bounding rectangle having the smallest area of a particle among particles imaged using the image measurement system. The "average particle size" refers to an average of particle sizes measured for 500 particles arbitrarily extracted from an image captured using the image measurement system. Besides, the sphericity corresponds to a deviation from a true sphere, and is obtained as an arithmetic mean of values each obtained by dividing the particle size by the major axis of a bounding rectangle having the smallest area for 500 balls arbitrarily extracted from an image captured using the image measurement system. When this value is closer to the upper limit of 1.00, the ball is more approximate to a true sphere.

In the present embodiment, the form of the solder material when used is not especially limited. For example, the solder material may be mixed with a fat or oil to obtain a resin flux cored solder, or when the solder material is in the form of a powder, the solder material may be mixed with a flux containing a rosin-based resin, an activator, a solvent or the like to use the resultant as a solder paste or a solder ball. Since the solder material of the present embodiment is small in the viscosity increase caused with time when in the form of a solder paste, it is particularly suitably used as a solder paste.

In the present embodiment, a solder paste contains a solder powder of the present embodiment and a flux.

Here, the term "flux" refers to the whole components excluding the solder powder contained in the solder paste, and a mass ratio between the solder powder and the flux (solder powder:flux) is not limited, and can be appropriately set in accordance with use.

In the present embodiment, the composition of the flux is not limited, and the flux can contain, for example, a resin component; a solvent; and various additives such as an activator, a thixotropic agent, a pH adjuster, an antioxidant, a colorant and an antifoaming agent in arbitrary ratios. The resin, the solvent and the various additives are not limited, and those generally used in a solder paste can be used. Specific preferable examples of the activator include an organic acid, amine, and a halogen (such as an organic halogen compound or amine hydrohalide).

In the present embodiment, the solder paste can further contain a zirconium oxide powder. A content of the zirconium oxide powder with respect to the total mass of the solder paste is preferably 0.05 to 20.0% by mass, more preferably 0.05 to 10.0% by mass, and most preferably 0.1 to 3% by mass.

When the content of the zirconium oxide powder falls in the aforementioned range, the activator contained in the flux predominantly reacts with the zirconium oxide powder, and hence a reaction with Sn or a Sn oxide present on the surface of the solder powder is difficult to occur. Thus, the effect of further inhibiting the viscosity increase otherwise caused with time is exhibited.

There is no upper limit of the particle size of the zirconium oxide powder added to the solder paste, but the particle size is preferably 5 µm or less. When the particle size is 5 µm or less, printability of the paste can be retained. Also, there is no lower limit, but the particle size is preferably 0.5 µm or more. For obtaining the particle size, a SEM photograph of the zirconium oxide powder is obtained to measure equivalent projected circle diameters of respective particles present in a visual field by image analysis, and an average of equivalent projected circle diameters of 0.1 µm or more is calculated to be defined as the particle size.

The shape of the zirconium oxide particle is not especially limited, and when the particle has an irregular shape, a contact area with the flux is so large that the viscosity increase inhibitory effect can be obtained. When the particle has a spherical shape, good flowability can be obtained, and hence excellent printability as a paste can be obtained. The shape may be appropriately selected in accordance with desired properties.

In the present embodiment, the solder paste can be produced by kneading the solder material (solder powder) of the present embodiment and the flux by a known method.

The solder paste of the present embodiment can be used on, for example, a fine circuit board of an electronic device, and specifically, it can be applied onto a soldered portion by, for example, a printing method using a metal mask, an ejecting method using a dispenser, or a transferring method with a transfer pin to perform reflow.

In the present embodiment, the solder material can be used as a joint (connecting portion) connecting two or more members of various types. Members to be connected are not limited, and the solder material is useful as, for example, a joint between electronic device members.

When the solder joint includes an As-enriched layer with a content of As with respect to a total mass of the solder joint within the aforementioned range, the solder joint is free from color change and has excellent reliability.

In the present embodiment, the solder joint can be produced by a method generally employed in the art, such as a method in which a solder ball containing the solder material of the present embodiment or the solder paste of the present embodiment is disposed or applied on a portion to be connected, followed by heating.

Now, the present invention will be more specifically described with reference to examples, but the present invention is not limited to contents described in the examples.

EXAMPLES (Evaluation)

A solder material of each of examples and comparative examples was subjected to three or four evaluations out of evaluations of (1) presence of an As-enriched layer, (2) inhibition of viscosity increase, (3) solder wettability, (4) reliability and (5) inhibition of yellowing color change as described below.

(1) Evaluation of Presence of as-Enriched Layer

The presence of an As-enriched layer was evaluated by depth direction analysis using XPS (X-ray Photoelectron Spectroscopy) as follows:

(Analysis Conditions)

Analyzer: micro area X-ray photoelectron spectrometer (AXIS Nova manufactured by Kratos Analytical Ltd.)

Analysis Conditions: X-ray source: AlKα rays, X-ray gun voltage: 15 kV, X-ray gun current: 10 mA, analysis area: 700 µm×300 µm Sputtering Conditions: ion species: Ar$^+$, acceleration voltage: 2 kV, sputtering rate: 0.5 nm/min (in terms of $SiO_2$)

Sample: A solder material (a solder powder of each of the examples and comparative examples) was put flat without any gap on a stage covered with a carbon tape adhering thereto to obtain a sample, and three such samples were prepared. Each sample had a size of 5.0 mm×5.0 mm.

(Evaluation Procedures)

In each sample having a size of 5.0 mm×5.0 mm, an arbitrary area of 700 μm X 300 μm was selected, and the XPS analysis was performed for Sn, O and As atoms with ion sputtering performed, so as to obtain an XPS analysis chart. One area was selected in each sample, and the analysis was performed once on each of the three samples, namely, three times in total.

Figure 2:
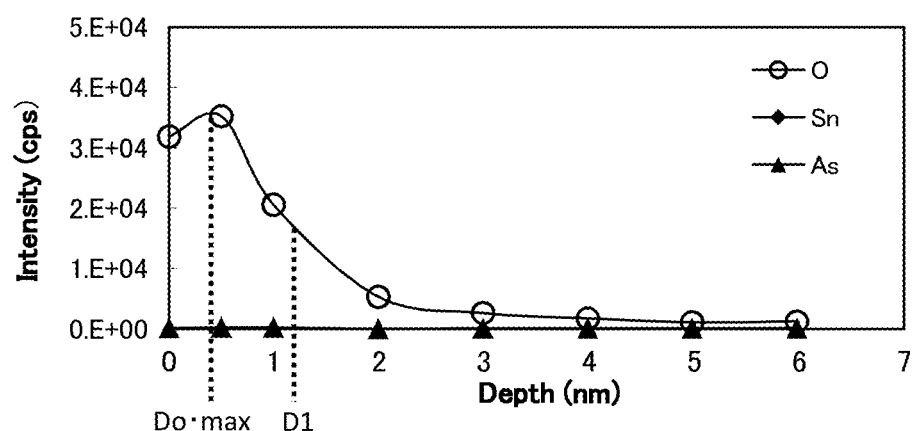
FIG. 2 is another example of the XPS analysis chart of the surface of the solder material.

Examples of the chart thus obtained by the XPS analysis are illustrated in FIGS. 1 to 3. FIGS. 1 to 3 are obtained from the same sample with a scale of the detected intensity (cps) indicated on the ordinate changed, and the abscissa indicates a depth (nm) in terms of $SiO_2$ calculated based on sputtering time. In an XPS analysis chart, the ordinate indicates the detected intensity (cps), and as the abscissa, either one of the sputtering time (min) and the depth (nm) in terms of $SiO_2$ calculated based on the sputtering time by using a sputter etching rate of a $SiO_2$ standard sample can be selected. In FIGS. 1 to 3, the abscissa of the XPS analysis chart is set to indicate the depth (nm) in terms of $SiO_2$ calculated based on the sputtering time by using a sputter etching rate of a $SiO_2$ standard sample.

In the XPS analysis chart of each sample, a depth in terms of $SiO_2$ at which the detected intensity of O atom was maximum was defined as Do·max (nm) (see FIG. 2). In addition, a first depth in terms of $SiO_2$ at which the detected intensity of O atom is ½ of the maximum detected intensity (intensity at Do·max) in a portion deeper than Do·max was defined as D1 (nm).

Next, in the XPS analysis chart of each sample, an integral value (S1) of the detected intensity of As in a region from the outermost surface down to a depth 2×D1 (a region having a depth in terms of $SiO_2$ of 0 to 2×D1 (nm)), and an integral value (S2) of the detected intensity of As in a region from the depth 2×D1 to a portion further deeper by 2×D1 (a region having a depth in terms of $SiO_2$ of 2×D1 to 4×D1 (nm)) (see FIG. 3) were obtained, and these integral values were compared.

Then, the evaluation was performed based on the following criteria:

S1>S2 in all the measurement performed three times: As-enriched layer is formed therein (◯)

S1>S2 twice or less in all the measurement performed three times: As-enriched layer is not formed therein (x)

(2) Evaluation of Inhibition of Viscosity Increase

Respective materials of a composition shown in Table 1 below were stirred under heating, and the resultant was cooled to prepare a flux. The thus prepared flux and the solder powder of each of the examples and comparative examples were kneaded in a mass ratio between the flux and the solder powder (flux:solder powder) of 11:89 to produce a solder paste.

TABLE 1

| Flux Material | Mixing Ratio (mass %) |
|---|---|
| Rosin | 42 |
| Glycolic Solvent | 35 |

TABLE 1-continued

| Flux Material | Mixing Ratio (mass %) |
|---|---|
| Thixotropic Agent | 8 |
| Organic Acid | 10 |
| Amine | 2 |
| Halogen | 3 |
| Total | 100 |

For the solder paste thus obtained, the viscosity was continuously measured for 12 hours using a rotational viscometer (PCU-205, manufactured by Malcom Co., Ltd.) at a rotational speed of 10 rpm and a measurement temperature of 25° C. in accordance with a method described in JIS Z 3284-3 "4.2 Test Method for Viscosity". Then, an initial viscosity (viscosity obtained after stirring for 30 minutes) and a viscosity obtained after 12 hours were compared with each other to evaluate the viscosity increase inhibitory effect based on the following criteria:

Viscosity after 12 hours≤Initial Viscosity×1.2: good because viscosity increase with time is small (◯)

Viscosity after 12 hours>Initial Viscosity×1.2: poor because viscosity increase with time is large (x)

(3) Evaluation of Solder Wettability

A solder paste was produced by using the solder powder of each of the examples and comparative examples in the same manner as described in "(2) Evaluation of Inhibition of viscosity increase" above.

The thus obtained solder paste was printed on a Cu plate by using a metal mask having an opening diameter of 6.5 mm, including 4 openings, and having a mask thickness of 0.2 mm, the resultant was heated in a reflow furnace under a $N_2$ atmosphere at a temperature increasing rate of 1° C./sec from 25° C. to 260° C., and the resultant was air-cooled to room temperature (25° C.). Thus, four solder bumps were formed. The appearances of the obtained solder bumps were observed with an optical microscope (magnification: 100 times) to perform the evaluation based on the following criteria:

Solder particles not sufficiently molten are observed in none of the four solder bumps: good solder wettability (◯)

Solder particles not sufficiently molten are observed one or more of the four solder bumps: poor solder wettability (x)

(4) Evaluation of Reliability

The solder powder of each of the examples and comparative examples was measured for a liquidus temperature ($T_L$) and a solidus temperature ($T_S$) by DSC measurement using a differential scanning calorimeter (EXSTAR DSC7020, manufactured by SII Nano Technology Inc.) under measurement conditions of a temperature increasing rate of 5° C./min (180° C. to 250°), a temperature decreasing rate of −3° C./min (250° C. to 150° C.) and a carrier gas of $N_2$. Then, a difference ($\Delta T = T_L - T_S$) between the liquidus temperature ($T_L$) and the solidus temperature ($T_S$) was calculated to perform the evaluation based on the following criteria:

$\Delta T$ is 10° C. or less: excellent reliability (◯)

$\Delta T$ is over 10° C.: poor reliability (x)

In a case where the difference ($\Delta T = T_L - T_S$) between the liquidus temperature ($T_L$) and the solidus temperature ($T_S$) of a solder powder is large, a structure having a high melting point easily deposits on the surface of the solder powder when a solder paste containing the solder powder is solidified after application onto a substrate of an electronic device. When a structure having a high melting point deposits on the surface of the solder powder, a structure having a lower melting point successively deposits toward the inside of the solder powder, and as a result, the structure of the solder powder easily becomes ununiform. This can be a cause of degrading reliability in the cycle characteristics and the like.

(5) Evaluation of Inhibition of Yellowing Color Change

A constant temperature bath placed in an air atmosphere was heated to 200° C., and a solder ball (ball diameter: 0.3 mm) according to each of Examples 1 to 44 and comparative examples 1 to 40 was heated in the constant temperature bath for 2 hours. Before and after the heating, the solder ball was measured for a yellowness index b* in the L*a*b* color space, and an increment (Δb*) obtained by subtracting a b* value before the heating from a b* value after the heating was calculated. Sn—In-containing solders of Examples 38 to 44 and Comparative Examples 35 to 40 have, however, a melting point of 200° C. or less, and hence were heated for 20 days in a constant temperature bath heated to 100° C. to perform similar measurement and calculation.

The yellowness index b* was obtained from color values (L*, and b*) obtained by measuring spectral transmittance using CM-3500d2600d spectrophotometer (manufactured by Konica Minolta, Inc.) with a D65 light source and 10-degree visual field in accordance with JIS Z 8722 "Methods of color measurement—Reflecting and transmitting objects". It is noted that the color values (L*, *a and b*) are defined in JIS Z 8729 "Color Specification—Color Values of L*a*b* Color Space and L*U*V* Color Space".

The increment of the solder ball of each metal composition was compared with the increment Δb* (Δb* (standard)) of the solder ball of Comparative Example 1, 7, 13, 19, 25, 27, 33 or 35 containing no As to perform the evaluation based on the following criteria:

The value Δb* is 50% or less of Δb* (standard): ⊙⊙ (very good)
The value Δb* is over 50% and 70% or less of Δb* (standard): ○ (good)
The value Δb* is more than 70% of Δb* (standard): x (bad)

1. Sn—As-Containing Solder

Examples 1 to 7 and Comparative Examples 1 to 6

Sn and As were weighed to satisfy the contents shown in Table 2 below, and melt mixed to prepare metal solder materials of Examples 1 to 7 and Comparative Examples 1 to 6. Each of the metal solder materials of Examples 1 to 7 and Comparative Examples 1 to 6 thus prepared was used to produce a solder ball (ball diameter: 0.3 mm) by the drop method. Each of the thus obtained solder balls of Examples 1 to 7 and Comparative Examples 1 to 6 was heated with a drying apparatus in the air at 60° C. for 30 minutes to concentrate As on a surface side of the solder ball.

The content of each component shown in tables below indicates mass percentage of the component with respect to the total mass of the metal solder material. Contents of elements excluding Sn are the amounts actually weighed for mixing, and the content of Sn is an amount mixed as the balance to make the sum 100% by mass. In each of Tables 2 to 7 below, Sn used in each metal solder material is a 3N material, and contains an incidental impurity.

Each of the solder balls of Examples 1 to 7 and Comparative Examples 1 to 6 was subjected to the evaluations of (1) the presence of an As-enriched layer, (5) the inhibition of the yellowing color change, and (3) the solder wettability as described above. Results of the evaluations are shown in the following table:

TABLE 2

|  |  | Example | | | | | | |
|---|---|---|---|---|---|---|---|---|
|  |  | 1 | 2 | 3 | 4 | 5 | 6 | 7 |
| Element | Sn (wt.%) | 99.9960 | 99.9930 | 99.9900 | 99.9850 | 99.9800 | 99.9700 | 99.9680 |
|  | As (wt.%) | 0.0040 | 0.0070 | 0.0100 | 0.0150 | 0.0200 | 0.0300 | 0.0320 |
|  | Total (wt.%) | 100 | 100 | 100 | 100 | 100 | 100 | 100 |
| Evaluation | Presence of As-Enriched Layer | ○ | ○ | ○ | ○ | ○ | ○ | ○ |
|  | Inhibition of Yellowing Color Change | ○ | ⊙⊙ | ⊙⊙ | ⊙⊙ | ⊙⊙ | ⊙⊙ | ⊙⊙ |
|  | Solder Wettability | ⊙⊙ | ⊙⊙ | ⊙⊙ | ⊙⊙ | ⊙⊙ | ○ | ○ |
|  | Comprehensive Evaluation | ○ | ○ | ○ | ○ | ○ | ○ | ○ |

|  |  | Comparable Example | | | | | |
|---|---|---|---|---|---|---|---|
|  |  | 1 | 2 | 3 | 4 | 5 | 6 |
| Element | Sn (wt.%) | 100 | 99.9999 | 99.9990 | 99.9980 | 99.9975 | 99.9500 |
|  | As (wt.%) | 0 | 0.0001 | 0.0010 | 0.0020 | 0.0025 | 0.0500 |
|  | Total (wt.%) | 100 | 100 | 100 | 100 | 100 | 100 |
| Evaluation | Presence of As-Enriched Layer | — | x | x | x | x | ○ |
|  | Inhibition of Yellowing Color Change | x | x | x | x | x | ○ |
|  | Solder Wettability | ⊙⊙ | ⊙⊙ | ⊙⊙ | ⊙⊙ | ⊙⊙ | x |
|  | Comprehensive Evaluation | x | x | x | x | x | x |

*"—" means that the evaluation was not performed.

According to the results shown in the table, with respect to a solder containing Sn in Examples 1 to 7, in which the content of As was 40 to 320 ppm by mass (0.0040 to 0.0320% by mass), an As-enriched layer was formed, and the inhibition of the yellowing color change and the solder wettability were both very good or good. In particular, in Examples 2 to 5, in which the content of As was 70 to 200 ppm by mass (0.0070 to 0.0200% by mass), the inhibition of the yellowing color change and the solder wettability were both very good.

On the other hand, in Comparative Example 1, in which As was not contained, although the solder wettability was very good, the yellowing color change could not be inhibited. In Comparative Examples 2 to 5, in which the content of As was less than 40 ppm by mass (0.0040% by mass), although the solder wettability was very good, an As-enriched layer was not formed, and the yellowing color change could not be inhibited. In Comparative Example 6, in which the content of As was over 320 ppm by mass (0.0320% by mass), an As-enriched layer was not formed, and although the inhibition of the yellowing color change was good, adequate solder wettability could not be obtained.

Examples 8 to 14 and Comparative Examples 7 to 12

Solder balls of Examples 8 to 14 and Comparative Examples 7 to 12 were produced in the same manner as in Examples 1 to 7 and Comparative Examples 1 to 6 except that compositions shown in the following table were employed.

Each of the solder balls of Examples 8 to 14 and Comparative Examples 7 to 12 was subjected to the evaluations of (1) the presence of an As-enriched layer, (5) the inhibition of the yellowing color change, and (3) the solder wettability as described above. Results of the evaluations are shown in the following table.

TABLE 3

|  |  | Example | | | | | | |
|---|---|---|---|---|---|---|---|---|
|  |  | 8 | 9 | 10 | 11 | 12 | 13 | 14 |
| Element | Sn (wt.%) | 96.4960 | 96.4930 | 96.4900 | 96.4850 | 96.4800 | 96.4700 | 96.4680 |
|  | As (wt. %) | 0.0040 | 0.0070 | 0.0100 | 0.0150 | 0.0200 | 0.0300 | 0.0320 |
|  | Ag (wt. %) | 3 | 3 | 3 | 3 | 3 | 3 | 3 |
|  | Cu (wt. %) | 0.5 | 0.5 | 0.5 | 0.5 | 0.5 | 0.5 | 0.5 |
|  | Total (wt. %) | 100 | 100 | 100 | 100 | 100 | 100 | 100 |
| Evaluation | Presence of As-Enriched Layer | ○ | ○ | ○ | ○ | ○ | ○ | ○ |
|  | Inhibition of Yellowing Color Change | ○ | ○○ | ○○ | ○○ | ○○ | ○○ | ○○ |
|  | Solder Wettability | ○○ | ○○ | ○○ | ○○ | ○○ | ○ | ○ |
|  | Comprehensive Evaluation | ○ | ○ | ○ | ○ | ○ | ○ | ○ |

|  |  | Comparable Example | | | | | |
|---|---|---|---|---|---|---|---|
|  |  | 7 | 8 | 9 | 10 | 11 | 12 |
| Element | Sn (wt.%) | 96.5 | 96.4999 | 96.4990 | 96.4980 | 96.4975 | 96.4500 |
|  | As (wt. %) | 0 | 0.0001 | 0.0010 | 0.0020 | 0.0025 | 0.0500 |
|  | Ag (wt. %) | 3 | 3 | 3 | 3 | 3 | 3 |
|  | Cu (wt. %) | 0.5 | 0.5 | 0.5 | 0.5 | 0.5 | 0.5 |
|  | Total (wt. %) | 100 | 100 | 100 | 100 | 100 | 100 |
| Evaluation | Presence of As-Enriched Layer | — | x | x | x | x | ○ |
|  | Inhibition of Yellowing Color Change | x | x | x | x | x | ○○ |
|  | Solder Wettability | ○○ | ○○ | ○○ | ○○ | ○○ | x |
|  | Comprehensive Evaluation | x | x | x | x | x | x |

*"—" means that the evaluation was not performed.

According to the results shown in Table 3, also with respect to a solder containing a Sn—Ag—Cu alloy (Ag content: 3% by mass, Cu content: 0.5% by mass) in Examples 8 to 14, in which the content of As was 40 to 320 ppm by mass (0.0040 to 0.0320% by mass), an As-enriched layer was formed, and the inhibition of the yellowing color change and the solder wettability were both very good or good as with Examples 1 to 7. In particular, in Examples 9 to 12, in which the content of As was 70 to 200 ppm by mass (0.0070 to 0.0200% by mass), the inhibition of the yellowing color change and the solder wettability were both very good.

On the other hand, also with respect to the solder containing a Sn—Ag—Cu alloy (Ag content: 3% by mass, Cu content: 0.5% by mass) in Comparative Example 7, in which As was not contained, although the solder wettability was very good, the yellowing color change could not be inhibited as with Comparative Example 1. In Comparative Examples 8 to 11, in which the content of As was less than 40 ppm by mass (0.0040% by mass), although the solder wettability was very good, an As-enriched layer was not formed, and the yellowing color change could not be inhibited as with Comparative Examples 2 to 5. In Comparative Example 12, in which the content of As was over 320 ppm by mass (0.0320% by mass), although an As-enriched layer was formed and the inhibition of the yellowing color change was very good, adequate solder wettability could not be obtained.

Examples 15 to 21 and Comparative Examples 13 to 18

Solder balls of Examples 15 to 21 and Comparative Examples 13 to 18 were produced in the same manner as in Examples 1 to 7 and Comparative Examples 1 to 6 except that compositions shown in the following table were employed.

Each of the solder balls of Examples 15 to 21 and Comparative Examples 13 to 18 was subjected to the evaluations of (1) the presence of an As-enriched layer, (5) the inhibition of the yellowing color change, and (3) the solder wettability as described above. Results of the evaluations are shown in the following table.

TABLE 4

| | | Example | | | | | | |
|---|---|---|---|---|---|---|---|---|
| | | 15 | 16 | 17 | 18 | 19 | 20 | 21 |
| Element | Sn (wt. %) | 98.4960 | 98.4930 | 98.4900 | 98.4850 | 98.4800 | 98.4700 | 98.4680 |
| | As (wt. %) | 0.0040 | 0.0070 | 0.0100 | 0.0150 | 0.0200 | 0.0300 | 0.0320 |
| | Ag (wt. %) | 1 | 1 | 1 | 1 | 1 | 1 | 1 |
| | Cu (wt. %) | 0.5 | 0.5 | 0.5 | 0.5 | 0.5 | 0.5 | 0.5 |
| | Total (wt. %) | 100 | 100 | 100 | 100 | 100 | 100 | 100 |
| Evaluation | Presence of As-Enriched Layer | ○ | ○ | ○ | ○ | ○ | ○ | ○ |
| | Inhibition of Yellowing Color Change | ○ | ○○ | ○○ | ○○ | ○○ | ○○ | ○○ |
| | Solder Wettability | ○○ | ○○ | ○○ | ○○ | ○○ | ○ | ○ |
| | Comprehensive Evaluation | ○ | ○ | ○ | ○ | ○ | ○ | ○ |

| | | Comparable Example | | | | | |
|---|---|---|---|---|---|---|---|
| | | 13 | 14 | 15 | 16 | 17 | 18 |
| Element | Sn (wt. %) | 98.5 | 98.4999 | 98.4990 | 98.4980 | 98.4975 | 98.4500 |
| | As (wt. %) | 0 | 0.0001 | 0.0010 | 0.0020 | 0.0025 | 0.0500 |
| | Ag (wt. %) | 1 | 1 | 1 | 1 | 1 | 1 |
| | Cu (wt. %) | 0.5 | 0.5 | 0.5 | 0.5 | 0.5 | 0.5 |
| | Total (wt. %) | 100 | 100 | 100 | 100 | 100 | 100 |
| Evaluation | Presence of As-Enriched Layer | — | x | x | x | x | ○ |
| | Inhibition of Yellowing Color Change | x | x | x | x | x | ○○ |
| | Solder Wettability | ○○ | ○○ | ○○ | ○○ | ○○ | x |
| | Comprehensive Evaluation | x | x | x | x | x | x |

*"—" means that the evaluation was not performed.

According to the results shown in the table, also with respect to a solder containing a Sn—Ag—Cu alloy (Ag content: 1% by mass, Cu content: 0.5% by mass) in Examples 15 to 21, in which the content of As was 40 to 320 ppm by mass (0.0040 to 0.0320% by mass), an As-enriched layer was formed, and the inhibition of the yellowing color change and the solder wettability were both very good or good in the same manner as in Examples 1 to 7. In particular, in Examples 16 to 19 in which the content of As was 70 to 200 ppm by mass (0.0070 to 0.0200% by mass), the inhibition of the yellowing color change and the solder wettability were both very good.

On the other hand, also with respect to the solder containing a Sn—Ag—Cu alloy (Ag content: 1% by mass, Cu content: 0.5% by mass) in Comparative Example 13, in which As was not contained, although the solder wettability was very good, the yellowing color change could not be inhibited in the same manner as in Comparative Example 1. In Comparative Examples 14 to 17, in which the content of As was less than 40 ppm by mass (0.0040% by mass), although the solder wettability was very good, an As-enriched layer was not formed, and the yellowing color change could not be inhibited in the same manner as in Comparative Examples 2 to 5. In Comparative Example 18, in which the content of As was over 320 ppm by mass (0.0320% by mass), although an As-enriched layer was formed and the inhibition of the yellowing color change was very good, adequate solder wettability could not be obtained.

Examples 22 to 29 and Comparative Examples 19 to 26

Solder balls of Examples 22 to 29 and Comparative Examples 19 to 26 were produced in the same manner as in Examples 1 to 7 and Comparative Examples 1 to 6 except that compositions shown in the following table were employed.

Each of the solder balls of Examples 22 to 29 and Comparative Examples 19 to 26 was subjected to the evaluations of (1) the presence of an As-enriched layer, (5) the inhibition of the yellowing color change, and (3) the solder wettability as described above. Results of the evaluations are shown in the following table.

TABLE 5

|  |  | Example | | | | | | | |
|---|---|---|---|---|---|---|---|---|---|
|  |  | 22 | 23 | 24 | 25 | 26 | 27 | 28 | 29 |
| Element | Sn (wt .%) | 95.4960 | 95.4930 | 95.4900 | 95.4850 | 95.4800 | 95.4700 | 95.4680 | 94.9850 |
|  | As (wt. %) | 0.0040 | 0.0070 | 0.0100 | 0.0150 | 0.0200 | 0.0300 | 0.0320 | 0.0150 |
|  | Ag (wt. %) | 4 | 4 | 4 | 4 | 4 | 4 | 4 | 4 |
|  | Cu (wt. %) | 0.5 | 0.5 | 0.5 | 0.5 | 0.5 | 0.5 | 0.5 | 1 |
|  | Total (wt. %) | 100 | 100 | 100 | 100 | 100 | 100 | 100 | 100 |
| Evaluation | Presence of As-Enriched Layer | ○ | ○ | ○ | ○ | ○ | ○ | ○ | ○ |
|  | Inhibition of Yellowing Color Change | ○ | ○○ | ○○ | ○○ | ○○ | ○○ | ○○ | ○○ |
|  | Solder Wettability | ○○ | ○○ | ○○ | ○○ | ○○ | ○ | ○ | ○○ |
|  | Comprehensive Evaluation | ○ | ○ | ○ | ○ | ○ | ○ | ○ | ○ |

|  |  | Comparative Example | | | | | | | |
|---|---|---|---|---|---|---|---|---|---|
|  |  | 19 | 20 | 21 | 22 | 23 | 24 | 25 | 26 |
| Element | Sn (wt .%) | 95.5 | 95.4999 | 95.4990 | 95.4980 | 95.4975 | 95.4500 | 95.0000 | 94.9500 |
|  | As (wt. %) | 0 | 0.0001 | 0.0010 | 0.0020 | 0.0025 | 0.0500 | 0 | 0.0500 |
|  | Ag (wt. %) | 4 | 4 | 4 | 4 | 4 | 4 | 4 | 4 |
|  | Cu (wt. %) | 0.5 | 0.5 | 0.5 | 0.5 | 0.5 | 0.5 | 1 | 1 |
|  | Total (wt. %) | 100 | 100 | 100 | 100 | 100 | 100 | 100 | 100 |
| Evaluation | Presence of As-Enriched Layer | — | x | x | x | x | ○ | — | ○ |
|  | Inhibition of Yellowing Color Change | x | x | x | x | x | ○○ | x | ○○ |
|  | Solder Wettability | ○○ | ○○ | ○○ | ○○ | ○○ | x | ○○ | x |
|  | Comprehensive Evaluation | x | x | x | x | x | x | x | x |

*"—" means that the evaluation was not performed.

According to the results shown in the table, also with respect to a solder containing a Sn—Ag—Cu alloy (Ag content: 4% by mass, Cu content: 0.5% by mass) in Examples 22 to 28, in which the content of As was 40 to 320 ppm by mass (0.0040 to 0.0320% by mass), an As-enriched layer was formed, and the inhibition of the yellowing color change and the solder wettability were both very good or good in the same manner as in Examples 1 to 7. In particular, in Examples 23 to 26 in which the content of As was 70 to 200 ppm by mass (0.0070 to 0.0200% by mass), the inhibition of the yellowing color change and the solder wettability were both very good.

Besides, also with respect to a solder containing a Sn—Ag—Cu alloy in which the Ag content and the Cu content were respectively changed to 4% by mass and 1% by mass in Example 29, in which the content of As was 40 to 320 ppm by mass (0.0040 to 0.0320% by mass), good evaluation results were obtained as with Examples 22 to 28. In Example 29, the inhibition of the yellowing color change and the solder wettability were both very good in the same manner as in Examples 23 to 26.

On the other hand, also with respect to the solder containing a Sn—Ag—Cu alloy (Ag content: 4% by mass, Cu content: 0.5% by mass) in Comparative Example 19, in which As was not contained, although the solder wettability was very good, the yellowing color change could not be inhibited, as with Comparative Example 1. In Comparative Examples 20 to 23, in which the content of As was less than 40 ppm by mass (0.0040% by mass), although the solder wettability was very good, an As-enriched layer was not formed, and the yellowing color change could not be inhibited, as with Comparative Examples 2 to 5. In Comparative Example 24, in which the content of As was over 320 ppm by mass (0.0320% by mass), an As-enriched layer was formed and the inhibition of the yellowing color change was very good; however, adequate solder wettability could not be obtained.

Besides, also with respect to the solder containing a Sn—Ag—Cu alloy in which the Ag content and the Cu content were respectively changed to 4% by mass and 1% by mass, evaluation results were inadequate in Comparative Example 25, in which As was not contained as with Comparative Example 19, and in Comparative Example 26, in which the content of As was over 320 ppm by mass (0.0320% by mass) as with Comparative Example 23.

Examples 30 to 37 and Comparative Examples 27 to 34

Solder balls of Examples 30 to 37 and Comparative Examples 27 to 34 were produced in the same manner as in Examples 1 to 7 and Comparative Examples 1 to 6 except that compositions shown in the following table were employed.

Each of the solder balls of Examples 30 to 37 and Comparative Examples 27 to 34 was subjected to the evaluations of (1) the presence of an As-enriched layer, (5) the inhibition of the yellowing color change, and (3) the solder wettability as described above. Results of the evaluations are shown in the following table.

TABLE 6

| | | Example | | | | | | | |
|---|---|---|---|---|---|---|---|---|---|
| | | 30 | 31 | 32 | 33 | 34 | 35 | 36 | 37 |
| Element | Sn (wt.%) | 96.4960 | 96.4930 | 96.4900 | 96.4850 | 96.4800 | 96.4700 | 96.4680 | 96.4850 |
| | As (wt.%) | 0.0040 | 0.0070 | 0.0100 | 0.0150 | 0.0200 | 0.0300 | 0.0320 | 0.0150 |
| | Ag (wt.%) | 3 | 3 | 3 | 3 | 3 | 3 | 3 | 3 |
| | Cu (wt.%) | 0.5 | 0.5 | 0.5 | 0.5 | 0.5 | 0.5 | 0.5 | 0.5 |
| | Ni (wt.%) | 0.05 | 0.05 | 0.05 | 0.05 | 0.05 | 0.05 | 0.05 | 0.15 |
| | Co (wt.%) | 0.01 | 0.01 | 0.01 | 0.01 | 0.01 | 0.01 | 0.01 | 0.15 |
| | Total (wt.%) | 100 | 100 | 100 | 100 | 100 | 100 | 100 | 100 |
| Evaluation | Presence of As-Enriched Layer | ○ | ○ | ○ | ○ | ○ | ○ | ○ | ○ |
| | Inhibition of Yellowing Color Change | ○ | ○○ | ○○ | ○○ | ○○ | ○○ | ○○ | ○○ |
| | Solder Wettability | ○○ | ○○ | ○○ | ○○ | ○○ | ○ | ○ | ○○ |
| | Comprehensive Evaluation | ○ | ○ | ○ | ○ | ○ | ○ | ○ | ○ |

| | | Comparative Example | | | | | | | |
|---|---|---|---|---|---|---|---|---|---|
| | | 27 | 28 | 29 | 30 | 31 | 32 | 33 | 34 |
| Element | Sn (wt.%) | 96.5000 | 96.4999 | 96.4990 | 96.4980 | 96.4975 | 96.4500 | 96.0000 | 96.4500 |
| | As (wt.%) | 0 | 0.0001 | 0.0010 | 0.0020 | 0.0025 | 0.0500 | 0 | 0.0500 |
| | Ag (wt.%) | 3 | 3 | 3 | 3 | 3 | 3 | 3 | 3 |
| | Cu (wt.%) | 0.5 | 0.5 | 0.5 | 0.5 | 0.5 | 0.5 | 0.5 | 0.5 |
| | Ni (wt.%) | 0.05 | 0.05 | 0.05 | 0.05 | 0.05 | 0.05 | 0.15 | 0.15 |
| | Co (wt.%) | 0.01 | 0.01 | 0.01 | 0.01 | 0.01 | 0.01 | 0.015 | 0.015 |
| | Total (wt.%) | 100 | 100 | 100 | 100 | 100 | 100 | 100 | 100 |
| Evaluation | Presence of As-Enriched Layer | — | x | x | x | x | ○ | — | ○ |
| | Inhibition of Yellowing Color Change | x | x | x | x | x | ○○ | x | ○○ |

TABLE 6-continued

| | | | | | | | | |
|---|---|---|---|---|---|---|---|---|
| Solder Wettability | ∘∘ | ∘∘ | ∘∘ | ∘∘ | ∘∘ | x | ∘∘ | x |
| Comprehensive Evaluation | x | x | x | x | x | x | x | x |

*"—" means that the evaluation was not performed.

According to the results shown in the table, also with respect to a solder containing a Sn—Ag—Cu—Ni—Co alloy (Ag content: 3% by mass, Cu content: 0.5% by mass, Ni content: 0.05% by mass, Co content: 0.01% by mass) in Examples 30 to 36, in which the content of As was 40 to 320 ppm by mass (0.0040 to 0.0320% by mass), an As-enriched layer was formed, and the inhibition of the yellowing color change and the solder wettability were both very good or good as with Examples 1 to 7. In particular, in Examples 31 to 34, in which the content of As was 70 to 200 ppm by mass (0.0070 to 0.0200% by mass), the inhibition of the yellowing color change and the solder wettability were both very good.

Besides, also with respect to a solder containing a Sn—Ag—Cu—Ni—Co alloy in which the Ni content and the Co content were respectively changed to 0.15% by mass and 0.015% by mass in Example 37, in which the content of As was 40 to 320 ppm by mass (0.0040 to 0.0320% by mass), good evaluation results were obtained as with Examples 30 to 36. In Example 37, the inhibition of the yellowing color change and the solder wettability were both very good as with Examples 31 to 34.

On the other hand, also with respect to the solder containing a Sn—Ag—Cu—Ni—Co alloy (Ag content: 3% by mass, Cu content: 0.5% by mass, Ni content: 0.05% by mass, Co content: 0.01% by mass) in Comparative Example 27, in which As was not contained, although the solder wettability was very good, the yellowing color change could not be inhibited, as with Comparative Example 1. In Comparative Examples 28 to 31, in which the content of As was less than 40 ppm by mass (0.0040% by mass), although the solder wettability was very good, an As-enriched layer was not formed and the yellowing color change could not be inhibited, as with Comparative Examples 2 to 5. In Comparative Example 32, in which the content of As was over 320 ppm by mass (0.0320% by mass), an As-enriched layer was formed and the inhibition of the yellowing color change was very good; however, adequate solder wettability could not be obtained.

Besides, also with respect to the solder containing a Sn—Ag—Cu—Ni—Co alloy in which the Ni content and the Co content were respectively changed to 0.15% by mass and 0.015% by mass, evaluation results were inadequate in Comparative Example 33, in which As was not contained as with Comparative Example 27, and in Comparative Example 34, in which the content of As was over 320 ppm by mass (0.0320% by mass) as with Comparative Example 32.

Examples 38 to 44 and Comparative Examples 35 to 40

Solder balls of Examples 38 to 44 and Comparative Examples 35 to 40 were produced in the same manner as in Examples 1 to 7 and Comparative Examples 1 to 6 except that compositions shown in the following table were employed.

Each of the solder balls of Examples 38 to 44 and Comparative Examples 35 to 40 was subjected to the evaluations of (1) the presence of an As-enriched layer, (5) the inhibition of the yellowing color change, and (3) the solder wettability as described above. Results of the evaluations are shown in the following table.

TABLE 7

| | | Example | | | | | | |
|---|---|---|---|---|---|---|---|---|
| | | 38 | 39 | 40 | 41 | 42 | 43 | 44 |
| Element | Sn (wt .%) | 47.9960 | 47.9930 | 47.9900 | 47.9850 | 47.9800 | 47.9700 | 47.9680 |
| | As (wt. %) | 0.0040 | 0.0070 | 0.0100 | 0.0150 | 0.0200 | 0.0300 | 0.0320 |
| | In (wt. %) | 52 | 52 | 52 | 52 | 52 | 52 | 52 |
| | Total (wt. %) | 100 | 100 | 100 | 100 | 100 | 100 | 100 |
| Evaluation | Presence of As-Enriched Layer | ∘ | ∘ | ∘ | ∘ | ∘ | ∘ | ∘ |
| | Inhibition of Yellowing Color Change | ∘ | ∘∘ | ∘∘ | ∘∘ | ∘∘ | ∘∘ | ∘∘ |
| | Solder Wettability | ∘∘ | ∘∘ | ∘∘ | ∘∘ | ∘∘ | ∘ | ∘ |
| | Comprehensive Evaluation | ∘ | ∘ | ∘ | ∘ | ∘ | ∘ | ∘ |

| | | Comparable Example | | | | | |
|---|---|---|---|---|---|---|---|
| | | 35 | 36 | 37 | 38 | 39 | 40 |
| Element | Sn (wt .%) | 48 | 47.9999 | 47.9990 | 47.9980 | 47.9975 | 47.9500 |
| | As (wt. %) | 0 | 0.0001 | 0.0010 | 0.0020 | 0.0025 | 0.0500 |
| | In (wt. %) | 52 | 52 | 52 | 52 | 52 | 52 |
| | Total (wt. %) | 100 | 100 | 100 | 100 | 100 | 100 |
| Evaluation | Presence of As-Enriched Layer | — | x | x | x | x | ∘ |

TABLE 7-continued

|  | | | | | | |
|---|---|---|---|---|---|---|
| Inhibition of Yellowing Color Change | x | x | x | x | x | ∘∘ |
| Solder Wettability | ∘∘ | ∘∘ | ∘∘ | ∘∘ | ∘∘ | x |
| Comprehensive Evaluation | x | x | x | x | x | x |

*"—" means that the evaluation was not performed.

According to the results shown in the table, also with respect to a solder containing a Sn—In alloy in Examples 38 to 44, in which the content of As was 40 to 320 ppm by mass (0.0040 to 0.0320% by mass), an As-enriched layer was formed, and the inhibition of the yellowing color change and the solder wettability were both very good or good as with Examples 1 to 7. In particular, in Examples 39 to 42, in which the content of As was 70 to 200 ppm by mass (0.0070 to 0.0200% by mass), the inhibition of the yellowing color change and the solder wettability were both very good.

On the other hand, also with respect to the solder containing a Sn—In alloy in Comparative Example 35, in which As was not contained, although the solder wettability was very good, the yellowing color change could not be inhibited as with Comparative Example 1. In Comparative Examples 36 to 39, in which the content of As was less than 40 ppm by mass (0.0040% by mass), although the solder wettability was very good, an As-enriched layer was not formed, and the yellowing color change could not be inhibited as with Comparative Examples 2 to 5. In Comparative Example 40, in which the content of As was over 320 ppm by mass (0.0320% by mass), although an As-enriched layer was formed and the inhibition of the yellowing color change was very good, adequate solder wettability could not be obtained.

Besides, a solder joint can be produced by processing each of the solder balls of Examples 1 to 44 by a method common in the art. In the solder balls of Examples 1 to 44, in which the content of As was 40 to 320 ppm by mass (0.0040 to 0.0320% by mass), an As-enriched layer was formed, and the inhibition of the yellowing color change and the solder wettability were both excellent. Thus, the solder balls of Examples 1 to 44 are difficult to change in color even when heated, and therefore, solder joints obtained from these solder balls are also difficult to change in color.

II. Sn—As—Bi-Containing Solder

Examples II-A1 to II-A35 and Comparative Examples II-A1 to II-A12

Sn, As and Bi were weighed to satisfy the contents of As and Bi shown in Table IIA below with a balance of Sn (balance for making the sum of Sn, As and Bi 100% by mass), and were melt mixed, and the resultant was centrifugally sprayed in an Ar atmosphere to prepare a powder (average particle size: 21 μm, classified as No. 5 of the particle size classification (Table 2) of JIS Z3284-1:2004). The thus obtained powder was heated with a drying apparatus in the air at 60° C. for 30 minutes to obtain a solder powder of each of examples and comparative examples. In Comparative Examples II-A1 to II-A6, however, a heat treatment was not performed but a powder as is obtained by the centrifugal spraying was used as a solder powder.

The content of As is shown in ppm by mass with respect to the total mass of the solder material and the content of Bi is shown in % by mass with respect to the total mass of the solder material in the following tables.

A 3N material containing an incidental impurity was used as Sn.

Results of the evaluations of (1) the presence of an As-enriched layer, (2) the inhibition of viscosity increase, (3) the solder wettability, and (4) the reliability of the solder powders of the examples and comparative examples are shown in the following tables.

TABLE 8

Table IIA-1

| | | Comp. Ex. II-A1 | Comp. Ex. II-A2 | Comp. Ex. II-A3 | Comp. Ex. II-A4 | Comp. Ex. II-A5 | Comp. Ex. II-A6 | Ex. II-A1 | Ex. II-A2 |
|---|---|---|---|---|---|---|---|---|---|
| Composition | As (mass ppm) | 0 | 10 | 20 | 25 | 25 | 40 | 40 | 40 |
| | Bi (mass %) | 0.000 | 0.000 | 0.000 | 0.000 | 0.002 | 0.000 | 0.010 | 1.000 |
| Evaluation | Presence of As-Enriched Layer | x | x | x | x | x | x | ∘ | ∘ |
| | Inhibition of Viscosity Increase | x | x | x | x | x | x | ∘ | ∘ |
| | Solder Wettability | ∘ | ∘ | ∘ | ∘ | ∘ | ∘ | ∘ | ∘ |
| | Reliability (ΔT < 10° C.) | ∘ | ∘ | ∘ | ∘ | ∘ | ∘ | ∘ | ∘ |
| | Comprehensive Evaluation | x | x | x | x | x | x | ∘ | ∘ |

TABLE 8-continued

Table IIA-1

| | | Comp. Ex. II-A7 | Ex. II-A3 | Ex. II-A4 | Ex. II-A5 | Ex. II-A6 | Ex. II-A7 | Ex. II-A8 | Ex. II-A9 |
|---|---|---|---|---|---|---|---|---|---|
| Composition | As (mass ppm) | 40 | 50 | 60 | 70 | 80 | 90 | 100 | 100 |
| | Bi (mass %) | 5.000 | 0.010 | 0.010 | 0.010 | 0.010 | 0.010 | 0.002 | 0.005 |
| Evaluation | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability (ΔT < 10° C.) | x | ○ | ○ | ○ | ○ | ○ | ○ | ○ |
| | Comprehensive Evaluation | x | ○ | ○ | ○ | ○ | ○ | ○ | ○ |

| | | Ex. II-A10 | Ex. II-A11 | Ex. II-A12 | Ex. II-A13 | Ex. II-A14 | Comp. Ex. II-A8 | Ex. II-A15 | Ex. II-A16 |
|---|---|---|---|---|---|---|---|---|---|
| Composition | As (mass ppm) | 100 | 100 | 100 | 100 | 100 | 100 | 150 | 150 |
| | Bi (mass %) | 0.010 | 0.050 | 0.100 | 0.500 | 1.000 | 5.000 | 0.002 | 0.005 |
| Evaluation | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability (ΔT < 10° C.) | ○ | ○ | ○ | ○ | ○ | x | ○ | ○ |
| | Comprehensive Evaluation | ○ | ○ | ○ | ○ | ○ | x | ○ | ○ |

TABLE 9

Table IIA-2

| | | Ex. II-A17 | Ex. II-A18 | Ex. II-A19 | Ex. II-A20 | Ex. II-A21 | Comp. Ex. II-A9 | Ex. II-A22 | Ex. II-A23 |
|---|---|---|---|---|---|---|---|---|---|
| Composition | As (mass ppm) | 150 | 150 | 150 | 150 | 150 | 150 | 200 | 200 |
| | Bi (mass %) | 0.010 | 0.050 | 0.100 | 0.500 | 1.000 | 5.000 | 0.002 | 0.005 |
| Evaluation | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability (ΔT < 10° C.) | ○ | ○ | ○ | ○ | ○ | x | ○ | ○ |
| | Comprehensive Evaluation | ○ | ○ | ○ | ○ | ○ | x | ○ | ○ |

| | | Ex. II-A24 | Ex. II-A25 | Ex. II-A26 | Ex. II-A27 | Ex. II-A28 | Comp. Ex. II-A10 | Ex. II-A29 | Ex. II-A30 |
|---|---|---|---|---|---|---|---|---|---|
| Composition | As (mass ppm) | 200 | 200 | 200 | 200 | 200 | 200 | 250 | 250 |
| | Bi (mass %) | 0.010 | 0.050 | 0.100 | 0.500 | 1.000 | 5.000 | 0.002 | 0.005 |
| Evaluation | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability (ΔT < 10° C.) | ○ | ○ | ○ | ○ | ○ | x | ○ | ○ |
| | Comprehensive Evaluation | ○ | ○ | ○ | ○ | ○ | x | ○ | ○ |

| | | Ex. II-A31 | Ex. II-A32 | Ex II-A33 | Ex. II-A34 | Ex. II-A35 | Comp. Ex. II-A11 | Comp. Ex. II-A12 |
|---|---|---|---|---|---|---|---|---|
| Composition | As (mass ppm) | 250 | 250 | 250 | 250 | 250 | 250 | 500 |
| | Bi (mass %) | 0.010 | 0.050 | 0.100 | 0.500 | 1.000 | 5.000 | 0.000 |
| Evaluation | Presence of As-Enriched Layer | ○ | ○ | ○ | ○ | ○ | ○ | ○ |
| | Inhibition of Viscosity Increase | ○ | ○ | ○ | ○ | ○ | ○ | ○ |
| | Solder Wettability | ○ | ○ | ○ | ○ | ○ | ○ | x |

TABLE 9-continued

Table IIA-2

| | | | | | | | |
|---|---|---|---|---|---|---|---|
| Reliability (ΔT < 10° C.) | ○ | ○ | ○ | ○ | ○ | x | ○ |
| Comprehensive Evaluation | v | ○ | ○ | ○ | ○ | x | x |

Examples II-B1 to II-B35 and Comparative Examples II-B1 to II-B12

Sn, As, Bi and Cu were weighed to satisfy a content of Cu of 0.7% by mass and the contents of As and Bi shown in Table IIA below with a balance of Sn (balance for making the sum of Sn, As, Bi and Cu 100% by mass), and were melt mixed, and the resultant was centrifugally sprayed in an Ar atmosphere to prepare a powder (average particle size: 21 μm, classified as No. 5 of the particle size classification). The thus obtained powder was heated with a drying apparatus in the air at 60° C. for 30 minutes to obtain a solder powder of each of examples and comparative examples. In Comparative Examples II-B1 to II-B6, however, a heat treatment was not performed but a powder as is obtained by the centrifugal spraying was used as a solder powder.

The content of As is shown in ppm by mass with respect to the total mass of the solder material and the contents of Bi and Cu are shown in % by mass with respect to the total mass of the solder material in the following tables.

A 3N material containing an incidental impurity was used as Sn.

Results of the evaluations of (1) the presence of an As-enriched layer, (2) the inhibition of viscosity increase, (3) the solder wettability, and (4) the reliability of the solder powders of the examples and comparative examples are shown in the following tables.

TABLE 10

Table IIB-1 0% Ag and 0.7% Cu added

| | | Comp. Ex. II-B1 | Comp. Ex. II-B2 | Comp. Ex. II-B3 | Comp. Ex. II-B4 | Comp. Ex. II-B5 | Comp. Ex. II-B6 | Ex. II-B1 | Ex. II-B2 |
|---|---|---|---|---|---|---|---|---|---|
| Composition | As (mass ppm) | 0 | 10 | 20 | 25 | 25 | 40 | 40 | 40 |
| | Bi (mass %) | 0.000 | 0.000 | 0.000 | 0.000 | 0.002 | 0.000 | 0.010 | 1.000 |
| | Cu (mass %) | 0.700 | 0.700 | 0.700 | 0.700 | 0.700 | 0.700 | 0.700 | 0.700 |
| Evaluation | Presence of As-Enriched Layer | x | x | x | x | x | x | ○ | ○ |
| | Inhibition of Viscosity Increase | x | x | x | x | x | x | ○ | ○ |
| | Solder Wettability | ○ | ○ | ○ | ○ | ○ | ○ | ○ | ○ |
| | Reliability (ΔT < 10° C.) | ○ | ○ | ○ | ○ | ○ | ○ | ○ | ○ |
| | Comprehensive Evaluation | x | x | x | x | x | x | ○ | ○ |

| | | Comp. Ex. II-B7 | Ex. II-B3 | Ex. II-B4 | Ex. II-B5 | Ex. II-B6 | Comp. Ex. II-B7 | Ex. II-B8 | Ex. II-B9 |
|---|---|---|---|---|---|---|---|---|---|
| Composition | As (mass ppm) | 40 | 50 | 60 | 70 | 80 | 90 | 100 | 100 |
| | Bi (mass %) | 5.000 | 0.010 | 0.010 | 0.010 | 0.010 | 0.010 | 0.002 | 0.005 |
| | Cu (mass %) | 0.700 | 0.700 | 0.700 | 0.700 | 0.700 | 0.700 | 0.700 | 0.700 |
| Evaluation | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability (ΔT < 10° C.) | x | ○ | ○ | ○ | ○ | ○ | ○ | ○ |
| | Comprehensive Evaluation | x | ○ | ○ | ○ | ○ | ○ | ○ | ○ |

| | | Ex. II-B10 | Ex. II-B11 | Ex II-B12 | Ex. II-B13 | Ex. II-B14 | Comp. Ex. II-B8 | Ex. II-B15 | Ex. II-B16 |
|---|---|---|---|---|---|---|---|---|---|
| Composition | As (mass ppm) | 100 | 100 | 100 | 100 | 100 | 100 | 150 | 150 |
| | Bi (mass %) | 0.010 | 0.050 | 0.100 | 0.500 | 1.000 | 5.000 | 0.002 | 0.005 |
| | Cu (mass %) | 0.700 | 0.700 | 0.700 | 0.700 | 0.700 | 0.700 | 0.700 | 0.700 |
| Evaluation | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability (ΔT < 10° C.) | ○ | ○ | ○ | ○ | ○ | x | ○ | ○ |
| | Comprehensive Evaluation | ○ | ○ | ○ | ○ | ○ | x | ○ | ○ |

TABLE 11

Table IIB-2 0% Ag and 0.7% Cu added

|  |  | Ex. II-B17 | Ex. II-B18 | Ex. II-B19 | Ex. II-B20 | Ex. II-B21 | Comp. Ex. II-B9 | Ex. II-B22 | Ex. II-B23 |
|---|---|---|---|---|---|---|---|---|---|
| Composition | As (mass ppm) | 150 | 150 | 150 | 150 | 150 | 150 | 200 | 200 |
|  | Bi (mass %) | 0.010 | 0.050 | 0.100 | 0.500 | 1.000 | 5.000 | 0.002 | 0.005 |
|  | Cu (mass %) | 0.700 | 0.700 | 0.700 | 0.700 | 0.700 | 0.700 | 0.700 | 0.700 |
| Evaluation | Presence of As-Enriched Layer | ○ | ○ | ○ | ○ | ○ | ○ | ○ | ○ |
|  | Inhibition of Viscosity Increase | ○ | ○ | ○ | ○ | ○ | ○ | ○ | ○ |
|  | Solder Wettability | ○ | ○ | ○ | ○ | ○ | ○ | ○ | ○ |
|  | Reliability (ΔT < 10° C.) | ○ | ○ | ○ | ○ | ○ | x | ○ | ○ |
|  | Comprehensive Evaluation | ○ | ○ | ○ | ○ | ○ | x | ○ | ○ |

|  |  | Ex. II-B24 | Ex. II-B25 | Ex. II-B26 | Ex. II-B27 | Ex. II-B28 | Comp. Ex. II-B10 | Ex. II-B29 | Ex. II-B30 |
|---|---|---|---|---|---|---|---|---|---|
| Composition | As (mass ppm) | 200 | 200 | 200 | 200 | 200 | 200 | 250 | 250 |
|  | Bi (mass %) | 0.010 | 0.050 | 0.100 | 0.500 | 1.000 | 5.000 | 0.002 | 0.005 |
|  | Cu (mass %) | 0.700 | 0.700 | 0.700 | 0.700 | 0.700 | 0.700 | 0.700 | 0.700 |
| Evaluation | Presence of As-Enriched Layer | ○ | ○ | ○ | ○ | ○ | ○ | ○ | ○ |
|  | Inhibition of Viscosity Increase | ○ | ○ | ○ | ○ | ○ | ○ | ○ | ○ |
|  | Solder Wettability | ○ | ○ | ○ | ○ | ○ | ○ | ○ | ○ |
|  | Reliability (ΔT < 10° C.) | ○ | ○ | ○ | ○ | ○ | x | ○ | ○ |
|  | Comprehensive Evaluation | ○ | ○ | ○ | ○ | ○ | x | ○ | ○ |

|  |  | Ex. II-B31 | Ex. II-B32 | Ex II-B33 | Ex. II-B34 | Ex. II-B35 | Comp. Ex. II-B11 | Comp. Ex. II-B12 |
|---|---|---|---|---|---|---|---|---|
| Composition | As (mass ppm) | 250 | 250 | 250 | 250 | 250 | 250 | 500 |
|  | Bi (mass %) | 0.010 | 0.050 | 0.100 | 0.500 | 1.000 | 5.000 | 0.000 |
|  | Cu (mass %) | 0.700 | 0.700 | 0.700 | 0.700 | 0.700 | 0.700 | 0.700 |
| Evaluation | Presence of As-Enriched Layer | ○ | ○ | ○ | ○ | ○ | ○ | ○ |
|  | Inhibition of Viscosity Increase | ○ | ○ | ○ | ○ | ○ | ○ | ○ |
|  | Solder Wettability | ○ | ○ | ○ | ○ | ○ | ○ | x |
|  | Reliability (ΔT < 10° C.) | ○ | ○ | ○ | ○ | ○ | x | ○ |
|  | Comprehensive Evaluation | ○ | ○ | ○ | ○ | ○ | x | x |

Examples II-C1 to II-C35 and Comparative Examples II-C1 to II-C12

Sn, As, Bi, Ag and Cu were weighed to satisfy a content of Cu of 0.5% by mass, a content of Ag of 1.0% by mass, and the contents of As and Bi shown in Table II-C below with a balance of Sn (balance for making the sum of Sn, As, Bi, Ag and Cu 100% by mass), and were melt mixed, and the resultant was centrifugally sprayed in an Ar atmosphere to prepare a powder (average particle size: 21 μm, classified as No. 5 of the particle size classification). The thus obtained powder was heated with a drying apparatus in the air at 60° C. for 30 minutes to obtain a solder powder of each of examples and comparative examples. In Comparative Examples II-C1 to II-C6, however, a heat treatment was not performed but a powder as is obtained by the centrifugal spraying was used as a solder powder.

The content of As is shown in ppm by mass with respect to the total mass of the solder material and the contents of Bi, Ag and Cu are shown in % by mass with respect to the total mass of the solder material in the following tables.

A 3N material containing an incidental impurity was used as Sn.

The solder powder obtained in Example II-C1 was analyzed for the contents of Sn, As, Bi, Ag and Cu by ICP-AES in accordance with JIS Z 3910, and it was confirmed that these contents accorded with those of the starting materials.

Results of the evaluations of (1) the presence of an As-enriched layer, (2) the inhibition of viscosity increase, (3) the solder wettability, and (4) the reliability of the solder powders of the examples and comparative examples are shown in the following tables.

TABLE 12

Table IIC-1 1% Ag and 0.5% Cu added

|  |  | Comp. Ex. II-C1 | Comp. Ex. II-C2 | Comp. Ex. II-C3 | Comp. Ex. II-C4 | Comp. Ex. II-C5 | Comp. Ex. II-C6 | Ex. II-C1 | Ex. II-C2 |
|---|---|---|---|---|---|---|---|---|---|
| Composition | As (mass ppm) | 0 | 10 | 20 | 25 | 25 | 40 | 40 | 40 |
|  | Bi (mass %) | 0.000 | 0.000 | 0.000 | 0.000 | 0.002 | 0.000 | 0.010 | 1.000 |
|  | Ag (mass %) | 1.000 | 1.000 | 1.000 | 1.000 | 1.000 | 1.000 | 1.000 | 1.000 |
|  | Cu (mass %) | 0.500 | 0.500 | 0.500 | 0.500 | 0.500 | 0.500 | 0.500 | 0.500 |
| Evaluation | Presence of As-Enriched Layer | x | x | x | x | x | x | ○ | ○ |
|  | Inhibition of Viscosity Increase | x | x | x | x | x | x | ○ | ○ |

TABLE 12-continued

Table IIC-1 1% Ag and 0.5% Cu added

|  |  |  |  |  |  |  |  |  |  |
|---|---|---|---|---|---|---|---|---|---|
|  | Solder Wettability | ○ | ○ | ○ | ○ | ○ | ○ | ○ | ○ |
|  | Reliability (ΔT < 10° C.) | ○ | ○ | ○ | ○ | ○ | ○ | ○ | ○ |
|  | Comprehensive Evaluation | x | x | x | x | x | x | ○ | ○ |

|  |  | Comp. Ex. II-C7 | Ex. II-C3 | Ex. II-C4 | Ex. II-C5 | Ex. II-C6 | Ex. II-C7 | Ex. II-C8 | Ex. II-C9 |
|---|---|---|---|---|---|---|---|---|---|
| Composition | As (mass ppm) | 40 | 50 | 60 | 70 | 80 | 90 | 100 | 100 |
|  | Bi (mass %) | 5.000 | 0.010 | 0.010 | 0.010 | 0.010 | 0.010 | 0.002 | 0.005 |
|  | Ag (mass %) | 1.000 | 1.000 | 1.000 | 1.000 | 1.000 | 1.000 | 1.000 | 1.000 |
|  | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
|  | Inhibition of Viscosity Increase | ○ | ○ | ○ | ○ | ○ | ○ | ○ | ○ |
|  | Solder Wettability | ○ | ○ | ○ | ○ | ○ | ○ | ○ | ○ |
|  | Reliability (ΔT < 10° C.) | x | ○ | ○ | ○ | ○ | ○ | ○ | ○ |
|  | Comprehensive Evaluation | x | ○ | ○ | ○ | ○ | ○ | ○ | ○ |

|  |  | Ex. II-C10 | Ex. II-C11 | Ex II-C12 | Ex. II-C13 | Ex. II-C14 | Comp. Ex. II-C8 | Ex. II-C15 | Ex. II-C16 |
|---|---|---|---|---|---|---|---|---|---|
| Composition | As (mass ppm) | 100 | 100 | 100 | 100 | 100 | 100 | 150 | 150 |
|  | Bi (mass %) | 0.010 | 0.050 | 0.100 | 0.500 | 1.000 | 5.000 | 0.002 | 0.005 |
|  | Ag (mass %) | 1.000 | 1.000 | 1.000 | 1.000 | 1.000 | 1.000 | 1.000 | 1.000 |
|  | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
|  | Inhibition of Viscosity Increase | ○ | ○ | ○ | ○ | ○ | ○ | ○ | ○ |
|  | Solder Wettability | ○ | ○ | ○ | ○ | ○ | ○ | ○ | ○ |
|  | Reliability (ΔT < 10° C.) | ○ | ○ | ○ | ○ | ○ | x | ○ | ○ |
|  | Comprehensive Evaluation | ○ | ○ | ○ | ○ | ○ | x | ○ | ○ |

TABLE 13

Table IIC-2 1% Ag and 0.5% Cu added

|  |  | Ex. II-C17 | Ex. II-C18 | Ex. II-C19 | Ex. II-C20 | Ex. II-C21 | Comp. Ex. II-C9 | Ex. II-C22 | Ex. II-C23 |
|---|---|---|---|---|---|---|---|---|---|
| Composition | As (mass ppm) | 150 | 150 | 150 | 150 | 150 | 150 | 200 | 200 |
|  | Bi (mass %) | 0.010 | 0.050 | 0.100 | 0.500 | 1.000 | 5.000 | 0.002 | 0.005 |
|  | Ag (mass %) | 1.000 | 1.000 | 1.000 | 1.000 | 1.000 | 1.000 | 1.000 | 1.000 |
|  | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
|  | Inhibition of Viscosity Increase | ○ | ○ | ○ | ○ | ○ | ○ | ○ | ○ |
|  | Solder Wettability | ○ | ○ | ○ | ○ | ○ | ○ | ○ | ○ |
|  | Reliability (ΔT < 10° C.) | ○ | ○ | ○ | ○ | ○ | x | ○ | ○ |
|  | Comprehensive Evaluation | ○ | ○ | ○ | ○ | ○ | x | ○ | ○ |

|  |  | Ex. II-C24 | Ex. II-C25 | Ex. II-C26 | Ex. II-C27 | Ex. II-C28 | Comp. Ex. II-C10 | Ex. II-C29 | Ex. II-C30 |
|---|---|---|---|---|---|---|---|---|---|
| Composition | As (mass ppm) | 200 | 200 | 200 | 200 | 200 | 200 | 250 | 250 |
|  | Bi (mass %) | 0.010 | 0.050 | 0.100 | 0.500 | 1.000 | 5.000 | 0.002 | 0.005 |
|  | Ag (mass %) | 1.000 | 1.000 | 1.000 | 1.000 | 1.000 | 1.000 | 1.000 | 1.000 |
|  | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
|  | Inhibition of Viscosity Increase | ○ | ○ | ○ | ○ | ○ | ○ | ○ | ○ |
|  | Solder Wettability | ○ | ○ | ○ | ○ | ○ | ○ | ○ | ○ |
|  | Reliability (ΔT < 10° C.) | ○ | ○ | ○ | ○ | ○ | x | ○ | ○ |
|  | Comprehensive Evaluation | ○ | ○ | ○ | ○ | ○ | x | ○ | ○ |

|  |  | Ex. II-C31 | Ex. II-C32 | Ex II-C33 | Ex. II-C34 | Ex. II-C35 | Comp. Ex. II-C11 | Comp. Ex. II-C12 |
|---|---|---|---|---|---|---|---|---|
| Composition | As (mass ppm) | 250 | 250 | 250 | 250 | 250 | 250 | 500 |
|  | Bi (mass %) | 0.010 | 0.050 | 0.100 | 0.500 | 1.000 | 5.000 | 0.000 |
|  | Ag (mass %) | 1.000 | 1.000 | 1.000 | 1.000 | 1.000 | 1.000 | 1.000 |
|  | Cu (mass %) | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ |
|  | Inhibition of Viscosity Increase | ○ | ○ | ○ | ○ | ○ | ○ | ○ |

TABLE 13-continued

| Table IIC-2 1% Ag and 0.5% Cu added | | | | | | | |
|---|---|---|---|---|---|---|---|
| Solder Wettability | ○ | ○ | ○ | ○ | ○ | ○ | x |
| Reliability (ΔT < 10° C.) | ○ | ○ | ○ | ○ | ○ | x | ○ |
| Comprehensive Evaluation | ○ | ○ | ○ | ○ | ○ | x | x |

Examples II-D1 to II-D35 and Comparative Examples II-D1 to II-D12

Sn, As, Bi, Ag and Cu were weighed to satisfy a content of Cu of 0.5% by mass, a content of Ag of 2.0% by mass, and the contents of As and Bi shown in Table IID below with a balance of Sn (balance for making the sum of Sn, As, Bi, Ag and Cu 100% by mass), and were melt mixed, and the resultant was centrifugally sprayed in an Ar atmosphere to prepare a powder (average particle size: 21 μm, classified as No. 5 of the particle size classification). The thus obtained powder was heated with a drying apparatus in the air at 60° C. for 30 minutes to obtain a solder powder of each of examples and comparative examples. In Comparative Examples II-D1 to II-D6, however, a heat treatment was not performed but a powder as is obtained by the centrifugal spraying was used as a solder powder.

The content of As is shown in ppm by mass with respect to the total mass of the solder material and the contents of Bi, Ag and Cu are shown in % by mass with respect to the total mass of the solder material in the following tables.

A 3N material containing an incidental impurity was used as Sn.

Results of the evaluations of (1) the presence of an As-enriched layer, (2) the inhibition of viscosity increase, (3) the solder wettability, and (4) the reliability of the solder powders of the examples and comparative examples are shown in the following tables.

TABLE 14

| Table IID-1 2% Ag and 0.5% Cu added | | | | | | | | | |
|---|---|---|---|---|---|---|---|---|---|
| | | Comp. Ex. II-D1 | Comp. Ex. II-D2 | Comp. Ex. II-D3 | Comp. Ex. II-D4 | Comp. Ex. II-D5 | Comp. Ex. II-D6 | Ex. II-D1 | Ex. II-D2 |
| Composition | As (mass ppm) | 0 | 10 | 20 | 25 | 25 | 40 | 40 | 40 |
| | Bi (mass %) | 0.000 | 0.000 | 0.000 | 0.000 | 0.002 | 0.000 | 0.010 | 1.000 |
| | Ag (mass %) | 2.000 | 2.000 | 2.000 | 2.000 | 2.000 | 2.000 | 2.000 | 2.000 |
| | Cu (mass %) | 0.500 | 0.500 | 0.500 | 0.500 | 0.500 | 0.500 | 0.500 | 0.500 |
| Evaluation | Presence of As-Enriched Layer | x | x | x | x | x | x | ○ | ○ |
| | Inhibition of Viscosity Increase | x | x | x | x | x | x | ○ | ○ |
| | Solder Wettability | ○ | ○ | ○ | ○ | ○ | ○ | ○ | ○ |
| | Reliability (ΔT < 10° C.) | ○ | ○ | ○ | ○ | ○ | ○ | ○ | ○ |
| | Comprehensive Evaluation | x | x | x | x | x | x | ○ | ○ |
| | | Comp. Ex. II-D7 | Ex. II-D3 | Ex. II-D4 | Ex. II-D5 | Ex. II-D6 | Ex. II-D7 | Ex. II-D8 | Ex. II-D9 |
| Composition | As (mass ppm) | 40 | 50 | 60 | 70 | 80 | 90 | 100 | 100 |
| | Bi (mass %) | 5.000 | 0.010 | 0.010 | 0.010 | 0.010 | 0.010 | 0.002 | 0.005 |
| | Ag (mass %) | 2.000 | 2.000 | 2.000 | 2.000 | 2.000 | 2.000 | 2.000 | 2.000 |
| | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability (ΔT < 10° C.) | x | ○ | ○ | ○ | ○ | ○ | ○ | ○ |
| | Comprehensive Evaluation | x | ○ | ○ | ○ | ○ | ○ | ○ | ○ |
| | | Ex. II-D10 | Ex. II-D11 | Ex II-D12 | Ex. II-D13 | Ex. II-D14 | Comp. Ex. II-D8 | Ex. II-D15 | Ex. II-D16 |
| Composition | As (mass ppm) | 100 | 100 | 100 | 100 | 100 | 100 | 150 | 150 |
| | Bi (mass %) | 0.010 | 0.050 | 0.100 | 0.500 | 1.000 | 5.000 | 0.002 | 0.005 |
| | Ag (mass %) | 2.000 | 2.000 | 2.000 | 2.000 | 2.000 | 2.000 | 2.000 | 2.000 |
| | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability (ΔT < 10° C.) | ○ | ○ | ○ | ○ | ○ | x | ○ | ○ |
| | Comprehensive Evaluation | ○ | ○ | ○ | ○ | ○ | x | ○ | ○ |

TABLE 15

Table IID-2 2% Ag and 0.5% Cu added

|  |  | Ex. II-D17 | Ex. II-D18 | Ex. II-D19 | Ex. II-D20 | Ex. II-D21 | Comp. Ex. II-D9 | Ex. II-D22 | Ex. II-D23 |
|---|---|---|---|---|---|---|---|---|---|
| Composition | As (mass ppm) | 150 | 150 | 150 | 150 | 150 | 150 | 200 | 200 |
|  | Bi (mass %) | 0.010 | 0.050 | 0.100 | 0.500 | 1.000 | 5.000 | 0.002 | 0.005 |
|  | Ag (mass %) | 2.000 | 2.000 | 2.000 | 2.000 | 2.000 | 2.000 | 2.000 | 2.000 |
|  | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
|  | Inhibition of Viscosity Increase | ○ | ○ | ○ | ○ | ○ | ○ | ○ | ○ |
|  | Solder Wettability | ○ | ○ | ○ | ○ | ○ | ○ | ○ | ○ |
|  | Reliability (ΔT < 10° C.) | ○ | ○ | ○ | ○ | ○ | x | ○ | ○ |
|  | Comprehensive Evaluation | ○ | ○ | ○ | ○ | ○ | x | ○ | ○ |

|  |  | Ex. II-D24 | Ex. II-D25 | Ex. II-D26 | Ex. II-D27 | Ex. II-D28 | Comp. Ex. II-D10 | Ex. II-D29 | Ex. II-D30 |
|---|---|---|---|---|---|---|---|---|---|
| Composition | As (mass ppm) | 200 | 200 | 200 | 200 | 200 | 200 | 250 | 250 |
|  | Bi (mass %) | 0.010 | 0.050 | 0.100 | 0.500 | 1.000 | 5.000 | 0.002 | 0.005 |
|  | Ag (mass %) | 2.000 | 2.000 | 2.000 | 2.000 | 2.000 | 2.000 | 2.000 | 2.000 |
|  | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
|  | Inhibition of Viscosity Increase | ○ | ○ | ○ | ○ | ○ | ○ | ○ | ○ |
|  | Solder Wettability | ○ | ○ | ○ | ○ | ○ | ○ | ○ | ○ |
|  | Reliability (ΔT < 10° C.) | ○ | ○ | ○ | ○ | ○ | x | ○ | ○ |
|  | Comprehensive Evaluation | ○ | ○ | ○ | ○ | ○ | x | ○ | ○ |

|  |  | Ex. II-D31 | Ex. II-D32 | Ex II-D33 | Ex. II-D34 | Ex. II-D35 | Comp. Ex. II-D11 | Comp. Ex. II-D12 |
|---|---|---|---|---|---|---|---|---|
| Composition | As (mass ppm) | 250 | 250 | 250 | 250 | 250 | 250 | 500 |
|  | Bi (mass %) | 0.010 | 0.050 | 0.100 | 0.500 | 1.000 | 5.000 | 0.000 |
|  | Ag (mass %) | 2.000 | 2.000 | 2.000 | 2.000 | 2.000 | 2.000 | 2.000 |
|  | Cu (mass %) | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ |
|  | Inhibition of Viscosity Increase | ○ | ○ | ○ | ○ | ○ | ○ | ○ |
|  | Solder Wettability | ○ | ○ | ○ | ○ | ○ | ○ | x |
|  | Reliability (ΔT < 10° C.) | ○ | ○ | ○ | ○ | ○ | x | ○ |
|  | Comprehensive Evaluation | ○ | ○ | ○ | ○ | ○ | x | x |

Examples II-E1 to II-E35 and Comparative Examples II-E1 to II-E12

Sn, As, Bi, Ag and Cu were weighed to satisfy a content of Cu of 0.5% by mass, a content of Ag of 3.0% by mass, and the contents of As and Bi shown in Table IIE below with a balance of Sn (balance for making the sum of Sn, As, Bi, Ag and Cu 100% by mass), and were melt mixed, and the resultant was centrifugally sprayed in an Ar atmosphere to prepare a powder (average particle size: 21 μm, classified as No. 5 of the particle size classification). The thus obtained powder was heated with a drying apparatus in the air at 60° C. for 30 minutes to obtain a solder powder of each of examples and comparative examples. In Comparative Examples II-E1 to II-E6, however, a heat treatment was not performed but a powder as is obtained by the centrifugal spraying was used as a solder powder.

The content of As is shown in ppm by mass with respect to the total mass of the solder material and the contents of Bi, Ag and Cu are shown in % by mass with respect to the total mass of the solder material in the following tables.

A 3N material containing an incidental impurity was used as Sn.

Results of the evaluations of (1) the presence of an As-enriched layer, (2) the inhibition of viscosity increase, (3) the solder wettability, and (4) the reliability of the solder powders of the examples and comparative examples are shown in the following tables.

TABLE 16

Table IIE-1 3% Ag and 0.5% Cu added

|  |  | Comp. Ex. II-E1 | Comp. Ex. II-E2 | Comp. Ex. II-E3 | Comp. Ex. II-E4 | Comp. Ex. II-E5 | Comp. Ex. II-E6 | Ex. II-E1 | Ex. II-E2 |
|---|---|---|---|---|---|---|---|---|---|
| Composition | As (mass ppm) | 0 | 10 | 20 | 25 | 25 | 40 | 40 | 40 |
|  | Bi (mass %) | 0.000 | 0.000 | 0.000 | 0.000 | 0.002 | 0.000 | 0.010 | 1.000 |
|  | Ag (mass %) | 3.000 | 3.000 | 3.000 | 3.000 | 3.000 | 3.000 | 3.000 | 3.000 |
|  | Cu (mass %) | 0.500 | 0.500 | 0.500 | 0.500 | 0.500 | 0.500 | 0.500 | 0.500 |

TABLE 16-continued

Table IIE-1 3% Ag and 0.5% Cu added

| Evaluation | | | | | | | | | |
|---|---|---|---|---|---|---|---|---|---|
| Presence of As-Enriched Layer | x | x | x | x | x | x | ○ | ○ |
| Inhibition of Viscosity Increase | x | x | x | x | x | x | ○ | ○ |
| Solder Wettability | ○ | ○ | ○ | ○ | ○ | ○ | ○ | ○ |
| Reliability (ΔT < 10° C.) | ○ | ○ | ○ | ○ | ○ | ○ | ○ | ○ |
| Comprehensive Evaluation | x | x | x | x | x | x | ○ | ○ |

| | | Comp. Ex. II-E7 | Ex. II-E3 | Ex. II-E4 | Ex. II-E5 | Ex. II-E6 | Ex. II-E7 | Ex. II-E8 | Ex. II-E9 |
|---|---|---|---|---|---|---|---|---|---|
| Composition | As (mass ppm) | 40 | 50 | 60 | 70 | 80 | 90 | 100 | 100 |
| | Bi (mass %) | 5.000 | 0.010 | 0.010 | 0.010 | 0.010 | 0.010 | 0.002 | 0.005 |
| | Ag (mass %) | 3.000 | 3.000 | 3.000 | 3.000 | 3.000 | 3.000 | 3.000 | 3.000 |
| | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability (ΔT < 10° C.) | x | ○ | ○ | ○ | ○ | ○ | ○ | ○ |
| | Comprehensive Evaluation | x | ○ | ○ | ○ | ○ | ○ | ○ | ○ |

| | | Ex. II-E10 | Ex. II-E11 | Ex II-E12 | Ex. II-E13 | Ex. II-E14 | Comp. Ex. II-E8 | Ex. II-E15 | Ex. II-E16 |
|---|---|---|---|---|---|---|---|---|---|
| Composition | As (mass ppm) | 100 | 100 | 100 | 100 | 100 | 100 | 150 | 150 |
| | Bi (mass %) | 0.010 | 0.050 | 0.100 | 0.500 | 1.000 | 5.000 | 0.002 | 0.005 |
| | Ag (mass %) | 3.000 | 3.000 | 3.000 | 3.000 | 3.000 | 3.000 | 3.000 | 3.000 |
| | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability (ΔT < 10° C.) | ○ | ○ | ○ | ○ | ○ | x | ○ | ○ |
| | Comprehensive Evaluation | ○ | ○ | ○ | ○ | ○ | x | ○ | ○ |

TABLE 17

Table IIE-2 3% Ag and 0.5% Cu added

| | | Ex. II-E17 | Ex. II-E18 | Ex. II-E19 | Ex. II-E20 | Ex. II-E21 | Comp. Ex. II-E9 | Ex. II-E22 | Ex. II-E23 |
|---|---|---|---|---|---|---|---|---|---|
| Composition | As (mass ppm) | 150 | 150 | 150 | 150 | 150 | 150 | 200 | 200 |
| | Bi (mass %) | 0.010 | 0.050 | 0.100 | 0.500 | 1.000 | 5.000 | 0.002 | 0.005 |
| | Ag (mass %) | 3.000 | 3.000 | 3.000 | 3.000 | 3.000 | 3.000 | 3.000 | 3.000 |
| | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability (ΔT < 10° C.) | ○ | ○ | ○ | ○ | ○ | x | ○ | ○ |
| | Comprehensive Evaluation | ○ | ○ | ○ | ○ | ○ | x | ○ | ○ |

| | | Ex. II-E24 | Ex. II-E25 | Ex. II-E26 | Ex. II-E27 | Ex. II-E28 | Comp. Ex. II-E10 | Ex. II-E29 | Ex. II-E30 |
|---|---|---|---|---|---|---|---|---|---|
| Composition | As (mass ppm) | 200 | 200 | 200 | 200 | 200 | 200 | 250 | 250 |
| | Bi (mass %) | 0.010 | 0.050 | 0.100 | 0.500 | 1.000 | 5.000 | 0.002 | 0.005 |
| | Ag (mass %) | 3.000 | 3.000 | 3.000 | 3.000 | 3.000 | 3.000 | 3.000 | 3.000 |
| | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability (ΔT < 10° C.) | ○ | ○ | ○ | ○ | ○ | x | ○ | ○ |
| | Comprehensive Evaluation | ○ | ○ | ○ | ○ | ○ | x | ○ | ○ |

| | | Ex. II-E31 | Ex. II-E32 | Ex II-E33 | Ex. II-E34 | Ex. II-E35 | Comp. Ex. II-E11 | Comp. Ex. II-E12 |
|---|---|---|---|---|---|---|---|---|
| Composition | As (mass ppm) | 250 | 250 | 250 | 250 | 250 | 250 | 500 |
| | Bi (mass %) | 0.010 | 0.050 | 0.100 | 0.500 | 1.000 | 5.000 | 0.000 |
| | Ag (mass %) | 3.000 | 3.000 | 3.000 | 3.000 | 3.000 | 3.000 | 3.000 |
| | Cu (mass %) | 0.500 | 0.500 | 0.500 | 0.500 | 0.500 | 0.500 | 0.500 |

TABLE 17-continued

Table IIE-2 3% Ag and 0.5% Cu added

| | | | | | | | | |
|---|---|---|---|---|---|---|---|---|
| Evaluation | Presence of As-Enriched Layer | ○ | ○ | ○ | ○ | ○ | ○ | ○ |
| | Inhibition of Viscosity Increase | ○ | ○ | ○ | ○ | ○ | ○ | ○ |
| | Solder Wettability | ○ | ○ | ○ | ○ | ○ | ○ | x |
| | Reliability (ΔT < 10° C.) | ○ | ○ | ○ | ○ | ○ | x | ○ |
| | Comprehensive Evaluation | ○ | ○ | ○ | ○ | ○ | x | x |

Examples II-F1 to II-F35 and Comparative Examples II-F1 to II-F12

Sn, As, Bi, Ag and Cu were weighed to satisfy a content of Cu of 0.5% by mass, a content of Ag of 3.5% by mass, and the contents of As and Bi shown in Table IIF below with a balance of Sn (balance for making the sum of Sn, As, Bi, Ag and Cu 100% by mass), and were melt mixed, and the resultant was centrifugally sprayed in an Ar atmosphere to prepare a powder (average particle size: 21 μm, classified as No. 5 of the particle size classification). The thus obtained powder was heated with a drying apparatus in the air at 60° C. for 30 minutes to obtain a solder powder of each of examples and comparative examples. In Comparative Examples II-F1 to II-F6, however, a heat treatment was not performed but a powder as is obtained by the centrifugal spraying was used as a solder powder.

The content of As is shown in ppm by mass with respect to the total mass of the solder material and the contents of Bi, Ag and Cu are shown in % by mass with respect to the total mass of the solder material in the following tables.

A 3N material containing an incidental impurity was used as Sn.

Results of the evaluations of (1) the presence of an As-enriched layer, (2) the inhibition of viscosity increase, (3) the solder wettability, and (4) the reliability of the solder powders of the examples and comparative examples are shown in the following tables.

TABLE 18

Table IIF-1 3.5% Ag and 0.5% Cu added

| | | Comp. Ex. II-F1 | Comp. Ex. II-F2 | Comp. Ex. II-F3 | Comp. Ex. II-F4 | Comp. Ex. II-F5 | Comp. Ex. II-F6 | Ex. II-F1 | Ex. II-F2 |
|---|---|---|---|---|---|---|---|---|---|
| Composition | As (mass ppm) | 0 | 10 | 20 | 25 | 25 | 40 | 40 | 40 |
| | Bi (mass %) | 0.000 | 0.000 | 0.000 | 0.000 | 0.002 | 0.000 | 0.010 | 1.000 |
| | Ag (mass %) | 3.500 | 3.500 | 3.500 | 3.500 | 3.500 | 3.500 | 3.500 | 3.500 |
| | Cu (mass %) | 0.500 | 0.500 | 0.500 | 0.500 | 0.500 | 0.500 | 0.500 | 0.500 |
| Evaluation | Presence of As-Enriched Layer | x | x | x | x | x | x | ○ | ○ |
| | Inhibition of Viscosity Increase | x | x | x | x | x | x | ○ | ○ |
| | Solder Wettability | ○ | ○ | ○ | ○ | ○ | ○ | ○ | ○ |
| | Reliability (ΔT < 10° C.) | ○ | ○ | ○ | ○ | ○ | ○ | ○ | ○ |
| | Comprehensive Evaluation | x | x | x | x | x | x | ○ | ○ |

| | | Comp. Ex. II-F7 | Ex. II-F3 | Ex. II-F4 | Ex. II-F5 | Ex. II-F6 | Comp. Ex. II-F7 | Ex. II-F8 | Ex. II-F9 |
|---|---|---|---|---|---|---|---|---|---|
| Composition | As (mass ppm) | 40 | 50 | 60 | 70 | 80 | 90 | 100 | 100 |
| | Bi (mass %) | 5.000 | 0.010 | 0.010 | 0.010 | 0.010 | 0.010 | 0.002 | 0.005 |
| | Ag (mass %) | 3.500 | 3.500 | 3.500 | 3.500 | 3.500 | 3.500 | 3.500 | 3.500 |
| | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability (ΔT < 10° C.) | x | ○ | ○ | ○ | ○ | ○ | ○ | ○ |
| | Comprehensive Evaluation | x | ○ | ○ | ○ | ○ | ○ | ○ | ○ |

| | | Ex. II-F10 | Ex. II-F11 | Ex II-F12 | Ex. II-F13 | Ex. II-F14 | Comp. Ex. II-F8 | Ex. II-F15 | Ex. II-F16 |
|---|---|---|---|---|---|---|---|---|---|
| Composition | As (mass ppm) | 100 | 100 | 100 | 100 | 100 | 100 | 150 | 150 |
| | Bi (mass %) | 0.010 | 0.050 | 0.100 | 0.500 | 1.000 | 5.000 | 0.002 | 0.005 |
| | Ag (mass %) | 3.500 | 3.500 | 3.500 | 3.500 | 3.500 | 3.500 | 3.500 | 3.500 |
| | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability (ΔT < 10° C.) | ○ | ○ | ○ | ○ | ○ | x | ○ | ○ |
| | Comprehensive Evaluation | ○ | ○ | ○ | ○ | ○ | x | ○ | ○ |

TABLE 19

Table IIF-2 3.5% Ag and 0.5% Cu added

|  |  | Ex. II-F17 | Ex. II-F18 | Ex. II-F19 | Ex. II-F20 | Ex. II-F21 | Comp. Ex. II-F9 | Ex. II-F22 | Ex. II-F23 |
|---|---|---|---|---|---|---|---|---|---|
| Composition | As (mass ppm) | 150 | 150 | 150 | 150 | 150 | 150 | 200 | 200 |
|  | Bi (mass %) | 0.010 | 0.050 | 0.100 | 0.500 | 1.000 | 5.000 | 0.002 | 0.005 |
|  | Ag (mass %) | 3.500 | 3.500 | 3.500 | 3.500 | 3.500 | 3.500 | 3.500 | 3.500 |
|  | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
|  | Inhibition of Viscosity Increase | ○ | ○ | ○ | ○ | ○ | ○ | ○ | ○ |
|  | Solder Wettability | ○ | ○ | ○ | ○ | ○ | ○ | ○ | ○ |
|  | Reliability (ΔT < 10° C.) | ○ | ○ | ○ | ○ | ○ | x | ○ | ○ |
|  | Comprehensive Evaluation | ○ | ○ | ○ | ○ | ○ | x | ○ | ○ |

|  |  | Ex. II-F24 | Ex. II-F25 | Ex. II-F26 | Ex. II-F27 | Ex. II-F28 | Comp. Ex. II-F10 | Ex. II-F29 | Ex. II-F30 |
|---|---|---|---|---|---|---|---|---|---|
| Composition | As (mass ppm) | 200 | 200 | 200 | 200 | 200 | 200 | 250 | 250 |
|  | Bi (mass %) | 0.010 | 0.050 | 0.100 | 0.500 | 1.000 | 5.000 | 0.002 | 0.005 |
|  | Ag (mass %) | 3.500 | 3.500 | 3.500 | 3.500 | 3.500 | 3.500 | 3.500 | 3.500 |
|  | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
|  | Inhibition of Viscosity Increase | ○ | ○ | ○ | ○ | ○ | ○ | ○ | ○ |
|  | Solder Wettability | ○ | ○ | ○ | ○ | ○ | ○ | ○ | ○ |
|  | Reliability (ΔT < 10° C.) | ○ | ○ | ○ | ○ | ○ | x | ○ | ○ |
|  | Comprehensive Evaluation | ○ | ○ | ○ | ○ | ○ | x | ○ | ○ |

|  |  | Ex. II-F31 | Ex. II-F32 | Ex II-F33 | Ex. II-F34 | Ex. II-F35 | Comp. Ex. II-F11 | Comp. Ex. II-F12 |
|---|---|---|---|---|---|---|---|---|
| Composition | As (mass ppm) | 250 | 250 | 250 | 250 | 250 | 250 | 500 |
|  | Bi (mass %) | 0.010 | 0.050 | 0.100 | 0.500 | 1.000 | 5.000 | 0.000 |
|  | Ag (mass %) | 3.500 | 3.500 | 3.500 | 3.500 | 3.500 | 3.500 | 3.500 |
|  | Cu (mass %) | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ |
|  | Inhibition of Viscosity Increase | ○ | ○ | ○ | ○ | ○ | ○ | ○ |
|  | Solder Wettability | ○ | ○ | ○ | ○ | ○ | ○ | x |
|  | Reliability (ΔT < 10° C.) | ○ | ○ | ○ | ○ | ○ | x | ○ |
|  | Comprehensive Evaluation | ○ | ○ | ○ | ○ | ○ | x | x |

III. Sn—As—Sb-Containing Solder

Examples III-A1 to III-A32 and Comparative Examples III-A1 to III-A12

Sn, As and Sb were weighed to satisfy the contents of As and Sb shown in Table IIIA below with a balance of Sn (balance for making the sum of Sn, As and Sb 100% by mass), and were melt mixed, and the resultant was centrifugally sprayed in an Ar atmosphere to prepare a powder (average particle size: 21 μm, classified as No. 5 of the particle size classification (Table 2) of JIS Z3284-1:2004). The thus obtained powder was heated with a drying apparatus in the air at 60° C. for 30 minutes to obtain a solder powder of each of examples and comparative examples. In Comparative Examples III-A1 to III-A6, however, a heat treatment was not performed but a powder as is obtained by the centrifugal spraying was used as a solder powder.

The content of As is shown in ppm by mass with respect to the total mass of solder materials and the content of Sb is shown in % by mass with respect to the total mass of the solder materials in the following tables.

A 3N material containing an incidental impurity was used as Sn.

Results of the evaluations of (1) the presence of an As-enriched layer, (2) the inhibition of viscosity increase, and (3) the solder wettability of the solder powders of the examples and comparative examples are shown in the following tables.

TABLE 20

Table IIIA

|  |  | Comp. Ex. III-A1 | Comp. Ex. III-A2 | Comp. Ex. III-A3 | Comp. Ex. III-A4 | Comp. Ex. III-A5 | Comp. Ex. III-A6 | Ex. III-A1 | Ex. III-A2 | Ex. III-A3 | Comp. Ex. III-A7 |
|---|---|---|---|---|---|---|---|---|---|---|---|
| Composition | As (mass ppm) | 0 | 10 | 20 | 25 | 25 | 40 | 40 | 40 | 40 | 40 |
|  | Sb (mass %) | 0.000 | 0.000 | 0.000 | 0.000 | 0.002 | 0.000 | 0.010 | 0.100 | 0.500 | 1.000 |
| Evaluation | Presence of As-Enriched Layer | x | x | x | x | x | x | ○ | ○ | ○ | ○ |

TABLE 20-continued

Table IIIA

| | | | | | | | | | | | |
|---|---|---|---|---|---|---|---|---|---|---|---|
| | Inhibition of Viscosity Increase | x | x | x | x | x | x | ○ | ○ | ○ | ○ |
| | Solder Wettability | ○ | ○ | ○ | ○ | ○ | ○ | ○ | ○ | ○ | x |
| | Comprehensive Evaluation | x | x | x | x | x | x | ○ | ○ | ○ | x |

| | | Ex. III-A4 | Ex. III-A5 | Ex. III-A6 | Ex. III-A7 | Ex. III-A8 | Ex. III-A9 | Ex. III-A10 | Ex. III-A11 | Ex. III-A12 | Ex. III-A13 |
|---|---|---|---|---|---|---|---|---|---|---|---|
| Composition | As (mass ppm) | 50 | 60 | 70 | 80 | 90 | 100 | 100 | 100 | 100 | 100 |
| | Sb (mass %) | 0.010 | 0.010 | 0.010 | 0.010 | 0.010 | 0.002 | 0.005 | 0.010 | 0.050 | 0.100 |
| Evaluation | Presence of As-Enriched Layer | ○ | ○ | ○ | ○ | ○ | ○ | ○ | ○ | ○ | ○ |
| | Inhibition of Viscosity Increase | ○ | ○ | ○ | ○ | ○ | ○ | ○ | ○ | ○ | ○ |
| | Solder Wettability | ○ | ○ | ○ | ○ | ○ | ○ | ○ | ○ | ○ | ○ |
| | Comprehensive Evaluation | ○ | ○ | ○ | ○ | ○ | ○ | ○ | ○ | ○ | ○ |

TABLE 21

| Ex. III-A14 | Comp. Ex. III-A8 | Ex. III-A15 | Ex. III-A16 | Ex. III-A17 | Ex. III-A18 | Ex. III-A19 | Ex. III-A20 | Comp. Ex. III-A9 | Ex. III-A21 | Ex. III-A22 | Ex. III-A23 |
|---|---|---|---|---|---|---|---|---|---|---|---|
| 100 | 100 | 150 | 150 | 150 | 150 | 150 | 150 | 150 | 200 | 200 | 200 |
| 0.500 | 1.000 | 0.002 | 0.005 | 0.010 | 0.050 | 0.100 | 0.500 | 1.000 | 0.002 | 0.005 | 0.010 |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ |
| ○ | x | ○ | ○ | ○ | ○ | ○ | ○ | x | ○ | ○ | ○ |
| ○ | x | ○ | ○ | ○ | ○ | ○ | ○ | x | ○ | ○ | ○ |

| Ex. III-A24 | Ex. III-A25 | Ex. III-A26 | Comp. Ex. III-A10 | Ex. III-A27 | Ex. III-A28 | Ex. III-A29 | Ex. III-A30 | Ex. III-A31 | Ex. III-A32 | Comp. Ex. III-A11 | Comp. Ex. III-A12 |
|---|---|---|---|---|---|---|---|---|---|---|---|
| 200 | 200 | 200 | 200 | 200 | 200 | 250 | 250 | 250 | 250 | 250 | 500 |
| 0.050 | 0.100 | 0.500 | 1.000 | 0.002 | 0.005 | 0.010 | 0.050 | 0.100 | 0.500 | 1.000 | 0.000 |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ |
| ○ | ○ | ○ | x | ○ | ○ | ○ | ○ | ○ | ○ | x | x |
| ○ | ○ | ○ | x | ○ | ○ | ○ | ○ | ○ | ○ | x | x |

Examples III-B1 to III-B32 and Comparative Examples III-B1 to III-B12

Sn, As, Sb and Cu were weighed to satisfy a content of Cu of 0.7% by mass and the contents of As and Sb shown in Table IIIB below with a balance of Sn (balance for making the sum of Sn, As, Sb and Cu 100% by mass), and were melt mixed, and the resultant was centrifugally sprayed in an Ar atmosphere to prepare a powder (average particle size: 21 μm, classified as No. 5 of the particle size classification). The thus obtained powder was heated with a drying apparatus in the air at 60° C. for 30 minutes to obtain a solder powder of each of examples and comparative examples. In Comparative Examples III-B1 to III-B6, however, a heat treatment was not performed but a powder as is obtained by the centrifugal spraying was used as a solder powder.

The content of As is shown in ppm by mass with respect to the total mass of the solder material and the contents of Sb and Cu are shown in % by mass with respect to the total mass of the solder material in the following tables.

A 3N material containing an incidental impurity was used as Sn.

Results of the evaluations of (1) the presence of an As-enriched layer, (2) the inhibition of viscosity increase, and (3) the solder wettability of the solder powders of the examples and comparative examples are shown in the following tables.

TABLE 22

Table IIIB 0% Ag and 0.7% Cu added

| | | Comp. Ex. III-B1 | Comp. Ex. III-B2 | Comp. Ex. III-B3 | Comp. Ex. III-B4 | Comp. Ex. III-B5 | Comp. Ex. III-B6 | Ex. III-B1 | Ex. III-B2 | Ex. III-B3 | Comp. Ex. III-B7 |
|---|---|---|---|---|---|---|---|---|---|---|---|
| Composition | As (mass ppm) | 0 | 10 | 20 | 25 | 25 | 40 | 40 | 40 | 40 | 40 |
| | Bi (mass %) | 0.000 | 0.000 | 0.000 | 0.000 | 0.002 | 0.000 | 0.010 | 0.100 | 0.500 | 1.000 |
| | Cu (mass %) | 0.700 | 0.700 | 0.700 | 0.700 | 0.700 | 0.700 | 0.700 | 0.700 | 0.700 | 0.700 |
| Evaluation | Presence of As-Enriched Layer | x | x | x | x | x | x | ○ | ○ | ○ | ○ |
| | Inhibition of Viscosity Increase | x | x | x | x | x | x | ○ | ○ | ○ | ○ |
| | Solder Wettability | ○ | ○ | ○ | ○ | ○ | ○ | ○ | ○ | ○ | x |
| | Comprehensive Evaluation | x | x | x | x | x | x | ○ | ○ | ○ | x |

| | | Ex. III-B4 | Ex. III-B5 | Ex. III-B6 | Ex. III-B7 | Ex. III-B8 | Ex. III-B9 | Ex. III-B10 | Ex. III-B11 | Ex. III-B12 | Ex. III-B13 |
|---|---|---|---|---|---|---|---|---|---|---|---|
| Composition | As (mass ppm) | 50 | 60 | 70 | 80 | 90 | 100 | 100 | 100 | 100 | 100 |
| | Bi (mass %) | 0.010 | 0.010 | 0.010 | 0.010 | 0.010 | 0.002 | 0.005 | 0.010 | 0.050 | 0.100 |
| | Cu (mass %) | 0.700 | 0.700 | 0.700 | 0.700 | 0.700 | 0.700 | 0.700 | 0.700 | 0.700 | 0.700 |
| Evaluation | Presence of As-Enriched Layer | ○ | ○ | ○ | ○ | ○ | ○ | ○ | ○ | ○ | ○ |
| | Inhibition of Viscosity Increase | ○ | ○ | ○ | ○ | ○ | ○ | ○ | ○ | ○ | ○ |
| | Solder Wettability | ○ | ○ | ○ | ○ | ○ | ○ | ○ | ○ | ○ | ○ |
| | Comprehensive Evaluation | ○ | ○ | ○ | ○ | ○ | ○ | ○ | ○ | ○ | ○ |

TABLE 23

| Ex. III-B14 | Comp. Ex. III-B8 | Ex. III-B15 | Ex. III-B16 | Ex. III-B17 | Ex. III-B18 | Ex. III-B19 | Ex. III-B20 | Comp. Ex. III-B9 | Ex. III-B21 | Ex. III-B22 | Ex. III-B23 |
|---|---|---|---|---|---|---|---|---|---|---|---|
| 100 | 100 | 150 | 150 | 150 | 150 | 150 | 150 | 150 | 200 | 200 | 200 |
| 0.500 | 1.000 | 0.002 | 0.005 | 0.010 | 0.050 | 0.100 | 0.500 | 1.000 | 0.002 | 0.005 | 0.010 |
| 0.700 | 0.700 | 0.700 | 0.700 | 0.700 | 0.700 | 0.700 | 0.700 | 0.700 | 0.700 | 0.700 | 0.700 |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ |
| ○ | x | ○ | ○ | ○ | ○ | ○ | ○ | x | ○ | ○ | ○ |
| ○ | x | ○ | ○ | ○ | ○ | ○ | ○ | x | ○ | ○ | ○ |

| Ex. III-B24 | Ex. III-B25 | Ex. III-B26 | Comp. Ex. III-B10 | Ex. III-B27 | Ex. III-B28 | Ex. III-B29 | Ex. III-B30 | Ex. III-B31 | Ex. III-B32 | Comp. Ex. III-B11 | Comp. Ex. III-B12 |
|---|---|---|---|---|---|---|---|---|---|---|---|
| 200 | 200 | 200 | 200 | 250 | 250 | 250 | 250 | 250 | 250 | 250 | 500 |
| 0.050 | 0.100 | 0.500 | 1.000 | 0.002 | 0.005 | 0.010 | 0.050 | 0.100 | 0.500 | 1.000 | 0.000 |
| 0.700 | 0.700 | 0.700 | 0.700 | 0.700 | 0.700 | 0.700 | 0.700 | 0.700 | 0.700 | 0.700 | 0.700 |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ |
| ○ | ○ | ○ | x | ○ | ○ | ○ | ○ | ○ | ○ | x | x |
| ○ | ○ | ○ | x | ○ | ○ | ○ | ○ | ○ | ○ | x | x |

Examples III-C1 to III-C32 and Comparative Examples III-C1 to III-C12

Sn, As, Sb, Ag and Cu were weighed to satisfy a content of Cu of 0.5% by mass, a content of Ag of 1.0% by mass, and the contents of As and Sb shown in Table IIIC below with a balance of Sn (balance for making the sum of Sn, As, Sb, Ag and Cu 100% by mass), and were melt mixed, and the resultant was centrifugally sprayed in an Ar atmosphere to prepare a powder (average particle size: 21 µm, classified as No. 5 of the particle size classification). The thus obtained powder was heated with a drying apparatus in the air at 60° C. for 30 minutes to obtain a solder powder of each of examples and comparative examples. In Comparative Examples III-C1 to III-C6, however, a heat treatment was not performed but a powder as is obtained by the centrifugal spraying was used as a solder powder.

The content of As is shown in ppm by mass with respect to the total mass of the solder material and the contents of Sb, Ag and Cu are shown in % by mass with respect to the total mass of the solder material in the following tables.

A 3N material containing an incidental impurity was used as Sn.

The solder powder obtained in Example III-C1 was analyzed for the contents of Sn, As, Sb, Ag and Cu by ICP-AES in accordance with JIS Z 3910, and it was confirmed that these contents accorded with those of the starting materials.

Results of the evaluations of (1) the presence of an As-enriched layer, (2) the inhibition of viscosity increase, and (3) the solder wettability of the solder powders of the examples and comparative examples are shown in the following tables.

TABLE 24

TABLE III C1% Ag and 0.5% Cu added

|  |  | Comp. Ex. III-C1 | Comp. Ex. III-C2 | Comp. Ex. III-C3 | Comp. Ex. III-C4 | Comp. Ex. III-C5 | Comp. Ex. III-C6 | Ex. III-C1 | Ex. III-C2 | Ex III-C3 | Comp. Ex III-C7 | Ex. III-C4 |
|---|---|---|---|---|---|---|---|---|---|---|---|---|
| Composition | As (mass ppm) | 0 | 10 | 20 | 25 | 25 | 40 | 40 | 40 | 40 | 40 | 50 |
|  | Sb (mass %) | 0.000 | 0.000 | 0.000 | 0.000 | 0.002 | 0.000 | 0.010 | 0.100 | 0.500 | 1.000 | 0.010 |
|  | Ag (mass %) | 1.000 | 1.000 | 1.000 | 1.000 | 1.000 | 1.000 | 1.000 | 1.000 | 1.000 | 1.000 | 1.000 |
|  | Cu (mass %) | 0.500 | 0.500 | 0.500 | 0.500 | 0.500 | 0.500 | 0.500 | 0.500 | 0.500 | 0.500 | 0.500 |
| Evaluation | Presence of As-Enriched Layer | x | x | x | x | x | x | ○ | ○ | ○ | ○ | ○ |
|  | Inhibition of Viscosity Increase | x | x | x | x | x | x | ○ | ○ | ○ | ○ | ○ |
|  | Solder Wettability | ○ | ○ | ○ | ○ | ○ | ○ | ○ | ○ | ○ | x | ○ |
|  | Comprehensive Evaluation | x | x | x | x | x | x | ○ | ○ | ○ | x | ○ |

|  |  | Ex. III-C5 | Ex. III-C6 | Ex. III-C7 | Ex. III-C8 | Ex. III-C9 | Ex. III-C10 | Ex. III-C11 | Ex III-C12 | Ex III-C13 |
|---|---|---|---|---|---|---|---|---|---|---|
| Composition | As (mass ppm) | 60 | 70 | 80 | 90 | 100 | 100 | 100 | 100 | 100 |
|  | Sb (mass %) | 0.010 | 0.010 | 0.010 | 0.010 | 0.002 | 0.005 | 0.010 | 0.050 | 0.100 |
|  | Ag (mass %) | 1.000 | 1.000 | 1.000 | 1.000 | 1.000 | 1.000 | 1.000 | 1.000 | 1.000 |
|  | Cu (mass %) | 0.500 | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ | ○ |
|  | Inhibition of Viscosity Increase | ○ | ○ | ○ | ○ | ○ | ○ | ○ | ○ | ○ |

TABLE 24-continued

TABLE III C1% Ag and 0.5% Cu added

| | | | | | | | | | |
|---|---|---|---|---|---|---|---|---|---|
| Solder Wettability | ○ | ○ | ○ | ○ | ○ | ○ | ○ | ○ | ○ |
| Comprehensive Evaluation | ○ | ○ | ○ | ○ | ○ | ○ | ○ | ○ | ○ |

TABLE 25

| Ex. III-C14 | Comp. Ex. III-C8 | Ex. III-C15 | Ex. III-C16 | Ex. III-C17 | Ex. III-C18 | Ex. III-C19 | Ex. III-C20 | Comp Ex. III-C9 | Ex. III-C21 | Ex. III-C22 | Ex. III-C23 |
|---|---|---|---|---|---|---|---|---|---|---|---|
| 100 | 100 | 150 | 150 | 150 | 150 | 150 | 150 | 150 | 200 | 200 | 200 |
| 0.500 | 1.000 | 0.002 | 0.005 | 0.010 | 0.050 | 0.100 | 0.500 | 1.000 | 0.002 | 0.005 | 0.010 |
| 1.000 | 1.000 | 1.000 | 1.000 | 1.000 | 1.000 | 1.000 | 1.000 | 1.000 | 1.000 | 1.000 | 1.000 |
| 0.500 | 0.500 | 0.500 | 0.500 | 0.500 | 0.500 | 0.500 | 0.500 | 0.500 | 0.500 | 0.500 | 0.500 |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ |
| ○ | x | ○ | ○ | ○ | ○ | ○ | ○ | x | ○ | ○ | ○ |
| ○ | x | ○ | ○ | ○ | ○ | ○ | ○ | x | ○ | ○ | ○ |

| Ex. III-C24 | Ex. III-C25 | Ex. III-C26 | Comp. Ex. III-C10 | Ex. III-C27 | Ex. III-C28 | Ex. III-C29 | Ex. III-C30 | Ex. III-C31 | Ex. III-C32 | Comp. Ex. III-C11 | Comp. Ex. III-C12 |
|---|---|---|---|---|---|---|---|---|---|---|---|
| 200 | 200 | 200 | 200 | 250 | 250 | 250 | 250 | 250 | 250 | 250 | 500 |
| 0.050 | 0.100 | 0.500 | 1.000 | 0.002 | 0.005 | 0.010 | 0.050 | 0.100 | 0.500 | 1.000 | 0.000 |
| 1.000 | 1.000 | 1.000 | 1.000 | 1.000 | 1.000 | 1.000 | 1.000 | 1.000 | 1.000 | 1.000 | 1.000 |
| 0.500 | 0.500 | 0.500 | 0.500 | 0.500 | 0.500 | 0.500 | 0.500 | 0.500 | 0.500 | 0.500 | 0.500 |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ |
| ○ | ○ | ○ | x | ○ | ○ | ○ | ○ | ○ | ○ | x | x |
| ○ | ○ | ○ | x | ○ | ○ | ○ | ○ | ○ | ○ | x | x |

Examples III-D1 to III-D32 and Comparative Examples III-D1 to III-D12

Sn, As, Sb, Ag and Cu were weighed to satisfy a content of Cu of 0.5% by mass, a content of Ag of 2.0% by mass, and the contents of As and Sb shown in Table IIID below with a balance of Sn (balance for making the sum of Sn, As, Sb, Ag and Cu 100% by mass), and were melt mixed, and the resultant was centrifugally sprayed in an Ar atmosphere to prepare a powder (average particle size: 21 μm, classified as No. 5 of the particle size classification). The thus obtained powder was heated with a drying apparatus in the air at 60° C. for 30 minutes to obtain a solder powder of each of examples and comparative examples. In Comparative Examples III-D1 to III-D6, however, a heat treatment was not performed but a powder as is obtained by the centrifugal spraying was used as a solder powder.

The content of As is shown in ppm by mass with respect to the total mass of the solder material and the contents of Sb, Ag and Cu are shown in % by mass with respect to the total mass of the solder material in the following tables.

A 3N material containing an incidental impurity was used as Sn.

Results of the evaluations of (1) the presence of an As-enriched layer, (2) the inhibition of viscosity increase, and (3) the solder wettability of the solder powders of the examples and comparative examples are shown in the following tables.

TABLE 26

TABLE IIID 2% Ag and 0.5% Cu added

| | | Comp. Ex. III-D1 | Comp. Ex. III-D2 | Comp. Ex. III-D3 | Comp. Ex. III-D4 | Comp. Ex. III-D5 | Comp. Ex. III-D6 | Ex. III-D1 | Ex. III-D2 | Ex III-D3 | Comp. Ex III-D7 | Ex. III-D4 |
|---|---|---|---|---|---|---|---|---|---|---|---|---|
| Composition | As (mass ppm) | 0 | 10 | 20 | 25 | 25 | 40 | 40 | 40 | 40 | 40 | 50 |
| | Sb (mass %) | 0.000 | 0.000 | 0.000 | 0.000 | 0.002 | 0.000 | 0.010 | 0.100 | 0.500 | 1.000 | 0.010 |
| | Ag (mass %) | 2.000 | 2.000 | 2.000 | 2.000 | 2.000 | 2.000 | 2.000 | 2.000 | 2.000 | 2.000 | 2.000 |
| | Cu (mass %) | 0.500 | 0.500 | 0.500 | 0.500 | 0.500 | 0.500 | 0.500 | 0.500 | 0.500 | 0.500 | 0.500 |

TABLE 26-continued

TABLE IIID 2% Ag and 0.5% Cu added

| | | | | | | | | | | | | |
|---|---|---|---|---|---|---|---|---|---|---|---|---|
| Evaluation | Presence of As-Enriched Layer | x | x | x | x | x | x | ○ | ○ | ○ | ○ | ○ |
| | Inhibition of Viscosity Increase | x | x | x | x | x | x | ○ | ○ | ○ | ○ | ○ |
| | Solder Wettability | ○ | ○ | ○ | ○ | ○ | ○ | ○ | ○ | ○ | x | ○ |
| | Comprehensive Evaluation | x | x | x | x | x | x | ○ | ○ | ○ | x | ○ |

| | | Ex. III-D5 | Ex. III-D6 | Ex. III-D7 | Ex. III-D8 | Ex. III-D9 | Ex. III-D10 | Ex. III-D11 | Ex III-D12 | Ex III-D13 |
|---|---|---|---|---|---|---|---|---|---|---|
| Composition | As (mass ppm) | 60 | 70 | 80 | 90 | 100 | 100 | 100 | 100 | 100 |
| | Sb (mass %) | 0.010 | 0.010 | 0.010 | 0.010 | 0.002 | 0.005 | 0.010 | 0.050 | 0.100 |
| | Ag (mass %) | 2.000 | 2.000 | 2.000 | 2.000 | 2.000 | 2.000 | 2.000 | 2.000 | 2.000 |
| | Cu (mass %) | 0.500 | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ | ○ |
| | Inhibition of Viscosity Increase | ○ | ○ | ○ | ○ | ○ | ○ | ○ | ○ | ○ |
| | Solder Wettability | ○ | ○ | ○ | ○ | ○ | ○ | ○ | ○ | ○ |
| | Comprehensive Evaluation | ○ | ○ | ○ | ○ | ○ | ○ | ○ | ○ | ○ |

TABLE 27

| Ex. III-D14 | Comp. Ex. III-D8 | Ex. III-D15 | Ex. III-D16 | Ex. III-D17 | Ex. III-D18 | Ex. III-D19 | Ex. III-D20 | Comp. Ex. III-D9 | Ex. III-D21 | Ex. III-D22 | Ex. III-D23 |
|---|---|---|---|---|---|---|---|---|---|---|---|
| 100 | 100 | 150 | 150 | 150 | 150 | 150 | 150 | 150 | 200 | 200 | 200 |
| 0.500 | 1.000 | 0.002 | 0.005 | 0.010 | 0.050 | 0.100 | 0.500 | 1.000 | 0.002 | 0.005 | 0.010 |
| 2.000 | 2.000 | 2.000 | 2.000 | 2.000 | 2.000 | 2.000 | 2.000 | 2.000 | 2.000 | 2.000 | 2.000 |
| 0.500 | 0.500 | 0.500 | 0.500 | 0.500 | 0.500 | 0.500 | 0.500 | 0.500 | 0.500 | 0.500 | 0.500 |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ |
| ○ | x | ○ | ○ | ○ | ○ | ○ | ○ | x | ○ | ○ | ○ |
| ○ | x | ○ | ○ | ○ | ○ | ○ | ○ | x | ○ | ○ | ○ |

| Ex. III-D24 | Ex. III-D25 | Ex. III-D26 | Comp. Ex. III-D10 | Ex. III-D27 | Ex. III-D28 | Ex. III-D29 | Ex. III-D30 | Ex. III-D31 | Ex. III-D32 | Comp. Ex. III-D11 | Comp. Ex. III-D12 |
|---|---|---|---|---|---|---|---|---|---|---|---|
| 200 | 200 | 200 | 200 | 250 | 250 | 250 | 250 | 250 | 250 | 250 | 500 |
| 0.050 | 0.100 | 0.500 | 1.000 | 0.002 | 0.005 | 0.010 | 0.050 | 0.100 | 0.500 | 1.000 | 0.000 |
| 2.000 | 2.000 | 2.000 | 2.000 | 2.000 | 2.000 | 2.000 | 2.000 | 2.000 | 2.000 | 2.000 | 2.000 |
| 0.500 | 0.500 | 0.500 | 0.500 | 0.500 | 0.500 | 0.500 | 0.500 | 0.500 | 0.500 | 0.500 | 0.500 |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ |
| ○ | ○ | ○ | x | ○ | ○ | ○ | ○ | ○ | ○ | x | x |
| ○ | ○ | ○ | x | ○ | ○ | ○ | ○ | ○ | ○ | x | x |

Examples III-E1 to III-E32 and Comparative Examples III-E1 to III-E12

Sn, As, Sb, Ag and Cu were weighed to satisfy a content of Cu of 0.5% by mass, a content of Ag of 3.0% by mass, and the contents of As and Sb shown in Table IIIE below with a balance of Sn (balance for making the sum of Sn, As, Sb, Ag and Cu 100% by mass), and were melt mixed, and the resultant was centrifugally sprayed in an Ar atmosphere to prepare a powder (average particle size: 21 μm, classified as No. 5 of the particle size classification). The thus obtained powder was heated with a drying apparatus in the air at 60° C. for 30 minutes to obtain a solder powder of each of examples and comparative examples. In Comparative Examples III-E1 to III-E6, however, a heat treatment was not performed but a powder as is obtained by the centrifugal spraying was used as a solder powder.

The content of As is shown in ppm by mass with respect to the total mass of the solder material and the contents of Sb, Ag and Cu are shown in % by mass with respect to the total mass of the solder material in the following tables.

A 3N material containing an incidental impurity was used as Sn.

Results of the evaluations of (1) the presence of an As-enriched layer, (2) the inhibition of viscosity increase, and (3) the solder wettability of the solder powders of the examples and comparative examples are shown in the following tables.

TABLE 28

TABLE IIIE 3% Ag and 0.5% Cu added

| | | Comp. Ex. III-E1 | Comp. Ex. III-E2 | Comp. Ex. III-E3 | Comp. Ex. III-E4 | Comp. Ex. III-E5 | Comp. Ex. III-E6 | Ex. III-E1 | Ex. III-E2 | Ex III-E3 | Comp. Ex III-E7 | Ex. III-E4 |
|---|---|---|---|---|---|---|---|---|---|---|---|---|
| Composition | As (mass ppm) | 0 | 10 | 20 | 25 | 25 | 40 | 40 | 40 | 40 | 40 | 50 |
| | Sb (mass %) | 0.000 | 0.000 | 0.000 | 0.000 | 0.002 | 0.000 | 0.010 | 0.100 | 0.500 | 1.000 | 0.010 |
| | Ag (mass %) | 3.000 | 3.000 | 3.000 | 3.000 | 3.000 | 3.000 | 3.000 | 3.000 | 3.000 | 3.000 | 3.000 |
| | Cu (mass %) | 0.500 | 0.500 | 0.500 | 0.500 | 0.500 | 0.500 | 0.500 | 0.500 | 0.500 | 0.500 | 0.500 |
| Evaluation | Presence of As-Enriched Layer | x | x | x | x | x | x | ○ | ○ | ○ | ○ | ○ |
| | Inhibition of Viscosity Increase | x | x | x | x | x | x | ○ | ○ | ○ | ○ | ○ |
| | Solder Wettability | ○ | ○ | ○ | ○ | ○ | ○ | ○ | ○ | ○ | x | ○ |
| | Comprehensive Evaluation | x | x | x | x | x | x | ○ | ○ | ○ | x | ○ |

| | | Ex. III-E5 | Ex. III-E6 | Ex. III-E7 | Ex. III-E8 | Ex. III-E9 | Ex. III-E10 | Ex. III-E11 | Ex III-E12 | Ex III-E13 |
|---|---|---|---|---|---|---|---|---|---|---|
| Composition | As (mass ppm) | 60 | 70 | 80 | 90 | 100 | 100 | 100 | 100 | 100 |
| | Sb (mass %) | 0.010 | 0.010 | 0.010 | 0.010 | 0.002 | 0.005 | 0.010 | 0.050 | 0.100 |
| | Ag (mass %) | 3.000 | 3.000 | 3.000 | 3.000 | 3.000 | 3.000 | 3.000 | 3.000 | 3.000 |
| | Cu (mass %) | 0.500 | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ | ○ |
| | Inhibition of Viscosity Increase | ○ | ○ | ○ | ○ | ○ | ○ | ○ | ○ | ○ |
| | Solder Wettability | ○ | ○ | ○ | ○ | ○ | ○ | ○ | ○ | ○ |
| | Comprehensive Evaluation | ○ | ○ | ○ | ○ | ○ | ○ | ○ | ○ | ○ |

TABLE 29

| | Ex. III-E14 | Comp. Ex. III-E8 | Ex. III-E15 | Ex. III-E16 | Ex. III-E17 | Ex. III-E18 | Ex. III-E19 | Ex. III-E20 | Comp. Ex. III-E9 | Ex. III-E21 | Ex. III-E22 | Ex. III-E23 |
|---|---|---|---|---|---|---|---|---|---|---|---|---|
| As (ppm) | 100 | 100 | 150 | 150 | 150 | 150 | 150 | 150 | 150 | 200 | 200 | 200 |
| Sb | 0.500 | 1.000 | 0.002 | 0.005 | 0.010 | 0.050 | 0.100 | 0.500 | 1.000 | 0.002 | 0.005 | 0.010 |
| Ag | 3.000 | 3.000 | 3.000 | 3.000 | 3.000 | 3.000 | 3.000 | 3.000 | 3.000 | 3.000 | 3.000 | 3.000 |
| Cu | 0.500 | 0.500 | 0.500 | 0.500 | 0.500 | 0.500 | 0.500 | 0.500 | 0.500 | 0.500 | 0.500 | 0.500 |
| Presence of As-Enriched Layer | ○ | ○ | ○ | ○ | ○ | ○ | ○ | ○ | ○ | ○ | ○ | ○ |
| Inhibition of Viscosity Increase | ○ | x | ○ | ○ | ○ | ○ | ○ | ○ | x | ○ | ○ | ○ |
| Solder Wettability | ○ | x | ○ | ○ | ○ | ○ | ○ | ○ | x | ○ | ○ | ○ |

| | Ex. III-E24 | Ex. III-E25 | Ex. III-E26 | Comp. Ex. III-E10 | Ex. III-E27 | Ex. III-E28 | Ex. III-E29 | Ex. III-E30 | Ex. III-E31 | Ex. III-E32 | Comp. Ex. III-E11 | Comp. Ex. III-E12 |
|---|---|---|---|---|---|---|---|---|---|---|---|---|
| As (ppm) | 200 | 200 | 200 | 200 | 250 | 250 | 250 | 250 | 250 | 250 | 250 | 500 |
| Sb | 0.050 | 0.100 | 0.500 | 1.000 | 0.002 | 0.005 | 0.010 | 0.050 | 0.100 | 0.500 | 1.000 | 0.000 |
| Ag | 3.000 | 3.000 | 3.000 | 3.000 | 3.000 | 3.000 | 3.000 | 3.000 | 3.000 | 3.000 | 3.000 | 3.000 |
| Cu | 0.500 | 0.500 | 0.500 | 0.500 | 0.500 | 0.500 | 0.500 | 0.500 | 0.500 | 0.500 | 0.500 | 0.500 |
| Presence of As-Enriched Layer | ○ | ○ | ○ | ○ | ○ | ○ | ○ | ○ | ○ | ○ | ○ | ○ |
| Inhibition of Viscosity Increase | ○ | ○ | ○ | ○ | ○ | ○ | ○ | ○ | ○ | ○ | ○ | ○ |
| Solder Wettability | ○ | ○ | ○ | x | ○ | ○ | ○ | ○ | ○ | ○ | x | x |

Examples III-F1 to III-F32 and Comparative Examples III-F1 to III-F12

Sn, As, Sb, Ag and Cu were weighed to satisfy a content of Cu of 0.5% by mass, a content of Ag of 3.5% by mass, and the contents of As and Sb shown in Table IIIF below with a balance of Sn (balance for making the sum of Sn, As, Sb, Ag and Cu 100% by mass), and were melt mixed, and the resultant was centrifugally sprayed in an Ar atmosphere to prepare a powder (average particle size: 21 μm, classified as No. 5 of the particle size classification). The thus obtained powder was heated with a drying apparatus in the air at 60° C. for 30 minutes to obtain a solder powder of each of examples and comparative examples. In Comparative Examples III-F1 to III-F6, however, a heat treatment was not performed but a powder as is obtained by the centrifugal spraying was used as a solder powder.

The content of As is shown in ppm by mass with respect to the total mass of the solder material and the contents of Sb, Ag and Cu are shown in % by mass with respect to the total mass of the solder material in the following tables.

A 3N material containing an incidental impurity was used as Sn.

Results of the evaluations of (1) the presence of an As-enriched layer, (2) the inhibition of viscosity increase, and (3) the solder wettability of the solder powders of the examples and comparative examples are shown in the following tables.

TABLE 30

TABLE IIIF 4% Ag and 0.5% Cu added

| | | Comp. Ex. III-F1 | Comp. Ex. III-F2 | Comp. Ex. III-F3 | Comp. Ex. III-F4 | Comp. Ex. III-F5 | Comp. Ex. III-F6 | Ex. III-F1 | Ex. III-F2 | Ex III-F3 | Comp. Ex III-F7 | Ex. III-F4 |
|---|---|---|---|---|---|---|---|---|---|---|---|---|
| Composition | As (mass ppm) | 0 | 10 | 20 | 25 | 25 | 40 | 40 | 40 | 40 | 40 | 50 |
| | Sb (mass %) | 0.000 | 0.000 | 0.000 | 0.000 | 0.002 | 0.000 | 0.010 | 0.100 | 0.500 | 1.000 | 0.010 |
| | Ag (mass %) | 4.000 | 4.000 | 4.000 | 4.000 | 4.000 | 4.000 | 4.000 | 4.000 | 4.000 | 4.000 | 4.000 |
| | Cu (mass %) | 0.500 | 0.500 | 0.500 | 0.500 | 0.500 | 0.500 | 0.500 | 0.500 | 0.500 | 0.500 | 0.500 |
| Evaluation | Presence of As-Enriched Layer | x | x | x | x | x | x | ○ | ○ | ○ | ○ | ○ |
| | Inhibition of Viscosity Increase | x | x | x | x | x | x | ○ | ○ | ○ | ○ | ○ |
| | Solder Wettability | ○ | ○ | ○ | ○ | ○ | ○ | ○ | ○ | ○ | x | ○ |

TABLE 30-continued

TABLE IIIF 4% Ag and 0.5% Cu added

| | | | | | | | | | | | | |
|---|---|---|---|---|---|---|---|---|---|---|---|---|
| Comprehensive Evaluation | | x | x | x | x | x | x | ○ | ○ | ○ | x | ○ |

| | | Ex. III-F5 | Ex. III-F6 | Ex. III-F7 | Ex. III-F8 | Ex. III-F9 | Ex. III-F10 | Ex. III-F11 | Ex III-F12 | Ex III-F13 |
|---|---|---|---|---|---|---|---|---|---|---|
| Composition | As (mass ppm) | 60 | 70 | 80 | 90 | 100 | 100 | 100 | 100 | 100 |
| | Sb (mass %) | 0.010 | 0.010 | 0.010 | 0.010 | 0.002 | 0.005 | 0.010 | 0.050 | 0.100 |
| | Ag (mass %) | 4.000 | 4.000 | 4.000 | 4.000 | 4.000 | 4.000 | 4.000 | 4.000 | 4.000 |
| | Cu (mass %) | 0.500 | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ | ○ |
| | Inhibition of Viscosity Increase | ○ | ○ | ○ | ○ | ○ | ○ | ○ | ○ | ○ |
| | Solder Wettability | ○ | ○ | ○ | ○ | ○ | ○ | ○ | ○ | ○ |
| | Comprehensive Evaluation | ○ | ○ | ○ | ○ | ○ | ○ | ○ | ○ | ○ |

TABLE 31

| Ex. III-F14 | Comp. Ex. III-F8 | Ex. III-F15 | Ex. III-F16 | Ex. III-F17 | Ex. III-F18 | Ex. III-F19 | Ex. III-F20 | Comp. Ex. III-F9 | Ex. III-F21 | Ex. III-F22 | Ex. III-F23 |
|---|---|---|---|---|---|---|---|---|---|---|---|
| 100 | 100 | 150 | 150 | 150 | 150 | 150 | 150 | 150 | 200 | 200 | 200 |
| 0.500 | 1.000 | 0.002 | 0.005 | 0.010 | 0.050 | 0.100 | 0.500 | 1.000 | 0.002 | 0.005 | 0.010 |
| 4.000 | 4.000 | 4.000 | 4.000 | 4.000 | 4.000 | 4.000 | 4.000 | 4.000 | 4.000 | 4.000 | 4.000 |
| 0.500 | 0.500 | 0.500 | 0.500 | 0.500 | 0.500 | 0.500 | 0.500 | 0.500 | 0.500 | 0.500 | 0.500 |
| ○ | ○ | ○ | ○ | ○ | ○ | ○ | ○ | ○ | ○ | ○ | ○ |
| ○ | x | ○ | ○ | ○ | ○ | ○ | ○ | x | ○ | ○ | ○ |
| ○ | ○ | ○ | ○ | ○ | ○ | ○ | ○ | ○ | ○ | ○ | ○ |
| ○ | x | ○ | ○ | ○ | ○ | ○ | ○ | x | ○ | ○ | ○ |

| Ex. III-F24 | Ex. III-F25 | Ex. III-F26 | Comp. Ex. III-F10 | Ex. III-F27 | Ex. III-F28 | Ex. III-F29 | Ex. III-F30 | Ex. III-F31 | Ex. III-F32 | Comp. Ex. III-F11 | Comp. Ex. III-F12 |
|---|---|---|---|---|---|---|---|---|---|---|---|
| 200 | 200 | 200 | 200 | 250 | 250 | 250 | 250 | 250 | 250 | 250 | 500 |
| 0.050 | 0.100 | 0.500 | 1.000 | 0.002 | 0.005 | 0.010 | 0.050 | 0.100 | 0.500 | 1.000 | 0.000 |
| 4.000 | 4.000 | 4.000 | 4.000 | 4.000 | 4.000 | 4.000 | 4.000 | 4.000 | 4.000 | 4.000 | 4.000 |
| 0.500 | 0.500 | 0.500 | 0.500 | 0.500 | 0.500 | 0.500 | 0.500 | 0.500 | 0.500 | 0.500 | 0.500 |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ |
| ○ | ○ | ○ | x | ○ | ○ | ○ | ○ | ○ | ○ | x | x |
| ○ | ○ | ○ | x | ○ | ○ | ○ | ○ | ○ | ○ | x | x |

IV. Sn—As—Pb-Containing Solder

Examples IV-A1 to IV-A35 and Comparative Examples IV-A1 to IV-A12

Sn, As and Pb were weighed to satisfy the contents of As and Pb shown in Table IVA below with a balance of Sn (balance for making the sum of Sn, As and Pb 100% by mass), and were melt mixed, and the resultant was centrifugally sprayed in an Ar atmosphere to prepare a powder (average particle size: 21 μm, classified as No. 5 of the particle size classification (Table 2) of JIS Z3284-1:2004). The thus obtained powder was heated with a drying apparatus in the air at 60° C. for 30 minutes to obtain a solder powder of each of examples and comparative examples. In Comparative Examples IV-A1 to IV-A6, however, a heat treatment was not performed but a powder as is obtained by the centrifugal spraying was used as a solder powder.

The content of As is shown in ppm by mass with respect to the total mass of the solder material and the content of Pb is shown in % by mass with respect to the total mass of the solder material in the following tables.

A 3N material containing an incidental impurity was used as Sn.

Results of the evaluations of (1) the presence of an As-enriched layer, (2) the inhibition of viscosity increase, (3) the solder wettability, and (4) the reliability of the solder powders of the examples and comparative examples are shown in the following tables.

TABLE 32

TABLE IVA

|  | Element | Comp. Ex. IV-A1 | Comp. Ex. IV-A2 | Comp. Ex. IV-A3 | Comp. Ex. IV-A4 | Comp. Ex. IV-A5 | Comp. Ex. IV-A6 | Ex. IV-A1 | Ex. IV-A2 |
|---|---|---|---|---|---|---|---|---|---|
| Composition | As (mass ppm) | 0 | 10 | 20 | 25 | 25 | 40 | 40 | 40 |
|  | Pb (mass %) | 0.000 | 0.000 | 0.000 | 0.000 | 0.002 | 0.000 | 0.010 | 0.700 |
| Evaluation | Presence of As-Enriched Layer | x | x | x | x | x | x | ○ | ○ |
|  | Inhibition of Viscosity Increase | x | x | x | x | x | x | ○ | ○ |
|  | Solder Wettability | ○ | ○ | ○ | ○ | ○ | ○ | ○ | ○ |
|  | Reliability ($\Delta T < 10°$ C.) | ○ | ○ | ○ | ○ | ○ | ○ | ○ | ○ |
|  | Comprehensive Evaluation | x | x | x | x | x | x | ○ | ○ |

|  | Element | Comp. Ex. IV-A7 | Ex. IV-A3 | Ex. IV-A4 | Ex. IV-A5 | Ex. IV-A6 | Ex. IV-A7 | Ex. IV-A8 | Ex. IV-A9 |
|---|---|---|---|---|---|---|---|---|---|
| Composition | As (mass ppm) | 40 | 50 | 60 | 70 | 80 | 90 | 100 | 100 |
|  | Pb (mass %) | 5.000 | 0.010 | 0.010 | 0.010 | 0.010 | 0.010 | 0.002 | 0.005 |
| Evaluation | Presence of As-Enriched Layer | ○ | ○ | ○ | ○ | ○ | ○ | ○ | ○ |
|  | Inhibition of Viscosity Increase | ○ | ○ | ○ | ○ | ○ | ○ | ○ | ○ |
|  | Solder Wettability | ○ | ○ | ○ | ○ | ○ | ○ | ○ | ○ |
|  | Reliability ($\Delta T < 10°$ C.) | x | ○ | ○ | ○ | ○ | ○ | ○ | ○ |
|  | Comprehensive Evaluation | x | ○ | ○ | ○ | ○ | ○ | ○ | ○ |

|  | Element | Ex. IV-A10 | Ex. IV-A11 | Ex IV-A12 | Ex IV-A13 | Ex. IV-A14 | Comp. Ex. IV-A8 |
|---|---|---|---|---|---|---|---|
| Composition | As (mass ppm) | 100 | 100 | 100 | 100 | 100 | 100 |
|  | Pb (mass %) | 0.010 | 0.050 | 0.100 | 0.500 | 0.700 | 5.000 |
| Evaluation | Presence of As-Enriched Layer | ○ | ○ | ○ | ○ | ○ | ○ |
|  | Inhibition of Viscosity Increase | ○ | ○ | ○ | ○ | ○ | ○ |
|  | Solder Wettability | ○ | ○ | ○ | ○ | ○ | ○ |
|  | Reliability ($\Delta T < 10°$ C.) | ○ | ○ | ○ | ○ | ○ | x |
|  | Comprehensive Evaluation | ○ | ○ | ○ | ○ | ○ | x |

TABLE 33

| | Ex. IV-A15 | Ex. IV-A16 | Ex. IV-A17 | Ex. IV-A18 | Ex. IV-A19 | Ex. IV-A20 | Ex. IV-A21 | Comp. Ex. IV-A9 | Ex. IV-A22 | Ex. IV-A23 | Ex. IV-A24 | Ex. IV-A25 | Ex. IV-A26 |
|---|---|---|---|---|---|---|---|---|---|---|---|---|---|
| | 150 | 150 | 150 | 150 | 150 | 150 | 150 | 150 | 200 | 200 | 200 | 200 | 200 |
| | 0.002 | 0.005 | 0.010 | 0.050 | 0.100 | 0.500 | 0.700 | 5.000 | 0.002 | 0.005 | 0.010 | 0.050 | 0.100 |
| | ○ | ○ | ○ | ○ | ○ | ○ | ○ | ○ | ○ | ○ | ○ | ○ | ○ |
| | ○ | ○ | ○ | ○ | ○ | ○ | ○ | ○ | ○ | ○ | ○ | ○ | ○ |
| | ○ | ○ | ○ | ○ | ○ | ○ | ○ | ○ | ○ | ○ | ○ | ○ | ○ |
| | ○ | ○ | ○ | ○ | ○ | ○ | ○ | x | ○ | ○ | ○ | ○ | ○ |
| | ○ | ○ | ○ | ○ | ○ | ○ | ○ | x | ○ | ○ | ○ | ○ | ○ |

| | Ex. IV-A27 | Ex. IV-A28 | Comp. Ex. IV-A10 | Ex. IV-A29 | Ex. IV-A30 | Ex. IV-A31 | Ex. IV-A32 | Ex. IV-A33 | Ex. IV-A34 | Ex. IV-A35 | Comp. Ex. IV-A11 | Comp. Ex. IV-A12 |
|---|---|---|---|---|---|---|---|---|---|---|---|---|
| | 200 | 200 | 200 | 250 | 250 | 250 | 250 | 250 | 250 | 250 | 250 | 500 |
| | 0.500 | 0.700 | 5.000 | 0.002 | 0.005 | 0.010 | 0.050 | 0.100 | 0.500 | 0.700 | 5.000 | 0.000 |
| | ○ | ○ | ○ | ○ | ○ | ○ | ○ | ○ | ○ | ○ | ○ | ○ |
| | ○ | ○ | ○ | ○ | ○ | ○ | ○ | ○ | ○ | ○ | ○ | ○ |
| | ○ | ○ | ○ | ○ | ○ | ○ | ○ | ○ | ○ | ○ | ○ | x |
| | ○ | ○ | x | ○ | ○ | ○ | ○ | ○ | ○ | ○ | x | ○ |
| | ○ | ○ | x | ○ | ○ | ○ | ○ | ○ | ○ | ○ | x | x |

Examples IV-B1 to IV-B35 and Comparative Examples IV-B1 to IV-B12

Sn, As, Pb and Cu were weighed to satisfy a content of Cu of 0.7% by mass and the contents of As and Pb shown in Table IVB below with a balance of Sn (balance for making the sum of Sn, As, Pb and Cu 100% by mass), and were melt mixed, and the resultant was centrifugally sprayed in an Ar atmosphere to prepare a powder (average particle size: 21 μm, classified as No. 5 of the particle size classification). The thus obtained powder was heated with a drying apparatus in the air at 60° C. for 30 minutes to obtain a solder powder of each of examples and comparative examples. In Comparative Examples B1 to B6, however, a heat treatment was not performed but a powder as is obtained by the centrifugal spraying was used as a solder powder.

The content of As is shown in ppm by mass with respect to the total mass of the solder material and the contents of Pb and Cu are shown in % by mass with respect to the total mass of the solder material in the following tables.

A 3N material containing an incidental impurity was used as Sn.

Results of the evaluations of (1) the presence of an As-enriched layer, (2) the inhibition of viscosity increase, (3) the solder wettability, and (4) the reliability of the solder powders of the examples and comparative examples are shown in the following tables.

TABLE 34

TABLE IVB 0% Ag and 0.7% Cu added

| | Element | Comp. Ex. IV-B1 | Comp. Ex. IV-B2 | Comp. Ex. IV-B3 | Comp. Ex. IV-B4 | Comp. Ex. IV-B5 | Comp. Ex. IV-B6 | Ex. IV-B1 | Ex. IV-B2 |
|---|---|---|---|---|---|---|---|---|---|
| Composition | As (mass ppm) | 0 | 10 | 20 | 25 | 25 | 40 | 40 | 40 |
| | Pb (mass %) | 0.000 | 0.000 | 0.000 | 0.000 | 0.002 | 0.000 | 0.010 | 0.700 |
| | Cu (mass %) | 0.700 | 0.700 | 0.700 | 0.700 | 0.700 | 0.700 | 0.700 | 0.700 |
| Evaluation | Presence of As-Enriched Layer | x | x | x | x | x | x | ○ | ○ |
| | Inhibition of Viscosity Increase | x | x | x | x | x | x | ○ | ○ |
| | Solder Wettability | ○ | ○ | ○ | ○ | ○ | ○ | ○ | ○ |
| | Reliability (ΔT < 10° C.) | ○ | ○ | ○ | ○ | ○ | ○ | ○ | ○ |
| | Comprehensive Evaluation | x | x | x | x | x | x | ○ | ○ |

TABLE 34-continued

TABLE IVB 0% Ag and 0.7% Cu added

| | Element | Comp. Ex. IV-B7 | Ex. IV-B3 | Ex. IV-B4 | Ex. IV-B5 | Ex. IV-B6 | Ex. IV-B7 | Ex. IV-B8 | Ex. IV-B9 |
|---|---|---|---|---|---|---|---|---|---|
| Composition | As (mass ppm) | 40 | 50 | 60 | 70 | 80 | 90 | 100 | 100 |
| | Pb (mass %) | 5.000 | 0.010 | 0.010 | 0.010 | 0.010 | 0.010 | 0.002 | 0.005 |
| | Cu (mass %) | 0.700 | 0.700 | 0.700 | 0.700 | 0.700 | 0.700 | 0.700 | 0.700 |
| Evaluation | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability (ΔT < 10° C.) | x | ○ | ○ | ○ | ○ | ○ | ○ | ○ |
| | Comprehensive Evaluation | x | ○ | ○ | ○ | ○ | ○ | ○ | ○ |

| | Element | Ex. IV-B10 | Ex. IV-B11 | Ex IV-B12 | Ex IV-B13 | Ex. IV-B14 | Comp. Ex. IV-B8 |
|---|---|---|---|---|---|---|---|
| Composition | As (mass ppm) | 100 | 100 | 100 | 100 | 100 | 100 |
| | Pb (mass %) | 0.010 | 0.050 | 0.100 | 0.500 | 0.700 | 5.000 |
| | Cu (mass %) | 0.700 | 0.700 | 0.700 | 0.700 | 0.700 | 0.700 |
| Evaluation | Presence of As-Enriched Layer | ○ | ○ | ○ | ○ | ○ | ○ |
| | Inhibition of Viscosity Increase | ○ | ○ | ○ | ○ | ○ | ○ |
| | Solder Wettability | ○ | ○ | ○ | ○ | ○ | ○ |
| | Reliability (ΔT < 10° C.) | ○ | ○ | ○ | ○ | ○ | x |
| | Comprehensive Evaluation | ○ | ○ | ○ | ○ | ○ | x |

TABLE 35

| Ex. IV-B15 | Ex. IV-B16 | Ex. IV-B17 | Ex. IV-B18 | Ex. IV-B19 | Ex. IV-B20 | Ex. IV-B21 | Comp. Ex. IV-B9 | Ex. IV-B22 | Ex. IV-B23 | Ex. IV-B24 | Ex. IV-B25 | Ex. IV-B26 |
|---|---|---|---|---|---|---|---|---|---|---|---|---|
| 150 | 150 | 150 | 150 | 150 | 150 | 150 | 150 | 200 | 200 | 200 | 200 | 200 |
| 0.002 | 0.005 | 0.010 | 0.050 | 0.100 | 0.500 | 0.700 | 5.000 | 0.002 | 0.005 | 0.010 | 0.050 | 0.100 |
| 0.700 | 0.700 | 0.700 | 0.700 | 0.700 | 0.700 | 0.700 | 0.700 | 0.700 | 0.700 | 0.700 | 0.700 | 0.700 |
| ○ | ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ | ○ |
| ○ | ○ | ○ | ○ | ○ | ○ | ○ | x | ○ | ○ | ○ | ○ | ○ |
| ○ | ○ | ○ | ○ | ○ | ○ | ○ | x | ○ | ○ | ○ | ○ | ○ |

| Ex. IV-B27 | Ex. IV-B28 | Comp. Ex. IV-B10 | Ex. IV-B29 | Ex. IV-B30 | Ex. IV-B31 | Ex. IV-B32 | Ex. IV-B33 | Ex. IV-B34 | Ex. IV-B35 | Comp. Ex. IV-B11 | Comp. Ex. IV-812 |
|---|---|---|---|---|---|---|---|---|---|---|---|
| 200 | 200 | 200 | 250 | 250 | 250 | 250 | 250 | 250 | 250 | 250 | 500 |
| 0.500 | 0.700 | 5.000 | 0.002 | 0.005 | 0.010 | 0.050 | 0.100 | 0.500 | 0.700 | 5.000 | 0.000 |
| 0.700 | 0.700 | 0.700 | 0.700 | 0.700 | 0.700 | 0.700 | 0.700 | 0.700 | 0.700 | 0.700 | 0.700 |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | x |
| ○ | ○ | x | ○ | ○ | ○ | ○ | ○ | ○ | ○ | x | x |
| ○ | ○ | x | ○ | ○ | ○ | ○ | ○ | ○ | ○ | x | x |

Examples IV-C1 to IV-C35 and Comparative Examples IV-C1 to IV-C12

Sn, As, Pb, Ag and Cu were weighed to satisfy a content of Cu of 0.5% by mass, a content of Ag of 1.0% by mass, and the contents of As and Pb shown in Table IVC below with a balance of Sn (balance for making the sum of Sn, As, Pb, Ag and Cu 100% by mass), and were melt mixed, and the resultant was centrifugally sprayed in an Ar atmosphere to prepare a powder (average particle size: 21 μm, classified as No. 5 of the particle size classification). The thus obtained powder was heated with a drying apparatus in the air at 60° C. for 30 minutes to obtain a solder powder of each of examples and comparative examples. In Comparative Examples IV-C1 to IV-C6, however, a heat treatment was not performed but a powder as is obtained by the centrifugal spraying was used as a solder powder.

The content of As is shown in ppm by mass with respect to the total mass of the solder material and the contents of Pb, Ag and Cu are shown in % by mass with respect to the total mass of the solder material in the following tables.

A 3N material containing an incidental impurity was used as Sn.

The solder powder obtained in Example IV-C1 was analyzed for the contents of Sn, As, Pb, Ag and Cu by ICP-AES in accordance with JIS Z 3910, and it was confirmed that these contents accorded with those of the starting materials.

Results of the evaluations of (1) the presence of an As-enriched layer, (2) the inhibition of viscosity increase, (3) the solder wettability, and (4) the reliability of the solder powders of the examples and comparative examples are shown in the following tables.

TABLE 36

TABLE IVC 1% Ag and 0.5% Cu added

| | Element | Comp. Ex. IV-C1 | Comp. Ex. IV-C2 | Comp. Ex. IV-C3 | Comp. Ex. IV-C4 | Comp. Ex. IV-C5 | Comp. Ex. IV-C6 | Ex. IV-C1 | Ex. IV-C2 |
|---|---|---|---|---|---|---|---|---|---|
| Composition | As (mass ppm) | 0 | 10 | 20 | 25 | 25 | 40 | 40 | 40 |
| | Pb (mass %) | 0.000 | 0.000 | 0.000 | 0.000 | 0.002 | 0.000 | 0.010 | 0.700 |
| | Ag (mass %) | 1.000 | 1.000 | 1.000 | 1.000 | 1.000 | 1.000 | 1.000 | 1.000 |
| | Cu (mass %) | 0.500 | 0.500 | 0.500 | 0.500 | 0.500 | 0.500 | 0.500 | 0.500 |
| Evaluation | Presence of As-Enriched Layer | x | x | x | x | x | x | ○ | ○ |
| | Inhibition of Viscosity Increase | x | x | x | x | x | x | ○ | ○ |
| | Solder Wettability | ○ | ○ | ○ | ○ | ○ | ○ | ○ | ○ |
| | Reliability (ΔT < 10° C.) | ○ | ○ | ○ | ○ | ○ | ○ | ○ | ○ |
| | Comprehensive Evaluation | x | x | x | x | x | x | ○ | ○ |

| | Element | Comp. Ex. IV-C7 | Ex. IV-C3 | Ex. IV-C4 | Ex. IV-C5 | Ex. IV-C6 | Ex. IV-C7 | Ex. IV-C8 | Ex. IV-C9 |
|---|---|---|---|---|---|---|---|---|---|
| Composition | As (mass ppm) | 40 | 50 | 60 | 70 | 80 | 90 | 100 | 100 |
| | Pb (mass %) | 5.000 | 0.010 | 0.010 | 0.010 | 0.010 | 0.010 | 0.002 | 0.005 |
| | Ag (mass %) | 1.000 | 1.000 | 1.000 | 1.000 | 1.000 | 1.000 | 1.000 | 1.000 |
| | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability (ΔT < 10° C.) | x | ○ | ○ | ○ | ○ | ○ | ○ | ○ |
| | Comprehensive Evaluation | x | ○ | ○ | ○ | ○ | ○ | ○ | ○ |

| | Element | Ex. IV-C10 | Ex. IV-C11 | Ex. IV-C12 | Ex. IV-C13 | Ex. IV-C14 | Comp. Ex. IV-C8 |
|---|---|---|---|---|---|---|---|
| Composition | As (mass ppm) | 100 | 100 | 100 | 100 | 100 | 100 |
| | Pb (mass %) | 0.010 | 0.050 | 0.100 | 0.500 | 0.700 | 5.000 |
| | Ag (mass %) | 1.000 | 1.000 | 1.000 | 1.000 | 1.000 | 1.000 |
| | Cu (mass %) | 0.500 | 0.500 | 0.500 | 0.500 | 0.500 | 0.500 |
| Evaluation | Presence of As-Enriched Layer | ○ | ○ | ○ | ○ | ○ | ○ |

TABLE 36-continued

TABLE IVC 1% Ag and 0.5% Cu added

|  |  |  |  |  |  |  |
|---|---|---|---|---|---|---|
| Inhibition of Viscosity Increase | ○ | ○ | ○ | ○ | ○ | ○ |
| Solder Wettability | ○ | ○ | ○ | ○ | ○ | ○ |
| Reliability (ΔT < 10° C.) | ○ | ○ | ○ | ○ | ○ | x |
| Comprehensive Evaluation | ○ | ○ | ○ | ○ | ○ | x |

TABLE 37

| Ex. IV-C5 | Ex. IV-C16 | Ex. IV-C17 | Ex. IVC18 | Ex IV-C19 | Ex. IV-C20 | Ex. IV-C21 | Comp. Ex. IV-C9 | Ex. IV-C22 | Ex. IV-C23 | Ex. IV-C24 | Ex. IV-C25 | Ex. IV-C26 |
|---|---|---|---|---|---|---|---|---|---|---|---|---|
| 150 | 150 | 150 | 150 | 150 | 150 | 150 | 150 | 200 | 200 | 200 | 200 | 200 |
| 0.002 | 0.005 | 0.010 | 0.050 | 0.100 | 0.500 | 0.700 | 5.000 | 0.002 | 0.005 | 0.010 | 0.050 | 0.100 |
| 1.000 | 1.000 | 1.000 | 1.000 | 1.000 | 1.000 | 1.000 | 1.000 | 1.000 | 1.000 | 1.000 | 1.000 | 1.000 |
| 0.530 | 0.500 | 0.500 | 0.500 | 0.500 | 0.500 | 0.500 | 0.500 | 0.500 | 0.500 | 0.500 | 0.500 | 0.500 |
| ○ | ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ | ○ |
| ○ | ○ | ○ | ○ | ○ | ○ | ○ | x | ○ | ○ | ○ | ○ | ○ |
| ○ | ○ | ○ | ○ | ○ | ○ | ○ | x | ○ | ○ | ○ | ○ | ○ |

| Ex. IV-C27 | Ex. IV-C28 | Comp. Ex. IV-C10 | Ex. IV-C29 | Ex. IV-C30 | Ex. IV-C31 | Ex. IV-C32 | Ex. IV-C33 | Ex. IV-C34 | Ex. IV-C35 | Comp. Ex. IV-C11 | Comp. Ex. IV-C12 |
|---|---|---|---|---|---|---|---|---|---|---|---|
| 200 | 200 | 200 | 250 | 250 | 250 | 250 | 250 | 250 | 250 | 250 | 500 |
| 0.500 | 0.700 | 5.000 | 0.002 | 0.005 | 0.010 | 0.050 | 0.100 | 0.500 | 0.700 | 5.000 | 0.000 |
| 1.000 | 1.000 | 1.000 | 1.000 | 1.000 | 1.000 | 1.000 | 1.000 | 1.000 | 1.000 | 1.000 | 1.000 |
| 0.500 | 0.500 | 0.500 | 0.500 | 0.500 | 0.500 | 0.500 | 0.500 | 0.500 | 0.500 | 0.500 | 0.500 |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | x |
| ○ | ○ | x | ○ | ○ | ○ | ○ | ○ | ○ | ○ | x | x |
| ○ | ○ | x | ○ | ○ | ○ | ○ | ○ | ○ | ○ | x | x |

Examples IV-D1 to IV-D35 and Comparative Examples IV-D1 to IV-D12

Sn, As, Pb, Ag and Cu were weighed to satisfy a content of Cu of 0.5% by mass, a content of Ag of 2.0% by mass, and the contents of As and Pb shown in Table IVD below with a balance of Sn (balance for making the sum of Sn, As, Pb, Ag and Cu 100% by mass), and were melt mixed, and the resultant was centrifugally sprayed in an Ar atmosphere to prepare a powder (average particle size: 21 μm, classified as No. 5 of the particle size classification). The thus obtained powder was heated with a drying apparatus in the air at 60° C. for 30 minutes to obtain a solder powder of each of examples and comparative examples. In Comparative Examples IV-D1 to IV-D6, however, a heat treatment was not performed but a powder as is obtained by the centrifugal spraying was used as a solder powder.

The content of As is shown in ppm by mass with respect to the total mass of the solder material and the contents of Pb, Ag and Cu are shown in % by mass with respect to the total mass of the solder material in the following tables.

A 3N material containing an incidental impurity was used as Sn.

Results of the evaluations of (1) the presence of an As-enriched layer, (2) the inhibition of viscosity increase, (3) the solder wettability, and (4) the reliability of the solder powders of the examples and comparative examples are shown in the following tables.

TABLE 38

TABLE IVD 2% Ag and 0.5% Cu added

|  | Element | Comp. Ex. IV-D1 | Comp. Ex. IV-D2 | Comp. Ex. IV-D3 | Comp. Ex. IV-D4 | Comp. Ex. IV-D5 | Comp. Ex. IV-D6 | Ex. IV-D1 | Ex. IV-D2 |
|---|---|---|---|---|---|---|---|---|---|
| Composition | As (mass ppm) | 0 | 10 | 20 | 25 | 25 | 40 | 40 | 40 |
|  | Pb (mass %) | 0.000 | 0.000 | 0.000 | 0.000 | 0.002 | 0.000 | 0.010 | 0.700 |
|  | Ag (mass %) | 2.000 | 2.000 | 2.000 | 2.000 | 2.000 | 2.000 | 2.000 | 2.000 |
|  | Cu (mass %) | 0.500 | 0.500 | 0.500 | 0.500 | 0.500 | 0.500 | 0.500 | 0.500 |

TABLE 38-continued

TABLE IVD 2% Ag and 0.5% Cu added

| | | | | | | | | | |
|---|---|---|---|---|---|---|---|---|---|
| Evaluation | Presence of As-Enriched Layer | x | x | x | x | x | x | ○ | ○ |
| | Inhibition of Viscosity Increase | x | x | x | x | x | x | ○ | ○ |
| | Solder Wettability | ○ | ○ | ○ | ○ | ○ | ○ | ○ | ○ |
| | Reliability (ΔT < 10° C.) | ○ | ○ | ○ | ○ | ○ | ○ | ○ | ○ |
| | Comprehensive Evaluation | x | x | x | x | x | x | ○ | ○ |

| | Element | Comp. Ex. IV-D7 | Ex. IV-D3 | Ex. IV-D4 | Ex. IV-D5 | Ex. IV-D6 | Ex. IV-D7 | Ex. IV-D8 | Ex. IV-D9 |
|---|---|---|---|---|---|---|---|---|---|
| Composition | As (mass ppm) | 40 | 50 | 60 | 70 | 80 | 90 | 100 | 100 |
| | Pb (mass %) | 5.000 | 0.010 | 0.010 | 0.010 | 0.010 | 0.010 | 0.002 | 0.005 |
| | Ag (mass %) | 2.000 | 2.000 | 2.000 | 2.000 | 2.000 | 2.000 | 2.000 | 2.000 |
| | Cu (mass %) | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability (ΔT < 10° C.) | x | ○ | ○ | ○ | ○ | ○ | ○ | ○ |
| | Comprehensive Evaluation | x | ○ | ○ | ○ | ○ | ○ | ○ | ○ |

| | Element | Ex. IV-D10 | Ex. IV-D11 | Ex. IV-D12 | Ex. IV-D13 | Ex. IV-D14 | Comp. Ex. IV-D8 |
|---|---|---|---|---|---|---|---|
| Composition | As (mass ppm) | 100 | 100 | 100 | 100 | 100 | 100 |
| | Pb (mass %) | 0.010 | 0.050 | 0.100 | 0.500 | 0.700 | 5.000 |
| | Ag (mass %) | 2.000 | 2.000 | 2.000 | 2.000 | 2.000 | 2.000 |
| | Cu (mass %) | 0.500 | 0.500 | 0.500 | 0.500 | 0.500 | 0.500 |
| Evaluation | Presence of As-Enriched Layer | ○ | ○ | ○ | ○ | ○ | ○ |
| | Inhibition of Viscosity Increase | ○ | ○ | ○ | ○ | ○ | ○ |
| | Solder Wettability | ○ | ○ | ○ | ○ | ○ | ○ |
| | Reliability (ΔT < 10° C.) | ○ | ○ | ○ | ○ | ○ | x |
| | Comprehensive Evaluation | ○ | ○ | ○ | ○ | ○ | x |

TABLE 39

| Ex. IV-D15 | Ex. IVD16 | Ex. IV-D17 | Ex. IV-D18 | Ex. IV-D19 | Ex. IV-D20 | Ex. IV-D21 | Comp. Ex. IV-D9 | Ex. IV-D22 | Ex. IV-D23 | Ex. IV-D24 | Ex. IV-D25 | Ex. IV-D26 |
|---|---|---|---|---|---|---|---|---|---|---|---|---|
| 150 | 150 | 150 | 150 | 150 | 150 | 150 | 150 | 200 | 200 | 200 | 200 | 200 |
| 0.002 | 0.005 | 0.010 | 0.050 | 0.100 | 0.500 | 0.700 | 5.000 | 0.002 | 0.005 | 0.010 | 0.050 | 0.100 |
| 2.000 | 2.000 | 2.000 | 2.000 | 2.000 | 2.000 | 2.000 | 2.000 | 2.000 | 2.000 | 2.000 | 2.000 | 2.000 |
| 0.500 | 0.500 | 0.500 | 0.500 | 0.500 | 0.500 | 0.500 | 0.500 | 0.500 | 0.500 | 0.500 | 0.500 | 0.500 |
| ○ | ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ | ○ |
| ○ | ○ | ○ | ○ | ○ | ○ | ○ | x | ○ | ○ | ○ | ○ | ○ |
| ○ | ○ | ○ | ○ | ○ | ○ | ○ | x | ○ | ○ | ○ | ○ | ○ |

| Ex. IV-D27 | Ex. IV-D28 | Comp. Ex. IV-D10 | Ex. IV-D29 | Ex. IV-D30 | Ex. IV-D31 | Ex. IV-D32 | Ex. IV-D33 | Ex. IV-D34 | Ex. IV-D35 | Comp. Ex. IV-D11 | Comp. Ex. IV-D12 |
|---|---|---|---|---|---|---|---|---|---|---|---|
| 200 | 200 | 200 | 250 | 250 | 250 | 250 | 250 | 250 | 250 | 250 | 500 |
| 0.500 | 0.700 | 5.000 | 0.002 | 0.005 | 0.010 | 0.050 | 0.100 | 0.500 | 0.700 | 5.000 | 0.000 |

TABLE 39-continued

| | | | | | | | | | | | |
|---|---|---|---|---|---|---|---|---|---|---|---|
| 2.000 | 2.000 | 2.000 | 2.000 | 2.000 | 2.000 | 2.000 | 2.000 | 2.000 | 2.000 | 2.000 | 2.000 |
| 0.500 | 0.500 | 0.500 | 0.500 | 0.500 | 0.500 | 0.500 | 0.500 | 0.500 | 0.500 | 0.500 | 0.500 |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | x |
| ○ | ○ | x | ○ | ○ | ○ | ○ | ○ | ○ | ○ | x | x |
| ○ | ○ | x | ○ | ○ | ○ | ○ | ○ | ○ | ○ | x | x |

Examples IV-E1 to IV-E35 and Comparative Examples IV-E1 to IV-E12

Sn, As, Pb, Ag and Cu were weighed to satisfy a content of Cu of 0.5% by mass, a content of Ag of 3.0% by mass, and the contents of As and Pb shown in Table IVE below with a balance of Sn (balance for making the sum of Sn, As, Pb, Ag and Cu 100% by mass), and were melt mixed, and the resultant was centrifugally sprayed in an Ar atmosphere to prepare a powder (average particle size: 21 µm, classified as No. 5 of the particle size classification). The thus obtained powder was heated with a drying apparatus in the air at 60° C. for 30 minutes to obtain a solder powder of each of examples and comparative examples. In Comparative Examples IV-E1 to IV-E6, however, a heat treatment was not performed but a powder as is obtained by the centrifugal spraying was used as a solder powder.

The content of As is shown in ppm by mass with respect to the total mass of the solder material and the contents of Pb, Ag and Cu are shown in % by mass with respect to the total mass of the solder material in the following tables.

A 3N material containing an incidental impurity was used as Sn.

Results of the evaluations of (1) the presence of an As-enriched layer, (2) the inhibition of viscosity increase, (3) the solder wettability, and (4) the reliability of the solder powders of the examples and comparative examples are shown in the following tables.

TABLE 40

TABLE IVE 3% Ag and 0.5% Cu added

| | Element | Comp. Ex. IV-E1 | Comp. Ex. IV-E2 | Comp. Ex. IV-E3 | Comp. Ex. IV-E4 | Comp. Ex. IV-E5 | Comp. Ex. IV-E6 | Ex. IV-E1 | Ex. IV-E2 |
|---|---|---|---|---|---|---|---|---|---|
| Composition | As (mass ppm) | 0 | 10 | 20 | 25 | 25 | 40 | 40 | 40 |
| | Pb (mass %) | 0.000 | 0.000 | 0.000 | 0.000 | 0.002 | 0.000 | 0.010 | 0.700 |
| | Ag (mass %) | 3.000 | 3.000 | 3.000 | 3.000 | 3.000 | 3.000 | 3.000 | 3.000 |
| | Cu (mass %) | 0.500 | 0.500 | 0.500 | 0.500 | 0.500 | 0.500 | 0.500 | 0.500 |
| Evaluation | Presence of As-Enriched Layer | x | x | x | x | x | x | ○ | ○ |
| | Inhibition of Viscosity Increase | x | x | x | x | x | x | ○ | ○ |
| | Solder Wettability | ○ | ○ | ○ | ○ | ○ | ○ | ○ | ○ |
| | Reliability ($\Delta T < 10°$ C.) | ○ | ○ | ○ | ○ | ○ | ○ | ○ | ○ |
| | Comprehensive Evaluation | x | x | x | x | x | x | ○ | ○ |

| | Element | Comp. Ex. IV-E7 | Ex. IV-E3 | Ex. IV-E4 | Ex. IV-E5 | Ex. IV-E6 | Ex. IV-E7 | Ex. IV-E8 | Ex. IV-E9 |
|---|---|---|---|---|---|---|---|---|---|
| Composition | As (mass ppm) | 40 | 50 | 60 | 70 | 80 | 90 | 100 | 100 |
| | Pb (mass %) | 5.000 | 0.010 | 0.010 | 0.010 | 0.010 | 0.010 | 0.002 | 0.005 |
| | Ag (mass %) | 3.000 | 3.000 | 3.000 | 3.000 | 3.000 | 3.000 | 3.000 | 3.000 |
| Evaluation | Cu (mass %) | 0.500 | 0.500 | 0.500 | 0.500 | 0.500 | 0.500 | 0.500 | 0.500 |
| | Presence of As-Enriched Layer | ○ | ○ | ○ | ○ | ○ | ○ | ○ | ○ |
| | Inhibition of Viscosity Increase | ○ | ○ | ○ | ○ | ○ | ○ | ○ | ○ |
| | Solder Wettability | ○ | ○ | ○ | ○ | ○ | ○ | ○ | ○ |
| | Reliability ($\Delta T < 10°$ C.) | x | ○ | ○ | ○ | ○ | ○ | ○ | ○ |
| | Comprehensive Evaluation | x | ○ | ○ | ○ | ○ | ○ | ○ | ○ |

| | Element | Ex. IV-E10 | Ex. IV-E11 | Ex. IV-E12 | Ex. IV-E13 | Ex. IV-E14 | Comp. Ex. IV-E8 |
|---|---|---|---|---|---|---|---|
| Composition | As (mass ppm) | 100 | 100 | 100 | 100 | 100 | 100 |
| | Pb (mass %) | 0.010 | 0.050 | 0.100 | 0.500 | 0.700 | 5.000 |
| | Ag (mass %) | 3.000 | 3.000 | 3.000 | 3.000 | 3.000 | 3.000 |
| | Cu (mass %) | 0.500 | 0.500 | 0.500 | 0.500 | 0.500 | 0.500 |
| Evaluation | Presence of As-Enriched Layer | ○ | ○ | ○ | ○ | ○ | ○ |

TABLE 40-continued

TABLE IVE 3% Ag and 0.5% Cu added

| | | | | | | |
|---|---|---|---|---|---|---|
| Inhibition of Viscosity Increase | ○ | ○ | ○ | ○ | ○ | ○ |
| Solder Wettability | ○ | ○ | ○ | ○ | ○ | ○ |
| Reliability (ΔT < 10° C.) | ○ | ○ | ○ | ○ | ○ | x |
| Comprehensive Evaluation | ○ | ○ | ○ | ○ | ○ | x |

TABLE 41

| Ex. IV-E15 | Ex. IV-E16 | Ex. IV-E17 | Ex. IV-E18 | Ex. IV-E19 | Ex. IV-E20 | Ex. IV-E21 | Comp. Ex. IV-E9 | Ex. IV-E22 | Ex. IV-E23 | Ex. IV-E24 | Ex. IV-E25 | Ex. IV-E26 |
|---|---|---|---|---|---|---|---|---|---|---|---|---|
| 150 | 150 | 150 | 150 | 150 | 150 | 150 | 150 | 200 | 200 | 200 | 200 | 200 |
| 0.002 | 0.005 | 0.010 | 0.050 | 0.100 | 0.500 | 0.700 | 5.000 | 0.002 | 0.005 | 0.010 | 0.050 | 0.100 |
| 3.000 | 3.000 | 3.000 | 3.000 | 3.000 | 3.000 | 3.000 | 3.000 | 3.000 | 3.000 | 3.000 | 3.000 | 3.000 |
| 0.500 | 0.500 | 0.500 | 0.500 | 0.500 | 0.500 | 0.500 | 0.500 | 0.500 | 0.500 | 0.500 | 0.500 | 0.500 |
| ○ | ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ | ○ |
| ○ | ○ | ○ | ○ | ○ | ○ | ○ | x | ○ | ○ | ○ | ○ | ○ |
| ○ | ○ | ○ | ○ | ○ | ○ | ○ | x | ○ | ○ | ○ | ○ | ○ |

| Ex. IV-E27 | Ex. IV-E28 | Comp. Ex. IV-E10 | Ex. IV-E29 | Ex. IV-E30 | Ex. IV-E31 | Ex. IV-E32 | Ex. IV-E33 | Ex. IV-E34 | Ex. IV-E35 | Comp. Ex. IV-E11 | Comp. Ex. IV-E12 |
|---|---|---|---|---|---|---|---|---|---|---|---|
| 200 | 200 | 200 | 250 | 250 | 250 | 250 | 250 | 250 | 250 | 250 | 500 |
| 0.500 | 0.700 | 5.000 | 0.002 | 0.005 | 0.010 | 0.050 | 0.100 | 0.500 | 0.700 | 5.000 | 0.000 |
| 3.000 | 3.000 | 3.000 | 3.000 | 3.000 | 3.000 | 3.000 | 3.000 | 3.000 | 3.000 | 3.000 | 3.000 |
| 0.500 | 0.500 | 0.500 | 0.500 | 0.500 | 0.500 | 0.500 | 0.500 | 0.500 | 0.500 | 0.500 | 0.500 |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | x |
| ○ | ○ | x | ○ | ○ | ○ | ○ | ○ | ○ | ○ | x | x |
| ○ | ○ | x | ○ | ○ | ○ | ○ | ○ | ○ | ○ | x | x |

Examples IV-F1 to IV-F35 and Comparative Examples IV-F1 to IV-F12

Sn, As, Pb, Ag and Cu were weighed to satisfy a content of Cu of 0.5% by mass, a content of Ag of 3.5% by mass, and the contents of As and Pb shown in Table IVF below with a balance of Sn (balance for making the sum of Sn, As, Pb, Ag and Cu 100% by mass), and were melt mixed, and the resultant was centrifugally sprayed in an Ar atmosphere to prepare a powder (average particle size: 21 μm, classified as No. 5 of the particle size classification). The thus obtained powder was heated with a drying apparatus in the air at 60° C. for 30 minutes to obtain a solder powder of each of examples and comparative examples. In Comparative Examples IV-F1 to IV-F6, however, a heat treatment was not performed but a powder as is obtained by the centrifugal spraying was used as a solder powder.

The content of As is shown in ppm by mass with respect to the total mass of the solder material and the contents of Pb, Ag and Cu are shown in % by mass with respect to the total mass of the solder material in the following tables.

A 3N material containing an incidental impurity was used as Sn.

Results of the evaluations of (1) the presence of an As-enriched layer, (2) the inhibition of viscosity increase, (3) the solder wettability, and (4) the reliability of the solder powders of the examples and comparative examples are shown in the following tables.

TABLE 42

TABLE IVF 3.5% Ag and 0.5% Cu added

| | Element | Comp. Ex. IV-F1 | Comp. Ex. IV-F2 | Comp. Ex. IV-F3 | Comp. Ex. IV-F4 | Comp. Ex. IV-F5 | Comp. Ex. IV-F6 | Ex. IV-F1 | Ex. IV-F2 | Comp. Ex. IV-F7 |
|---|---|---|---|---|---|---|---|---|---|---|
| Composition | As (mass ppm) | 0 | 10 | 20 | 25 | 25 | 40 | 40 | 40 | 40 |
| | Pb (mass %) | 0.000 | 0.000 | 0.000 | 0.000 | 0.002 | 0.000 | 0.010 | 0.700 | 5.000 |
| | Ag (mass %) | 3.500 | 3.500 | 3.500 | 3.500 | 3.500 | 3.500 | 3.500 | 3.500 | 3.500 |
| | Cu (mass %) | 0.500 | 0.500 | 0.500 | 0.500 | 0.500 | 0.500 | 0.500 | 0.500 | 0.500 |
| Evaluation | Presence of As-Enriched Layer | x | x | x | x | x | x | ○ | ○ | ○ |
| | Inhibition of Viscosity Increase | x | x | x | x | x | x | ○ | ○ | ○ |
| | Solder Wettability | ○ | ○ | ○ | ○ | ○ | ○ | ○ | ○ | ○ |

TABLE 42-continued

TABLE IVF 3.5% Ag and 0.5% Cu added

|  |  | | | | | | | | | |
|---|---|---|---|---|---|---|---|---|---|---|
|  | Reliability (ΔT < 10° C.) | ○ | ○ | ○ | ○ | ○ | ○ | ○ | ○ | x |
|  | Comprehensive Evaluation | x | x | x | x | x | x | ○ | ○ | x |

|  | Element | Ex. IV-F3 | Ex. IV-F4 | Ex. IV-F5 | Ex. IV-F6 | Ex. IV-F7 | Ex. IV-F8 | Ex. IV-F9 | Ex. IV-F10 | Ex. IV-F11 |
|---|---|---|---|---|---|---|---|---|---|---|
| Composition | As (mass ppm) | 50 | 60 | 70 | 80 | 90 | 100 | 100 | 100 | 100 |
|  | Pb (mass %) | 0.010 | 0.010 | 0.010 | 0.010 | 0.010 | 0.002 | 0.005 | 0.010 | 0.050 |
|  | Ag (mass %) | 3.500 | 3.500 | 3.500 | 3.500 | 3.500 | 3.500 | 3.500 | 3.500 | 3.500 |
|  | Cu (mass %) | 0.500 | 0.500 | 0.500 | 0.500 | 0.500 | 0.500 | 0.500 | 0.500 | 0.500 |
| Evaluation | Presence of As-Enriched Layer | ○ | ○ | ○ | ○ | ○ | ○ | ○ | ○ | ○ |
|  | Inhibition of Viscosity Increase | ○ | ○ | ○ | ○ | ○ | ○ | ○ | ○ | ○ |
|  | Solder Wettability | ○ | ○ | ○ | ○ | ○ | ○ | ○ | ○ | ○ |
|  | Reliability (ΔT < 10° C.) | ○ | ○ | ○ | ○ | ○ | ○ | ○ | ○ | ○ |
|  | Comprehensive Evaluation | ○ | ○ | ○ | ○ | ○ | ○ | ○ | ○ | ○ |

|  | Element | Ex. IV-F12 | Ex. IV-F13 | Ex. IV-F14 | Comp. Ex. IV-F8 |
|---|---|---|---|---|---|
| Composition | As (mass ppm) | 100 | 100 | 100 | 100 |
|  | Pb (mass %) | 0.100 | 0.500 | 0.700 | 5.000 |
|  | Ag (mass %) | 3.500 | 3.500 | 3.500 | 3.500 |
|  | Cu (mass %) | 0.500 | 0.500 | 0.500 | 0.500 |
| Evaluation | Presence of As-Enriched Layer | ○ | ○ | ○ | ○ |
|  | Inhibition of Viscosity Increase | ○ | ○ | ○ | ○ |
|  | Solder Wettability | ○ | ○ | ○ | ○ |
|  | Reliability (ΔT < 10° C.) | ○ | ○ | ○ | x |
|  | Comprehensive Evaluation | ○ | ○ | ○ | x |

TABLE 43

| Ex. IV-F15 | Ex. IV-F16 | Ex. IV-F17 | Ex. IV-F18 | Ex. IV-F19 | Ex IV-F20 | Ex. IV-F21 | Comp. Ex. IV-F9 | Ex. IV-F22 | Ex. IV-F23 | Ex. IV-F24 | Ex. IV-F25 | Ex. IV-F26 |
|---|---|---|---|---|---|---|---|---|---|---|---|---|
| 150 | 150 | 150 | 150 | 150 | 150 | 150 | 150 | 200 | 200 | 200 | 200 | 200 |
| 0.002 | 0.005 | 0.010 | 0.050 | 0.100 | 0.500 | 0.700 | 5.000 | 0.002 | 0.005 | 0.010 | 0.050 | 0.100 |
| 3.500 | 3.500 | 3.500 | 3.500 | 3.500 | 3.500 | 3.500 | 3.500 | 3.500 | 3.500 | 3.500 | 3.500 | 3.500 |
| 0.500 | 0.500 | 0.500 | 0.500 | 0.500 | 0.500 | 0.500 | 0.500 | 0.500 | 0.500 | 0.500 | 0.500 | 0.500 |
| ○ | ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ | ○ |
| ○ | ○ | ○ | ○ | ○ | ○ | ○ | x | ○ | ○ | ○ | ○ | ○ |
| ○ | ○ | ○ | ○ | ○ | ○ | ○ | x | ○ | ○ | ○ | ○ | ○ |

| Ex. IV-F27 | Ex. IV-F28 | Comp. Ex. IV-F10 | Ex. IV-F29 | Ex. IV-F30 | Ex. IV-F31 | Ex. IV-F32 | Ex. IV-F33 | Ex. IV-F34 | Ex. IV-F35 | Comp. Ex. IV-F11 | Comp. Ex. IV-F12 |
|---|---|---|---|---|---|---|---|---|---|---|---|
| 200 | 200 | 200 | 250 | 250 | 250 | 250 | 250 | 250 | 250 | 250 | 500 |
| 0.500 | 0.700 | 5.000 | 0.002 | 0.005 | 0.010 | 0.050 | 0.100 | 0.500 | 0.700 | 5.000 | 0.000 |
| 3.500 | 3.500 | 3.500 | 3.500 | 3.500 | 3.500 | 3.500 | 3.500 | 3.500 | 3.500 | 3.500 | 3.500 |
| 0.500 | 0.500 | 0.500 | 0.500 | 0.500 | 0.500 | 0.500 | 0.500 | 0.500 | 0.500 | 0.500 | 0.500 |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | ○ |
| ○ | ○ | ○ | ○ | ○ | ○ | ○ | ○ | ○ | ○ | ○ | x |
| ○ | ○ | x | ○ | ○ | ○ | ○ | ○ | ○ | ○ | x | x |
| ○ | ○ | x | ○ | ○ | ○ | ○ | ○ | ○ | ○ | x | x |

V. Sn—As—(Sb, Bi and Pb)-Containing Solder

Examples V-A1 to V-A18 and Comparative Examples V-A1 to V-A24

Sn, As, Sb, Bi and Pb were weighed to satisfy the contents of As, Sb, Bi and Pb shown in Table VA below with a balance of Sn (balance for making the sum of Sn, As, Sb, Bi and Pb 100% by mass), and were melt mixed, and the resultant was centrifugally sprayed in an Ar atmosphere to prepare a powder (average particle size: 21 μm, classified as No. 4 of the particle size classification (Table 2) of JIS Z3284-1:2004). The thus obtained powder was heated with a drying apparatus in the air at 60° C. for 30 minutes to obtain a solder powder of each of examples and comparative examples. In Comparative Examples V-A3 to V-A14, however, a heat treatment was not performed but a powder as is obtained by the centrifugal spraying was used as a solder powder.

A 3N material containing an incidental impurity was used as Sn.

Results of the evaluations of (1) the presence of an As-enriched layer, (2) the inhibition of viscosity increase, (3) the solder wettability, and (4) the reliability of the solder powders of the examples and comparative examples are shown in the following table.

TABLE 44

| | Synthesis Composition (mass ppm) | | | | Formula (1) 2As + Sb + Bi + Pb | Formula (2) (2As + Sb)/ (Bi + Pb) | Evaluation Item | | | | |
|---|---|---|---|---|---|---|---|---|---|---|---|
| | | | | | | | Presence of As-Enriched Layer | Inhibition of Viscosity Increase | Reliability (ΔT) | Solder Wettability | Comprehensive Evaluation |
| | As | Sb | Bi | Pb | | | | | | | |
| Ex. V-A1 | 100 | 25 | 25 | 25 | 275 | 4.50 | ○ | ○ | ○ | ○ | ○ |
| Ex. V-A2 | 100 | 50 | 25 | 0 | 275 | 10.00 | ○ | ○ | ○ | ○ | ○ |
| Ex. V-A3 | 100 | 0 | 75 | 0 | 275 | 2.67 | ○ | ○ | ○ | ○ | ○ |
| Ex. V-A4 | 100 | 0 | 0 | 75 | 275 | 2.67 | ○ | ○ | ○ | ○ | ○ |
| Ex. V-A5 | 100 | 50 | 50 | 50 | 350 | 2.50 | ○ | ○ | ○ | ○ | ○ |
| Ex. V-A6 | 50 | 100 | 100 | 50 | 350 | 1.33 | ○ | ○ | ○ | ○ | ○ |
| Ex. V-A7 | 250 | 0 | 300 | 300 | 1100 | 0.83 | ○ | ○ | ○ | ○ | ○ |
| Ex. V-A8 | 200 | 300 | 250 | 250 | 1200 | 1.40 | ○ | ○ | ○ | ○ | ○ |
| Ex. V-A9 | 100 | 500 | 250 | 250 | 1200 | 1.40 | ○ | ○ | ○ | ○ | ○ |
| Ex. V-A10 | 200 | 50 | 600 | 850 | 1900 | 0.31 | ○ | ○ | ○ | ○ | ○ |
| Ex. V-A11 | 200 | 500 | 500 | 500 | 1900 | 0.90 | ○ | ○ | ○ | ○ | ○ |
| Ex. V-A12 | 200 | 500 | 1000 | 0 | 1900 | 0.90 | ○ | ○ | ○ | ○ | ○ |
| Ex. V-A13 | 200 | 500 | 0 | 1000 | 1900 | 0.90 | ○ | ○ | ○ | ○ | ○ |
| Ex. V-A14 | 40 | 500 | 350 | 1000 | 1930 | 0.43 | ○ | ○ | ○ | ○ | ○ |
| Ex. V-A15 | 100 | 3000 | 300 | 300 | 3800 | 5.33 | ○ | ○ | ○ | ○ | ○ |
| Ex. V-A16 | 100 | 0 | 0 | 5100 | 5300 | 0.04 | ○ | ○ | ○ | ○ | ○ |
| Ex. V-A17 | 100 | 0 | 10000 | 0 | 10200 | 0.02 | ○ | ○ | ○ | ○ | ○ |
| Ex. V-A18 | 100 | 0 | 10000 | 5000 | 15200 | 0.01 | ○ | ○ | ○ | ○ | ○ |
| Comp. Ex. V-A1 | 0 | 100 | 100 | 100 | 300 | 0.50 | x | x | ○ | ○ | x |
| Comp. Ex. V-A2 | 40 | 0 | 0 | 0 | 80 | — | ○ | x | ○ | ○ | x |
| Comp. Ex. V-A3 | 40 | 20 | 0 | 0 | 100 | — | x | x | ○ | ○ | x |
| Comp. Ex. V-A4 | 40 | 0 | 20 | 0 | 100 | — | x | x | ○ | ○ | x |
| Comp. Ex. V-A5 | 40 | 0 | 0 | 20 | 100 | — | x | x | ○ | ○ | x |
| Comp. Ex. V-A6 | 10 | 20 | 0 | 0 | 40 | — | x | x | ○ | ○ | x |
| Comp. Ex. V-A7 | 10 | 0 | 20 | 0 | 40 | 1.00 | x | x | ○ | ○ | x |
| Comp. Ex. V-A8 | 10 | 0 | 0 | 20 | 40 | 1.00 | x | x | ○ | ○ | x |
| Comp. Ex. V-A9 | 20 | 20 | 0 | 0 | 60 | — | x | x | ○ | ○ | x |
| Comp. Ex. V-A10 | 20 | 0 | 20 | 0 | 60 | 2.00 | x | x | ○ | ○ | x |
| Comp. Ex. V-A11 | 20 | 0 | 0 | 20 | 60 | 2.00 | x | x | ○ | ○ | x |
| Comp. Ex. V-A12 | 25 | 20 | 0 | 0 | 70 | — | x | x | ○ | ○ | x |
| Comp. Ex. V-A13 | 25 | 0 | 20 | 0 | 70 | 2.50 | x | x | ○ | ○ | x |
| Comp. Ex. V-A14 | 25 | 0 | 0 | 20 | 70 | 2.50 | x | x | ○ | ○ | x |
| Comp. Ex. V-A15 | 300 | 500 | 50 | 50 | 1200 | 11.00 | ○ | ○ | ○ | x | x |
| Comp. Ex. V-A16 | 350 | 1150 | 25 | 25 | 1900 | 37.00 | ○ | ○ | ○ | x | x |
| Comp. Ex. V-A17 | 800 | 800 | 100 | 100 | 2600 | 12.00 | ○ | ○ | ○ | x | x |
| Comp. Ex. V-A18 | 800 | 3500 | 100 | 100 | 5300 | 25.50 | ○ | ○ | ○ | x | x |

TABLE 44-continued

| | Synthesis Composition (mass ppm) | | | | Formula (1) 2As + Sb + Bi + Pb | Formula (2) (2As + Sb)/ (Bi + Pb) | Evaluation Item | | | | |
|---|---|---|---|---|---|---|---|---|---|---|---|
| | | | | | | | Presence of As-Enriched Layer | Inhibition of Viscosity Increase | Reliability (ΔT) | Solder Wettability | Comprehensive Evaluation |
| | As | Sb | Bi | Pb | | | | | | | |
| Ex. V-A19 Comp. | 100 | 10000 | 1 | 0 | 10201 | 10200.00 | ○ | ○ | ○ | x | x |
| Ex. V-A20 Comp. | 100 | 100 | 50000 | 0 | 50300 | 0.01 | ○ | ○ | x | ○ | x |
| Ex. V-A21 Comp. | 100 | 100 | 0 | 50000 | 50300 | 0.01 | ○ | ○ | x | ○ | x |
| Ex. V-A22 Comp. | 300 | 3000 | 0 | 0 | 3600 | — | ○ | ○ | ○ | x | x |
| Ex. V-A23 Comp. | 250 | 5100 | 0 | 0 | 5600 | — | ○ | ○ | ○ | x | x |
| Ex. V-A24 Comp. | 100 | 0 | 100 | 25000 | 25300 | 0.01 | ○ | ○ | x | ○ | x |

Examples V-B1 to V-B18 and Comparative Examples V-B1 to V-B24

Sn, Cu, As, Sb, Bi and Pb were weighed to satisfy a content of Cu of 0.7% by mass and the contents of As, Sb, Bi and Pb shown in Table VB below with a balance of Sn (balance for making the sum of Sn, Cu, As, Sb, Bi and Pb 100% by mass), and were melt mixed, and the resultant was centrifugally sprayed in an Ar atmosphere to prepare a powder (average particle size: 21 μm, classified as No. 4 of the particle size classification). The thus obtained powder was heated with a drying apparatus in the air at 60° C. for 30 minutes to obtain a solder powder of each of examples and comparative examples. In Comparative Examples V-B3 to V-B14, however, a heat treatment was not performed but a powder as is obtained by the centrifugal spraying was used as a solder powder.

A 3N material containing an incidental impurity was used as Sn.

Results of the evaluations of (1) the presence of an As-enriched layer, (2) the inhibition of viscosity increase, (3) the solder wettability, and (4) the reliability of the solder powders of the examples and comparative examples are shown in the following table.

TABLE 45

| | Synthesis Composition (As, Bi, Pb: mass ppm, Cu: mass %) | | | | | (1) Formula Formula (1) 2As + Sb + Bi + Pb | (2) Formula Formula (2) (2As + Sb)/ (Bi + Pb) | Evaluation Item | | | | |
|---|---|---|---|---|---|---|---|---|---|---|---|---|
| | | | | | | | | Presence of As-Enriched Layer | Inhibition of Viscosity Increase | Reliability (ΔT) | Solder Wettability | Comprehensive Evaluation |
| | Cu | As | Sb | Bi | Pb | | | | | | | |
| Ex. V-B1 | 0.7 | 100 | 25 | 25 | 25 | 275 | 4.50 | ○ | ○ | ○ | ○ | ○ |
| Ex. V-B2 | 0.7 | 100 | 50 | 25 | 0 | 275 | 10.00 | ○ | ○ | ○ | ○ | ○ |
| Ex. V-B3 | 0.7 | 100 | 0 | 75 | 0 | 275 | 2.67 | ○ | ○ | ○ | ○ | ○ |
| Ex. V-B4 | 0.7 | 100 | 0 | 0 | 75 | 275 | 2.67 | ○ | ○ | ○ | ○ | ○ |
| Ex. V-B5 | 0.7 | 100 | 50 | 50 | 50 | 350 | 2.50 | ○ | ○ | ○ | ○ | ○ |
| Ex. V-B6 | 0.7 | 50 | 100 | 100 | 50 | 350 | 1.33 | ○ | ○ | ○ | ○ | ○ |
| Ex. V-B7 | 0.7 | 250 | 0 | 300 | 300 | 1200 | 1.00 | ○ | ○ | ○ | ○ | ○ |
| Ex. V-B8 | 0.7 | 200 | 300 | 250 | 250 | 1200 | 1.40 | ○ | ○ | ○ | ○ | ○ |
| Ex. V-B9 | 0.7 | 100 | 500 | 250 | 250 | 1200 | 1.40 | ○ | ○ | ○ | ○ | ○ |
| Ex. V-B10 | 0.7 | 200 | 50 | 600 | 850 | 1900 | 0.31 | ○ | ○ | ○ | ○ | ○ |
| Ex. V-B11 | 0.7 | 200 | 500 | 500 | 500 | 1900 | 0.90 | ○ | ○ | ○ | ○ | ○ |
| Ex. V-B12 | 0.7 | 200 | 500 | 1000 | 0 | 1900 | 0.90 | ○ | ○ | ○ | ○ | ○ |
| Ex. V-B13 | 0.7 | 200 | 500 | 0 | 1000 | 1900 | 0.90 | ○ | ○ | ○ | ○ | ○ |
| Ex. V-B14 | 0.7 | 40 | 500 | 350 | 1000 | 1900 | 0.41 | ○ | ○ | ○ | ○ | ○ |
| Ex. V-B15 | 0.7 | 100 | 3000 | 300 | 300 | 3800 | 5.33 | ○ | ○ | ○ | ○ | ○ |
| Ex. V-B16 | 0.7 | 100 | 0 | 0 | 5100 | 5300 | 0.04 | ○ | ○ | ○ | ○ | ○ |
| Ex. V-B17 | 0.7 | 100 | 0 | 10000 | 0 | 10200 | 0.02 | ○ | ○ | ○ | ○ | ○ |
| Ex. V-B18 | 0.7 | 100 | 0 | 10000 | 5000 | 15200 | 0.01 | ○ | ○ | ○ | ○ | ○ |
| Comp. Ex. V-B1 | 0.7 | 0 | 100 | 100 | 100 | 300 | 0.50 | x | x | ○ | ○ | x |
| Comp. Ex. V-B2 | 0.7 | 40 | 0 | 0 | 0 | 80 | — | ○ | x | ○ | ○ | x |
| Comp. Ex. V-B3 | 0.7 | 40 | 20 | 0 | 0 | 100 | — | x | x | ○ | ○ | x |
| Comp. Ex. V-B4 | 0.7 | 40 | 0 | 20 | 0 | 100 | — | x | x | ○ | ○ | x |
| Comp. Ex. V-B5 | 0.7 | 40 | 0 | 0 | 20 | 100 | — | x | x | ○ | ○ | x |
| Comp. Ex. V-B6 | 0.7 | 10 | 20 | 0 | 0 | 40 | — | x | x | ○ | ○ | x |
| Comp. Ex. V-B7 | 0.7 | 10 | 0 | 20 | 0 | 40 | 1.00 | x | x | ○ | ○ | x |

TABLE 45-continued

| | Synthesis Composition (As, Bi, Pb: mass ppm, Cu: mass %) | | | | | (1) Formula Formula (1) 2As + Sb + Bi + Pb | (2) Formula Formula (2) (2As + Sb)/ (Bi + Pb) | Presence of As-Enriched Layer | Inhibition of Viscosity Increase | Reliability (ΔT) | Solder Wettability | Comprehensive Evaluation |
|---|---|---|---|---|---|---|---|---|---|---|---|---|
| | Cu | As | Sb | Bi | Pb | | | | | | | |
| Comp. Ex. V-B8 | 0.7 | 10 | 0 | 0 | 20 | 40 | 1.00 | x | x | ○ | ○ | x |
| Comp. Ex. V-B9 | 0.7 | 20 | 20 | 0 | 0 | 60 | — | x | x | ○ | ○ | x |
| Comp. Ex. V-B10 | 0.7 | 20 | 0 | 20 | 0 | 60 | 2.00 | x | x | ○ | ○ | x |
| Comp. Ex. V-B11 | 0.7 | 20 | 0 | 0 | 20 | 60 | 2.00 | x | x | ○ | ○ | x |
| Comp. Ex. V-B12 | 0.7 | 25 | 20 | 0 | 0 | 70 | — | x | x | ○ | ○ | x |
| Comp. Ex. V-B13 | 0.7 | 25 | 0 | 20 | 0 | 70 | 2.50 | x | x | ○ | ○ | x |
| Comp. Ex. V-B14 | 0.7 | 25 | 0 | 0 | 20 | 70 | 2.50 | x | x | ○ | ○ | x |
| Comp. Ex. V-B15 | 0.7 | 300 | 500 | 50 | 50 | 1200 | 11.00 | ○ | ○ | ○ | x | x |
| Comp. Ex. V-B16 | 0.7 | 350 | 1150 | 25 | 25 | 1900 | 37.00 | ○ | ○ | ○ | x | x |
| Comp. Ex. V-B17 | 0.7 | 800 | 800 | 100 | 100 | 2600 | 12.00 | ○ | ○ | ○ | x | x |
| Comp. Ex. V-B18 | 0.7 | 800 | 3500 | 100 | 100 | 5300 | 25.50 | ○ | ○ | ○ | x | x |
| Comp. Ex. V-B19 | 0.7 | 100 | 10000 | 1 | 0 | 10201 | 10200.00 | ○ | ○ | ○ | x | x |
| Comp. Ex. V-B20 | 0.7 | 100 | 100 | 50000 | 0 | 50300 | 0.01 | ○ | ○ | x | ○ | x |
| Comp. Ex. V-B21 | 0.7 | 100 | 100 | 0 | 50000 | 50300 | 0.01 | ○ | ○ | x | ○ | x |
| Comp. Ex. V-B22 | 0.7 | 300 | 3000 | 0 | 0 | 3600 | — | ○ | ○ | ○ | x | x |
| Comp. Ex. V-B23 | 0.7 | 250 | 5100 | 0 | 0 | 5600 | — | ○ | ○ | ○ | x | x |
| Comp. Ex. V-B24 | 0.7 | 100 | 0 | 100 | 25000 | 25300 | 0.01 | ○ | ○ | x | ○ | x |

Examples V-C1 to V-C18 and Comparative Examples V-CE to V-C24

Sn, Ag, Cu, As, Sb, Bi and Pb were weighed to satisfy a content of Cu of 0.5% by mass, a content of Ag of 1.0% by mass, and the contents of As, Sb, Bi and Pb shown in Table VC below with a balance of Sn (balance for making the sum of Sn, Ag, Cu, As, Sb, Bi and Pb 100% by mass), and were melt mixed, and the resultant was centrifugally sprayed in an Ar atmosphere to prepare a powder (average particle size: 21 μm, classified as No. 4 of the particle size classification). The thus obtained powder was heated with a drying apparatus in the air at 60° C. for 30 minutes to obtain a solder powder of each of examples and comparative examples. In Comparative Examples V-C3 to V-C14, however, a heat treatment was not performed but a powder as is obtained by the centrifugal spraying was used as a solder powder.

A 3N material containing an incidental impurity was used as Sn.

The solder powder obtained in Example V-C1 was analyzed for the contents of Sn, Ag, Cu, As, Sb, Bi, and Pb by ICP-AES in accordance with JIS Z 3910, and it was confirmed that these contents accorded with those of the starting materials.

Results of the evaluations of (1) the presence of an As-enriched layer, (2) the inhibition of viscosity increase, (3) the solder wettability, and (4) the reliability of the solder powders of the examples and comparative examples are shown in the following table.

TABLE 46

| | Synthesis Composition (As, Sb, Bi, Pb: mass ppm, Ag, Cu: mass %) | | | | | | | (1) Formula Formula (1) 2As + Sb + Bi + Pb | (2) Formula Formula (2) (2As + Sb)/ (Bi + Pb) | Presence of As-Enriched Layer | Inhibition Viscosity of Increase | Reliability (ΔT) | Solder Wettability | Comprehensive Evaluation |
|---|---|---|---|---|---|---|---|---|---|---|---|---|---|---|
| | Ag | Cu | As | Sb | Bi | Pb | | | | | | | | |
| Ex. V-C1 | 1 | 0.5 | 100 | 25 | 25 | 25 | 275 | 4.50 | ○ | ○ | ○ | ○ | ○ |
| Ex. V-C2 | 1 | 0.5 | 100 | 50 | 25 | 0 | 275 | 10.00 | ○ | ○ | ○ | ○ | ○ |
| Ex. V-C3 | 1 | 0.5 | 100 | 0 | 75 | 0 | 275 | 2.67 | ○ | ○ | ○ | ○ | ○ |
| Ex. V-C4 | 1 | 0.5 | 100 | 0 | 0 | 75 | 275 | 2.67 | ○ | ○ | ○ | ○ | ○ |
| Ex. V-C5 | 1 | 0.5 | 100 | 50 | 50 | 50 | 350 | 2.50 | ○ | ○ | ○ | ○ | ○ |

TABLE 46-continued

| | Synthesis Composition (As, Sb, Bi, Pb: mass ppm, Ag, Cu: mass %) | | | | | | (1) Formula Formula (1) 2As + Sb + Bi + Pb | (2) Formula Formula (2) (2As + Sb)/ (Bi + Pb) | Evaluation Item | | | | |
|---|---|---|---|---|---|---|---|---|---|---|---|---|---|
| | | | | | | | | | Presence of As-Enriched Layer | Inhibition Viscosity of Increase | Reliability (ΔT) | Solder Wettability | Comprehensive Evaluation |
| | Ag | Cu | As | Sb | Bi | Pb | | | | | | | |
| Ex. V-C6 | 1 | 0.5 | 50 | 100 | 100 | 50 | 350 | 1.33 | ○ | ○ | ○ | ○ | ○ |
| Ex. V-C7 | 1 | 0.5 | 250 | 0 | 300 | 300 | 1200 | 1.00 | ○ | ○ | ○ | ○ | ○ |
| Ex. V-C8 | 1 | 0.5 | 200 | 300 | 250 | 250 | 1200 | 1.40 | ○ | ○ | ○ | ○ | ○ |
| Ex. V-C9 | 1 | 0.5 | 100 | 500 | 250 | 250 | 1200 | 1.40 | ○ | ○ | ○ | ○ | ○ |
| Ex. V-C10 | 1 | 0.5 | 200 | 50 | 600 | 850 | 1900 | 0.31 | ○ | ○ | ○ | ○ | ○ |
| Ex. V-C11 | 1 | 0.5 | 200 | 500 | 500 | 500 | 1900 | 0.90 | ○ | ○ | ○ | ○ | ○ |
| Ex. V-C12 | 1 | 0.5 | 200 | 500 | 1000 | 0 | 1900 | 0.90 | ○ | ○ | ○ | ○ | ○ |
| Ex. V-C13 | 1 | 0.5 | 200 | 500 | 0 | 1000 | 1900 | 0.90 | ○ | ○ | ○ | ○ | ○ |
| Ex. V-C14 | 1 | 0.5 | 40 | 500 | 350 | 1000 | 1900 | 0.41 | ○ | ○ | ○ | ○ | ○ |
| Ex. V-C15 | 1 | 0.5 | 100 | 3000 | 300 | 300 | 3800 | 5.33 | ○ | ○ | ○ | ○ | ○ |
| Ex. V-C16 | 1 | 0.5 | 100 | 0 | 0 | 5100 | 5300 | 0.04 | ○ | ○ | ○ | ○ | ○ |
| Ex. V-C17 | 1 | 0.5 | 100 | 0 | 10000 | 0 | 10200 | 0.02 | ○ | ○ | ○ | ○ | ○ |
| Ex. V-C18 | 1 | 0.5 | 100 | 0 | 10000 | 5000 | 15200 | 0.01 | ○ | ○ | ○ | ○ | ○ |
| Comp. Ex. V-C1 | 1 | 0.5 | 0 | 100 | 100 | 100 | 300 | 0.50 | x | x | ○ | ○ | x |
| Comp. Ex. V-C2 | 1 | 0.5 | 40 | 0 | 0 | 0 | 80 | — | ○ | x | ○ | ○ | x |
| Comp. Ex. V-C3 | 1 | 0.5 | 40 | 20 | 0 | 0 | 100 | — | x | x | ○ | ○ | x |
| Comp. Ex. V-C4 | 1 | 0.5 | 40 | 0 | 20 | 0 | 100 | — | x | x | ○ | ○ | x |
| Comp. Ex. V-C5 | 1 | 0.5 | 10 | 0 | 0 | 20 | 100 | — | x | x | ○ | ○ | x |
| Comp. Ex. V-C6 | 1 | 0.5 | 10 | 20 | 0 | 0 | 40 | — | x | x | ○ | ○ | x |
| Comp. Ex. V-C7 | 1 | 0.5 | 10 | 0 | 20 | 0 | 40 | 1.00 | x | x | ○ | ○ | x |
| Comp. Ex. V-C8 | 1 | 0.5 | 20 | 0 | 0 | 20 | 40 | 2.00 | x | x | ○ | ○ | x |
| Comp. Ex. V-C9 | 1 | 0.5 | 20 | 20 | 0 | 0 | 60 | — | x | x | ○ | ○ | x |
| Comp. Ex. V-C10 | 1 | 0.5 | 20 | 0 | 20 | 0 | 60 | 2.00 | x | x | ○ | ○ | x |
| Comp. Ex. V-C11 | 1 | 0.5 | 25 | 0 | 0 | 20 | 60 | 2.50 | x | x | ○ | ○ | x |
| Comp. Ex. V-C12 | 1 | 0.5 | 25 | 20 | 0 | 0 | 70 | — | x | x | ○ | ○ | x |
| Comp. Ex. V-C13 | 1 | 0.5 | 25 | 0 | 20 | 0 | 70 | 2.50 | x | x | ○ | ○ | x |
| Comp. Ex. V-C14 | 1 | 0.5 | 25 | 0 | 0 | 20 | 70 | 2.50 | x | x | ○ | ○ | x |
| Comp. Ex. V-C15 | 1 | 0.5 | 300 | 500 | 50 | 50 | 1200 | 11.00 | ○ | ○ | ○ | x | x |
| Comp. Ex. V-C16 | 1 | 0.5 | 350 | 1150 | 25 | 25 | 1900 | 37.00 | ○ | ○ | ○ | x | x |
| Comp. Ex. V-C17 | 1 | 0.5 | 800 | 800 | 100 | 100 | 2600 | 12.00 | ○ | ○ | ○ | x | x |
| Comp. Ex. V-C18 | 1 | 0.5 | 800 | 3500 | 100 | 100 | 5300 | 25.50 | ○ | ○ | ○ | x | x |
| Comp. Ex. V-C19 | 1 | 0.5 | 100 | 10000 | 1 | 0 | 10201 | 10200.00 | ○ | ○ | ○ | x | x |
| Comp. Ex. V-C20 | 1 | 0.5 | 100 | 100 | 50000 | 0 | 50300 | 0.01 | ○ | ○ | x | ○ | x |
| Comp. Ex. V-C21 | 1 | 0.5 | 100 | 100 | 0 | 50000 | 50300 | 0.01 | ○ | ○ | x | ○ | x |
| Comp. Ex. V-C22 | 1 | 0.5 | 300 | 3000 | 0 | 0 | 3600 | — | ○ | ○ | ○ | x | x |
| Comp. Ex. V-C23 | 1 | 0.5 | 250 | 5100 | 0 | 0 | 5600 | — | ○ | ○ | ○ | x | x |
| Comp. Ex. V-C24 | 1 | 0.5 | 100 | 0 | 100 | 25000 | 25300 | 0.01 | ○ | ○ | x | ○ | x |

Examples V-D1 to V-D18 and Comparative Examples V-D1 to V-D24

Sn, Ag, Cu, As, Sb, Bi and Pb were weighed to satisfy a content of Cu of 0.5% by mass, a content of Ag of 2.0% by mass, and the contents of As, Sb, Bi and Pb shown in Table VD below with a balance of Sn (balance for making the sum of Sn, Ag, Cu, As, Sb, Bi and Pb 100% by mass), and were melt mixed, and the resultant was centrifugally sprayed in an Ar atmosphere to prepare a powder (average particle size: 21 µm, classified as No. 4 of the particle size classification). The thus obtained powder was heated with a drying apparatus in the air at 60° C. for 30 minutes to obtain a solder powder of each of examples and comparative examples. In Comparative Examples V-D3 to V-D14, however, a heat treatment was not performed but a powder as is obtained by the centrifugal spraying was used as a solder powder.

A 3N material containing an incidental impurity was used as Sn.

Results of the evaluations of (1) the presence of an As-enriched layer, (2) the inhibition of viscosity increase, (3) the solder wettability, and (4) the reliability of the solder powders of the examples and comparative examples are shown in the following table.

TABLE 47

| | Synthesis Composition (As, Sb, Bi, Pb: mass ppm, Ag, Cu: mass %) | | | | | | (1) Formula Formula (1) 2As + Sb + Bi + Pb | (2) Formula Formula (2) (2As + Sb)/ (Bi + Pb) | Evaluation Item | | | | |
|---|---|---|---|---|---|---|---|---|---|---|---|---|---|
| | Ag | Cu | As | Sb | Bi | Pb | | | Presence of As-Enriched Layer | Inhibition of Viscosity Increase | Reliability (ΔT) | Solder Wettability | Comprehensive Evaluation |
| Ex. V-D1 | 2 | 0.5 | 100 | 25 | 25 | 25 | 275 | 4.50 | ○ | ○ | ○ | ○ | ○ |
| Ex. V-D2 | 2 | 0.5 | 100 | 50 | 25 | 0 | 275 | 10.00 | ○ | ○ | ○ | ○ | ○ |
| Ex. V-D3 | 2 | 0.5 | 100 | 0 | 75 | 0 | 275 | 2.67 | ○ | ○ | ○ | ○ | ○ |
| Ex. V-D4 | 2 | 0.5 | 100 | 0 | 0 | 75 | 275 | 2.67 | ○ | ○ | ○ | ○ | ○ |
| Ex. V-D5 | 2 | 0.5 | 100 | 50 | 50 | 50 | 350 | 2.50 | ○ | ○ | ○ | ○ | ○ |
| Ex. V-D6 | 2 | 0.5 | 50 | 100 | 100 | 50 | 350 | 1.33 | ○ | ○ | ○ | ○ | ○ |
| Ex. V-D7 | 2 | 0.5 | 250 | 0 | 300 | 300 | 1100 | 0.83 | ○ | ○ | ○ | ○ | ○ |
| Ex. V-D8 | 2 | 0.5 | 200 | 300 | 250 | 250 | 1200 | 1.40 | ○ | ○ | ○ | ○ | ○ |
| Ex. V-D9 | 2 | 0.5 | 100 | 500 | 250 | 250 | 1200 | 1.40 | ○ | ○ | ○ | ○ | ○ |
| Ex. V-D10 | 2 | 0.5 | 200 | 50 | 600 | 850 | 1900 | 0.31 | ○ | ○ | ○ | ○ | ○ |
| Ex. V-D11 | 2 | 0.5 | 200 | 500 | 500 | 500 | 1900 | 0.90 | ○ | ○ | ○ | ○ | ○ |
| Ex. V-D12 | 2 | 0.5 | 200 | 500 | 1000 | 0 | 1900 | 0.90 | ○ | ○ | ○ | ○ | ○ |
| Ex. V-D13 | 2 | 0.5 | 200 | 500 | 0 | 1000 | 1900 | 0.90 | ○ | ○ | ○ | ○ | ○ |
| Ex. V-D14 | 2 | 0.5 | 40 | 500 | 350 | 1000 | 1930 | 0.43 | ○ | ○ | ○ | ○ | ○ |
| Ex. V-D15 | 2 | 0.5 | 100 | 3000 | 300 | 300 | 3800 | 5.33 | ○ | ○ | ○ | ○ | ○ |
| Ex. V-D16 | 2 | 0.5 | 100 | 0 | 0 | 5100 | 5300 | 0.04 | ○ | ○ | ○ | ○ | ○ |
| Ex. V-D17 | 2 | 0.5 | 100 | 0 | 10000 | 0 | 10200 | 0.02 | ○ | ○ | ○ | ○ | ○ |
| Ex. V-D18 | 2 | 0.5 | 100 | 0 | 10000 | 5000 | 15200 | 0.01 | ○ | ○ | ○ | ○ | ○ |
| Comp. Ex. V-D1 | 2 | 0.5 | 0 | 100 | 100 | 100 | 300 | 0.50 | x | x | ○ | ○ | x |
| Comp. Ex. V-D2 | 2 | 0.5 | 40 | 0 | 0 | 0 | 80 | — | ○ | x | ○ | ○ | x |
| Comp. Ex. V-D3 | 2 | 0.5 | 40 | 20 | 0 | 0 | 100 | — | x | x | ○ | ○ | x |
| Comp. Ex. V-D4 | 2 | 0.5 | 40 | 0 | 20 | 0 | 100 | — | x | x | ○ | ○ | x |
| Comp. Ex. V-D5 | 2 | 0.5 | 10 | 0 | 0 | 20 | 100 | — | x | x | ○ | ○ | x |
| Comp. Ex. V-D6 | 2 | 0.5 | 10 | 20 | 0 | 0 | 40 | — | x | x | ○ | ○ | x |
| Comp. Ex. V-D7 | 2 | 0.5 | 10 | 0 | 20 | 0 | 40 | 1.00 | x | x | ○ | ○ | x |
| Comp. Ex. V-D8 | 2 | 0.5 | 20 | 0 | 0 | 20 | 40 | 2.00 | x | x | ○ | ○ | x |
| Comp. Ex. V-D9 | 2 | 0.5 | 20 | 20 | 0 | 0 | 60 | — | x | x | ○ | ○ | x |
| Comp. Ex. V-D10 | 2 | 0.5 | 20 | 0 | 20 | 0 | 60 | 2.00 | x | x | ○ | ○ | x |
| Comp. Ex. V-D11 | 2 | 0.5 | 25 | 0 | 0 | 20 | 60 | 2.50 | x | x | ○ | ○ | x |
| Comp. Ex. V-D12 | 2 | 0.5 | 25 | 20 | 0 | 0 | 70 | — | x | x | ○ | ○ | x |
| Comp. Ex. V-D13 | 2 | 0.5 | 25 | 0 | 20 | 0 | 70 | 2.50 | x | x | ○ | ○ | x |
| Comp. Ex. V-D14 | 2 | 0.5 | 25 | 0 | 0 | 20 | 70 | 2.50 | x | x | ○ | ○ | x |
| Comp. Ex. V-D15 | 2 | 0.5 | 300 | 500 | 50 | 50 | 1200 | 11.00 | ○ | ○ | ○ | x | x |
| Comp. Ex. V-D16 | 2 | 0.5 | 350 | 1150 | 25 | 25 | 1900 | 37.00 | ○ | ○ | ○ | x | x |
| Comp. Ex. V-D17 | 2 | 0.5 | 800 | 800 | 100 | 100 | 2600 | 12.00 | ○ | ○ | ○ | x | x |
| Comp. Ex. V-D18 | 2 | 0.5 | 800 | 3500 | 100 | 100 | 5300 | 25.50 | ○ | ○ | ○ | x | x |
| Comp. Ex. V-D19 | 2 | 0.5 | 100 | 10000 | 1 | 0 | 10201 | 10200.00 | ○ | ○ | ○ | x | x |

TABLE 47-continued

| | Synthesis Composition (As, Sb, Bi, Pb: mass ppm, Ag, Cu: mass %) | | | | | | (1) Formula Formula (1) 2As + Sb + Bi + Pb | (2) Formula Formula (2) (2As + Sb)/ (Bi + Pb) | Evaluation Item | | | | |
|---|---|---|---|---|---|---|---|---|---|---|---|---|---|
| | Ag | Cu | As | Sb | Bi | Pb | | | Presence of As-Enriched Layer | Inhibition of Viscosity Increase | Reliability (ΔT) | Solder Wettability | Comprehensive Evaluation |
| Comp. Ex. V-D20 | 2 | 0.5 | 100 | 100 | 50000 | 0 | 50300 | 0.01 | ○ | ○ | x | ○ | x |
| Comp. Ex. V-D21 | 2 | 0.5 | 100 | 100 | 0 | 50000 | 50300 | 0.01 | ○ | ○ | x | ○ | x |
| Comp. Ex. V-D22 | 2 | 0.5 | 300 | 3000 | 0 | 0 | 3600 | — | ○ | ○ | ○ | x | x |
| Comp. Ex. V-D23 | 2 | 0.5 | 250 | 5100 | 0 | 0 | 5600 | — | ○ | ○ | ○ | x | x |
| Comp. Ex. V-D24 | 2 | 0.5 | 100 | 0 | 100 | 25000 | 25300 | 0.01 | ○ | ○ | x | ○ | x |

Examples V-E1 to V-E18 and Comparative Examples V-E1 to V-E24

Sn, Ag, Cu, As, Sb, Bi and Pb were weighed to satisfy a content of Cu of 0.5% by mass, a content of Ag of 3.0% by mass, and the contents of As, Sb, Bi and Pb shown in Table VE below with a balance of Sn (balance for making the sum of Sn, Ag, Cu, As, Sb, Bi and Pb 100% by mass), and were melt mixed, and the resultant was centrifugally sprayed in an Ar atmosphere to prepare a powder (average particle size: 21 μm, classified as No. 4 of the particle size classification). The thus obtained powder was heated with a drying apparatus in the air at 60° C. for 30 minutes to obtain a solder powder of each of examples and comparative examples. In Comparative Examples V-E3 to V-E14, however, a heat treatment was not performed but a powder as is obtained by the centrifugal spraying was used as a solder powder.

A 3N material containing an incidental impurity was used as Sn.

Results of the evaluations of (1) the presence of an As-enriched layer, (2) the inhibition of viscosity increase, (3) the solder wettability, and (4) the reliability of the solder powders of the examples and comparative examples are shown in the following table.

TABLE 48

| | Synthesis Composition (As, Sb, Bi, Pb: mass ppm, Ag, Cu: mass %) | | | | | | Formula (1) 2As + Sb + Bi + Pb | Formula (2) (2As + Sb)/ (Bi + Pb) | Evaluation Item | | | | |
|---|---|---|---|---|---|---|---|---|---|---|---|---|---|
| | Ag | Cu | As | Sb | Bi | Pb | | | Presence of As-Enriched Layer | Inhibition of Viscosity Increase | Reliability (ΔT) | Solder Wettability | Comprehensive Evaluation |
| Ex. V-E1 | 3 | 0.5 | 100 | 25 | 25 | 25 | 275 | 4.50 | ○ | ○ | ○ | ○ | ○ |
| Ex. V-E2 | 3 | 0.5 | 100 | 50 | 25 | 0 | 275 | 10.00 | ○ | ○ | ○ | ○ | ○ |
| Ex. V-E3 | 3 | 0.5 | 100 | 0 | 75 | 0 | 275 | 2.67 | ○ | ○ | ○ | ○ | ○ |
| Ex. V-E4 | 3 | 0.5 | 100 | 0 | 0 | 75 | 275 | 2.67 | ○ | ○ | ○ | ○ | ○ |
| Ex. V-E5 | 3 | 0.5 | 100 | 50 | 50 | 50 | 350 | 2.50 | ○ | ○ | ○ | ○ | ○ |
| Ex. V-E6 | 3 | 0.5 | 50 | 100 | 100 | 50 | 350 | 1.33 | ○ | ○ | ○ | ○ | ○ |
| Ex. V-E7 | 3 | 0.5 | 250 | 0 | 300 | 300 | 1200 | 1.00 | ○ | ○ | ○ | ○ | ○ |
| Ex. V-E8 | 3 | 0.5 | 200 | 300 | 250 | 250 | 1200 | 1.40 | ○ | ○ | ○ | ○ | ○ |
| Ex. V-E9 | 3 | 0.5 | 100 | 500 | 250 | 250 | 1200 | 1.40 | ○ | ○ | ○ | ○ | ○ |
| Ex. V-E10 | 3 | 0.5 | 200 | 50 | 600 | 850 | 1900 | 0.31 | ○ | ○ | ○ | ○ | ○ |
| Ex. V-E11 | 3 | 0.5 | 200 | 500 | 500 | 500 | 1900 | 0.90 | ○ | ○ | ○ | ○ | ○ |
| Ex. V-E12 | 3 | 0.5 | 200 | 500 | 1000 | 0 | 1900 | 0.90 | ○ | ○ | ○ | ○ | ○ |
| Ex. V-E14 | 3 | 0.5 | 200 | 500 | 0 | 1000 | 1900 | 0.90 | ○ | ○ | ○ | ○ | ○ |
| Ex. V-E14 | 3 | 0.5 | 40 | 500 | 350 | 1000 | 1900 | 0.41 | ○ | ○ | ○ | ○ | ○ |
| Ex. V-E15 | 3 | 0.5 | 100 | 3000 | 300 | 300 | 3800 | 5.33 | ○ | ○ | ○ | ○ | ○ |
| Ex. V-E16 | 3 | 0.5 | 100 | 0 | 0 | 5100 | 5300 | 0.04 | ○ | ○ | ○ | ○ | ○ |
| Ex. V-E18 | 3 | 0.5 | 100 | 0 | 10000 | 0 | 10200 | 0.02 | ○ | ○ | ○ | ○ | ○ |
| Ex. V-E18 | 3 | 0.5 | 100 | 0 | 10000 | 5000 | 15200 | 0.01 | ○ | ○ | ○ | ○ | ○ |
| Comp. Ex. V-E1 | 3 | 0.5 | 0 | 100 | 100 | 100 | 300 | 0.50 | ○ | x | ○ | ○ | x |
| Comp. Ex. V-E2 | 3 | 0.5 | 40 | 0 | 0 | 0 | 80 | — | ○ | x | ○ | ○ | x |
| Comp. Ex. V-E3 | 3 | 0.5 | 40 | 20 | 0 | 0 | 100 | — | x | x | ○ | ○ | x |
| Comp. Ex. V-E4 | 3 | 0.5 | 40 | 0 | 20 | 0 | 100 | — | x | x | ○ | ○ | x |
| Comp. Ex. V-E5 | 3 | 0.5 | 10 | 0 | 0 | 20 | 100 | — | x | x | ○ | ○ | x |
| Comp. Ex. V-E6 | 3 | 0.5 | 10 | 20 | 0 | 0 | 40 | — | x | x | ○ | ○ | x |
| Comp. Ex. V-E7 | 3 | 0.5 | 10 | 0 | 20 | 0 | 40 | 1.00 | x | x | ○ | ○ | x |

TABLE 48-continued

| | Synthesis Composition (As, Sb, Bi, Pb: mass ppm, Ag, Cu: mass %) | | | | | | Formula (1) 2As + Sb + Bi + Pb | Formula (2) (2As + Sb)/ (Bi + Pb) | Evaluation Item | | | | |
|---|---|---|---|---|---|---|---|---|---|---|---|---|---|
| | Ag | Cu | As | Sb | Bi | Pb | | | Presence of As-Enriched Layer | Inhibition of Viscosity Increase | Reliability (ΔT) | Solder Wettability | Comprehensive Evaluation |
| Ex. V-E8 Comp. | 3 | 0.5 | 20 | 0 | 0 | 20 | 40 | 2.00 | x | x | ○ | ○ | x |
| Ex. V-E9 Comp. | 3 | 0.5 | 20 | 20 | 0 | 0 | 60 | — | x | x | ○ | ○ | x |
| Ex. V-E10 Comp. | 3 | 0.5 | 20 | 0 | 20 | 0 | 60 | 2.00 | x | x | ○ | ○ | x |
| Ex. V-E11 Comp. | 3 | 0.5 | 25 | 0 | 0 | 20 | 60 | 2.50 | x | x | ○ | ○ | x |
| Ex. V-E12 Comp. | 3 | 0.5 | 25 | 20 | 0 | 0 | 70 | — | x | x | ○ | ○ | x |
| Ex. V-E13 Comp. | 3 | 0.5 | 25 | 0 | 20 | 0 | 70 | 2.50 | x | x | ○ | ○ | x |
| Ex. V-E14 Comp. | 3 | 0.5 | 25 | 0 | 0 | 20 | 70 | 2.50 | x | x | ○ | ○ | x |
| Ex. V-E15 Comp. | 3 | 0.5 | 300 | 500 | 50 | 50 | 1200 | 11.00 | ○ | ○ | ○ | x | x |
| Ex. V-E16 Comp. | 3 | 0.5 | 350 | 1150 | 25 | 25 | 1900 | 37.00 | ○ | ○ | ○ | x | x |
| Ex. V-E17 Comp. | 3 | 0.5 | 800 | 800 | 100 | 100 | 2600 | 12.00 | ○ | ○ | ○ | x | x |
| Ex. V-E18 Comp. | 3 | 0.5 | 800 | 3500 | 100 | 100 | 5300 | 25.50 | ○ | ○ | ○ | x | x |
| Ex. V-E19 Comp. | 3 | 0.5 | 100 | 10000 | 1 | 0 | 10201 | 10200.00 | ○ | ○ | ○ | x | x |
| Ex. V-E20 Comp. | 3 | 0.5 | 100 | 100 | 50000 | 0 | 50300 | 0.01 | ○ | ○ | x | ○ | x |
| Ex. V-E21 Comp. | 3 | 0.5 | 100 | 100 | 0 | 50000 | 50300 | 0.01 | ○ | ○ | x | ○ | x |
| Ex. V-E22 Comp. | 3 | 0.5 | 300 | 3000 | 0 | 0 | 3600 | — | ○ | ○ | ○ | x | x |
| Ex. V-E23 Comp. | 3 | 0.5 | 250 | 5100 | 0 | 0 | 5600 | — | ○ | ○ | ○ | x | x |
| Ex. V-E24 Comp. | 3 | 0.5 | 100 | 0 | 100 | 25000 | 25300 | 0.01 | ○ | ○ | x | ○ | x |

Examples V-F1 to V-F18 and Comparative Examples V-F1 to V-F24

Sn, Ag, Cu, As, Sb, Bi and Pb were weighed to satisfy a content of Cu of 0.5% by mass, a content of Ag of 3.5% by mass, and the contents of As, Sb, Bi and Pb shown in Table VF below with a balance of Sn (balance for making the sum of Sn, Ag, Cu, As, Sb, Bi and Pb 100% by mass), and were melt mixed, and the resultant was centrifugally sprayed in an Ar atmosphere to prepare a powder (average particle size: 21 µm, classified as No. 4 of the particle size classification). The thus obtained powder was heated with a drying apparatus in the air at 60° C. for 30 minutes to obtain a solder powder of each of examples and comparative examples. In Comparative Examples V-F3 to V-F14, however, a heat treatment was not performed but a powder as is obtained by the centrifugal spraying was used as a solder powder.

A 3N material containing an incidental impurity was used as Sn.

Results of the evaluations of (1) the presence of an As-enriched layer, (2) the inhibition of viscosity increase, (3) the solder wettability, and (4) the reliability of the solder powders of the examples and comparative examples are shown in the following table.

TABLE 49

| | Synthesis Composition (As, Sb, Bi, Pb: mass ppm, Ag, Cu: mass %) | | | | | | (1) Formula Formula (1) 2As + Sb + Bi + Pb | (2) Formula Formula (2) (2As + Sb)/ (Bi + Pb) | Evaluation Item | | | | |
|---|---|---|---|---|---|---|---|---|---|---|---|---|---|
| | Ag | Cu | As | Sb | Bi | Pb | | | Presence of As-Enriched Layer | Inhibition of Viscosity Increase | Reliability (ΔT) | Solder Wettability | Comprehensive Evaluation |
| Ex. V-F1 | 3.5 | 0.5 | 100 | 25 | 25 | 25 | 275 | 4.50 | ○ | ○ | ○ | ○ | ○ |
| Ex. V-F2 | 3.5 | 0.5 | 100 | 50 | 25 | 0 | 275 | 10.00 | ○ | ○ | ○ | ○ | ○ |
| Ex. V-F3 | 3.5 | 0.5 | 100 | 0 | 75 | 0 | 275 | 2.67 | ○ | ○ | ○ | ○ | ○ |
| Ex. V-F4 | 3.5 | 0.5 | 100 | 0 | 0 | 75 | 275 | 2.67 | ○ | ○ | ○ | ○ | ○ |
| Ex. V-F5 | 3.5 | 0.5 | 100 | 50 | 50 | 50 | 350 | 2.50 | ○ | ○ | ○ | ○ | ○ |
| Ex. V-F6 | 3.5 | 0.5 | 50 | 100 | 100 | 50 | 350 | 1.33 | ○ | ○ | ○ | ○ | ○ |
| Ex. V-F7 | 3.5 | 0.5 | 250 | 0 | 300 | 300 | 1100 | 0.83 | ○ | ○ | ○ | ○ | ○ |
| Ex. V-F8 | 3.5 | 0.5 | 200 | 300 | 250 | 250 | 1200 | 1.40 | ○ | ○ | ○ | ○ | ○ |
| Ex. V-F9 | 3.5 | 0.5 | 100 | 500 | 250 | 250 | 1200 | 1.40 | ○ | ○ | ○ | ○ | ○ |
| Ex. V-F10 | 3.5 | 0.5 | 200 | 50 | 600 | 850 | 1900 | 0.31 | ○ | ○ | ○ | ○ | ○ |

TABLE 49-continued

|  | Synthesis Composition (As, Sb, Bi, Pb: mass ppm, Ag, Cu: mass %) | | | | | | (1) Formula Formula (1) 2As + Sb + Bi + Pb | (2) Formula Formula (2) (2As + Sb)/ (Bi + Pb) | Evaluation Item | | | | |
|---|---|---|---|---|---|---|---|---|---|---|---|---|---|
|  | Ag | Cu | As | Sb Increase | Bi (ΔT) | Pb | | | Presence of As-Enriched Layer | Inhibition of Viscosity Increase | Reli-ability | Solder Wettability | Compre-hensive Evaluation |
| Ex. V-F11 | 3.5 | 0.5 | 200 | 500 | 500 | 500 | 1900 | 0.90 | ○ | ○ | ○ | ○ | ○ |
| Ex. V-F12 | 3.5 | 0.5 | 200 | 500 | 1000 | 0 | 1900 | 0.90 | ○ | ○ | ○ | ○ | ○ |
| Ex. V-F13 | 3.5 | 0.5 | 200 | 500 | 0 | 1000 | 1900 | 0.90 | ○ | ○ | ○ | ○ | ○ |
| Ex. V-F14 | 3.5 | 0.5 | 40 | 500 | 350 | 1000 | 1930 | 0.43 | ○ | ○ | ○ | ○ | ○ |
| Ex. V-F15 | 3.5 | 0.5 | 100 | 3000 | 300 | 300 | 3800 | 5.33 | ○ | ○ | ○ | ○ | ○ |
| Ex. V-F16 | 3.5 | 0.5 | 100 | 0 | 0 | 5100 | 5300 | 0.04 | ○ | ○ | ○ | ○ | ○ |
| Ex. V-F17 | 3.5 | 0.5 | 100 | 0 | 10000 | 0 | 10200 | 0.02 | ○ | ○ | ○ | ○ | ○ |
| Ex. V-F18 | 3.5 | 0.5 | 100 | 0 | 10000 | 5000 | 15200 | 0.01 | ○ | ○ | ○ | ○ | ○ |
| Comp. Ex. V-F1 | 3.5 | 0.5 | 0 | 100 | 100 | 100 | 300 | 0.50 | x | x | ○ | ○ | x |
| Comp. Ex. V-F2 | 3.5 | 0.5 | 40 | 0 | 0 | 0 | 80 | — | ○ | x | ○ | ○ | x |
| Comp. Ex. V-F3 | 3.5 | 0.5 | 40 | 20 | 0 | 0 | 100 | — | x | x | ○ | ○ | x |
| Comp. Ex. V-F4 | 3.5 | 0.5 | 40 | 0 | 20 | 0 | 100 | — | x | x | ○ | ○ | x |
| Comp. Ex. V-F5 | 3.5 | 0.5 | 10 | 0 | 0 | 20 | 100 | — | x | x | ○ | ○ | x |
| Comp. Ex. V-F6 | 3.5 | 0.5 | 10 | 20 | 0 | 0 | 40 | — | x | x | ○ | ○ | x |
| Comp. Ex. V-F7 | 3.5 | 0.5 | 10 | 0 | 20 | 0 | 40 | 1.00 | x | x | ○ | ○ | x |
| Comp. Ex. V-F8 | 3.5 | 0.5 | 20 | 0 | 0 | 20 | 40 | 2.00 | x | x | ○ | ○ | x |
| Comp. Ex. V-F9 | 3.5 | 0.5 | 20 | 20 | 0 | 0 | 60 | — | x | x | ○ | ○ | x |
| Comp. Ex. V-F10 | 3.5 | 0.5 | 20 | 0 | 20 | 0 | 60 | 2.00 | x | x | ○ | ○ | x |
| Comp. Ex. V-F11 | 3.5 | 0.5 | 25 | 0 | 0 | 20 | 60 | 2.50 | x | x | ○ | ○ | x |
| Comp. Ex. V-F12 | 3.5 | 0.5 | 25 | 20 | 0 | 0 | 70 | — | x | x | ○ | ○ | x |
| Comp. Ex. V-F13 | 3.5 | 0.5 | 25 | 0 | 20 | 0 | 70 | 2.50 | x | x | ○ | ○ | x |
| Comp. Ex. V-F14 | 3.5 | 0.5 | 25 | 0 | 0 | 20 | 70 | 2.50 | x | x | ○ | ○ | x |
| Comp. Ex. V-F15 | 3.5 | 0.5 | 300 | 500 | 50 | 50 | 1200 | 11.00 | ○ | ○ | ○ | x | x |
| Comp. Ex. V-F16 | 3.5 | 0.5 | 350 | 1150 | 25 | 25 | 1900 | 37.00 | ○ | ○ | ○ | x | x |
| Comp. Ex. V-F17 | 3.5 | 0.5 | 800 | 800 | 100 | 100 | 2600 | 12.00 | ○ | ○ | ○ | x | x |
| Comp. Ex. V-F18 | 3.5 | 0.5 | 800 | 3500 | 100 | 100 | 5300 | 25.50 | ○ | ○ | ○ | x | x |
| Comp. Ex. V-F19 | 3.5 | 0.5 | 100 | 10000 | 1 | 0 | 10201 | 10200.00 | ○ | ○ | ○ | x | x |
| Comp. Ex. V-F20 | 3.5 | 0.5 | 100 | 100 | 50000 | 0 | 50300 | 0.01 | ○ | ○ | x | ○ | x |
| Comp. Ex. V-F21 | 3.5 | 0.5 | 100 | 100 | 0 | 50000 | 50300 | 0.01 | ○ | ○ | x | ○ | x |
| Comp. Ex. V-F22 | 3.5 | 0.5 | 300 | 3000 | 0 | 0 | 3600 | — | ○ | ○ | ○ | x | x |
| Comp. Ex. V-F23 | 3.5 | 0.5 | 250 | 5100 | 0 | 0 | 5600 | — | ○ | ○ | ○ | x | x |
| Comp. Ex. V-F24 | 3.5 | 0.5 | 100 | 0 | 100 | 25000 | 25300 | 0.01 | ○ | ○ | x | ○ | x |

INDUSTRIAL APPLICABILITY

A solder material of the present invention is free from color change and is excellent in solder wettability and reliability in cycle characteristics and the like, and hence it can be used in various applications. In particular, since viscosity increase with time when in the form of a solder paste is small, the solder material can be suitably used as a solder material for a solder paste.

The invention claimed is:

1. A solder powder or solder ball comprising Sn or a Sn-containing alloy and 40 to 320 ppm by mass of As, the solder powder or solder ball including an As-enriched layer that is present at least in part on a surface side of the solder powder or solder ball.

2. The solder powder or solder ball according to claim 1, further comprising 20 ppm by mass to 3% by mass of Bi.

3. The solder powder or solder ball according to claim 1, further comprising 20 ppm by mass to 0.5% by mass of Sb.

4. The solder powder or solder ball according to claim 1, further comprising 20 ppm by mass to 0.7% by mass of Pb.

5. The solder powder or solder ball according to claim 1, further comprising 0 to 3000 ppm by mass of Sb, 0 to 10000 ppm by mass of Bi, and 0 to 5100 ppm by mass of Pb, wherein contents of Bi and Pb are not simultaneously 0 ppm by mass.

6. The solder powder or solder ball according to claim 5, wherein contents of As, Sb, Bi and Pb satisfy the following formulas (1) and (2):

$$275 \leq 2As+Sb+Bi+Pb \tag{1}$$

$$0.01 \leq (2As+Sb)/(Bi+Pb) \leq 10.00 \tag{2}$$

wherein As, Sb, Bi and Pb in the formulas (1) and (2) respectively represent contents (in ppm by mass) of As, Sb, Bi and Pb in the solder powder or solder ball.

7. The solder powder or solder ball according to claim 1, wherein the Sn-containing alloy contains 0.005 to 40% by mass of Ag and/or 0.001 to 10% by mass of Cu.

8. The solder powder or solder ball according to claim 1, wherein the Sn-containing alloy contains 0 to 4% by mass of Ag, 0 to 1% by mass of Cu, 0 to 52% by mass of In, 0 to 0.15% by mass of Ni, 0 to 0.015% by mass of Co, and a balance of Sn.

9. The solder powder or solder ball according to claim 1, wherein the solder powder or solder ball is in the form of a powder.

10. A solder paste comprising the solder powder according to claim 9 and a flux.

11. The solder paste according to claim 10, further comprising a zirconium oxide powder.

12. The solder paste according to claim 11, wherein a content of the zirconium oxide powder is 0.05 to 20.0% by mass with respect to a total mass of the solder paste.

13. The solder powder or solder ball according to claim 1, formed into a solder joint.

14. The solder powder or solder ball according to claim 7, wherein the solder powder or solder ball is in the form of a powder.

15. A solder paste comprising the solder powder according to claim 14 and a flux.

16. The solder powder or solder ball according to claim 8, wherein the solder powder or solder ball is in the form of a powder.

17. A solder paste comprising the solder powder according to claim 16 and a flux.

18. The solder powder or solder ball according to claim 7, formed into a solder joint.

19. The solder powder or solder ball according to claim 8, formed into a solder joint.

* * * * *